US009159655B2

(12) United States Patent
Oda et al.

(10) Patent No.: US 9,159,655 B2
(45) Date of Patent: Oct. 13, 2015

(54) LEAD FRAME FOR MOUNTING LED ELEMENTS, LEAD FRAME WITH RESIN, METHOD FOR MANUFACTURING SEMICONDUCTOR DEVICES, AND LEAD FRAME FOR MOUNTING SEMICONDUCTOR ELEMENTS

(71) Applicant: DAI NIPPON PRINTING CO., LTD., Tokyo-to (JP)

(72) Inventors: Kazunori Oda, Kawaguchi (JP); Masaki Yazaki, Fujimino (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/452,971

(22) Filed: Aug. 6, 2014

(65) Prior Publication Data
US 2014/0349424 A1 Nov. 27, 2014

Related U.S. Application Data

(62) Division of application No. 13/879,237, filed as application No. PCT/JP2011/075091 on Oct. 31, 2011, now Pat. No. 8,933,548.

(30) Foreign Application Priority Data

Nov. 2, 2010 (JP) .................................. 2010-246681
Nov. 9, 2010 (JP) .................................. 2010-250959

(51) Int. Cl.
*H01L 23/495* (2006.01)
*H01L 33/62* (2010.01)
(Continued)

(52) U.S. Cl.
CPC .......... *H01L 23/49517* (2013.01); *F21V 21/00* (2013.01); *H01L 23/4824* (2013.01);
(Continued)

(58) Field of Classification Search
CPC ....... H01L 33/62; H01L 23/495; H01L 24/97; H01L 23/49575
USPC .............................................. 257/676, 669, 99
See application file for complete search history.

(56) References Cited

U.S. PATENT DOCUMENTS 7,999,277 B2  8/2011  Fushimi et al.
8,088,635 B2  1/2012  Fushimi et al.
(Continued)

FOREIGN PATENT DOCUMENTS

JP   A-07-050312    2/1995
JP   A-2001-326316  11/2001
(Continued)

OTHER PUBLICATIONS

Nov. 12, 2013 Office Action issued in Japanese Patent Application No. 2013-031260 (with English translation).
(Continued)

*Primary Examiner* — Tu-Tu Ho
(74) *Attorney, Agent, or Firm* — Oliff PLC

(57) ABSTRACT

A lead frame for mounting LED elements includes a frame body region and a large number of package regions arranged in multiple rows and columns in the frame body region. The package regions each include a die pad on which an LED element is to be mounted and a lead section adjacent to the die pad, the package regions being further constructed to be interconnected via a dicing region. The die pad in one package region and the lead section in another package region upward or downward adjacent to the package region of interest are connected to each other by an inclined reinforcement piece positioned in the dicing region.

23 Claims, 35 Drawing Sheets

(51) Int. Cl.
*F21V 21/00* (2006.01)
*H01L 33/52* (2010.01)
*H01L 33/60* (2010.01)
*H01L 23/482* (2006.01)
*H01L 23/31* (2006.01)
*H01L 23/498* (2006.01)
*H01L 23/00* (2006.01)
*H01L 33/48* (2010.01)

(52) U.S. Cl.
CPC ........ *H01L23/495* (2013.01); *H01L 23/49503* (2013.01); *H01L 23/562* (2013.01); *H01L 24/97* (2013.01); *H01L 33/52* (2013.01); *H01L 33/60* (2013.01); *H01L 33/62* (2013.01); *H01L 23/3142* (2013.01); *H01L 23/49548* (2013.01); *H01L 23/49582* (2013.01); *H01L 23/49861* (2013.01); *H01L 24/16* (2013.01); *H01L 24/45* (2013.01); *H01L 24/48* (2013.01); *H01L 33/486* (2013.01); *H01L 2224/16245* (2013.01); *H01L 2224/45144* (2013.01); *H01L 2224/48091* (2013.01); *H01L 2224/48247* (2013.01); *H01L 2224/85439* (2013.01); *H01L 2224/97* (2013.01); *H01L 2924/0104* (2013.01); *H01L 2924/014* (2013.01); *H01L 2924/01005* (2013.01); *H01L 2924/01006* (2013.01); *H01L 2924/01013* (2013.01); *H01L 2924/01019* (2013.01); *H01L 2924/01029* (2013.01); *H01L 2924/01033* (2013.01); *H01L 2924/01047* (2013.01); *H01L 2924/01079* (2013.01); *H01L 2924/01082* (2013.01); *H01L 2924/01322* (2013.01); *H01L 2924/10329* (2013.01); *H01L 2924/12041* (2013.01); *H01L 2933/0033* (2013.01)

(56) References Cited

U.S. PATENT DOCUMENTS

| | | |
|---|---|---|
| 2006/0267042 A1 | 11/2006 | Izuno et al. |
| 2007/0241362 A1 | 10/2007 | Han et al. |
| 2008/0157309 A1* | 7/2008 | Hojo ............................ 257/676 |
| 2010/0193821 A1 | 8/2010 | Fukasawa et al. |
| 2011/0133232 A1 | 6/2011 | Yoshioka et al. |

FOREIGN PATENT DOCUMENTS

| | | |
|---|---|---|
| JP | A-2002-094125 | 3/2002 |
| JP | A-2003-037236 | 2/2003 |
| JP | A-2005-183695 | 7/2005 |
| JP | A-2005-353700 | 12/2005 |
| JP | A-2007-134376 | 5/2007 |
| JP | A-2008-235469 | 10/2008 |
| JP | A-2010-062272 | 3/2010 |
| JP | A-2010-171218 | 8/2010 |
| JP | A-2010-177501 | 8/2010 |
| JP | A-2010-199166 | 9/2010 |
| WO | WO 2008/047933 A1 | 4/2008 |
| WO | WO 2008/139981 A1 | 11/2008 |
| WO | WO 2010/053133 A1 | 5/2010 |

OTHER PUBLICATIONS

Aug. 13, 2013 Office Action issued in Japanese Patent Application No. 2013-031260 (with English translation).
Aug. 3, 2012 Office Action issued in Japanese Patent Application No. 2012-129229 (with English translation).
May 14, 2013 International Preliminary Report on Patentability issued in International Patent Application No. PCT/JP2011/075091.
Nov. 29, 2011 International Search Report issued in International Patent Application No. PCT/JP2011/075091 (with translation).
Apr. 1, 2014 Election of Species Requirement issued in U.S. Appl. No. 13/879,237.
Jun. 30, 2014 First Action Interview Pilot Program Pre-Interview Communication issued in U.S. Appl. No. 13/879,237.
May 21, 2015 Office Action issued in U.S. Appl. No. 14/560,556.

* cited by examiner

LEAD FRAME FOR MOUNTING LED ELEMENTS, LEAD FRAME WITH RESIN, METHOD FOR MANUFACTURING SEMICONDUCTOR DEVICES, AND LEAD FRAME FOR MOUNTING SEMICONDUCTOR ELEMENTS

This is a Division of application Ser. No. 13/879,237 filed Apr. 26, 2013, which is a PCT National Phase Application of PCT/JP2011/075091 which claims the benefit of Japanese application JP 2010-246681, filed Nov. 2, 2010, and Japanese application JP 2010-250959, filed Nov. 9, 2010, the content of each of which is hereby incorporated by reference into this application.

TECHNICAL FIELD

The present invention relates to a lead frame for mounting LED elements, a lead frame with a resin, a method for manufacturing semiconductor devices, and a lead frame for mounting semiconductor elements.

BACKGROUND ART

The product described in JP-A-2001-326316, for example, exists as a conventional lead frame for resin-sealed semiconductor devices. In conventional lead frames such as this one, a large number of terminals are arranged around each of die pads, with tie bars being arranged in grid form on a plane in order to interconnect the large number of terminals to hanging leads.

Meanwhile, illumination devices that each use light-emitting diode (LED) elements as a light source are used in recent years in general illumination, vehicle-mounted illumination, and displays, as well as in state indicators of various electrical household appliances, office automation machines and apparatuses, and vehicular devices. Some of these types of illumination devices include a semiconductor device fabricated by mounting LED elements in a lead frame.

PRIOR ART LITERATURE

Patent Documents

Patent Document 1: JP-A-2001-326316

Some of the semiconductor devices for LED elements or of the semiconductor devices for discrete semiconductor elements have die pads, which are arranged linearly in one row along with leads arranged around each of the die pads. Lead frames for these semiconductor devices, unlike the foregoing conventional lead frame, can be manufactured more efficiently by interconnecting mutually adjacent die pads and leads without providing tie bars in grid form on a plane, since the number of elements to be surface-mounted in one lead frame can be correspondingly increased.

In this case, the die pads and the leads need to be spaced apart from one another to prevent short-circuiting. A problem could therefore occur that if spatial gaps between the die pads and the leads become connected, this causes a plurality of elongated spaces parallel to one side of the lead frame. The occurrence of this problem might lead to the lead frame being formed into a slit blind/screen or interdigitated shape and becoming deformed during handling.

The present invention has been made with these circumstances taken into account, and an object of the invention is to provide a lead frame for mounting LED elements, a lead frame with a resin, a method for manufacturing a semiconductor device, and a lead frame for mounting semiconductor elements. Each of the lead frames and the manufacturing method are designed so as to prevent a spatial gap between a die pad and a lead from becoming connected, thus an elongated space from being formed in the lead frame, and hence the lead frame from being formed into a slit blind/screen or interdigitated shape and from becoming deformed during handling.

DISCLOSURE OF THE INVENTION

A lead frame for mounting LED elements, according to the present invention, includes: a frame body region; and a large number of package regions arranged in multiple rows and columns in the frame body region, the package regions each including a die pad on which an LED element is to be mounted and a lead section adjacent to the die pad, the package regions being further constructed to be interconnected via a dicing region. The die pad in one package region and the lead section in another package region adjacent to the package region of interest are connected to each other by an inclined reinforcement piece positioned in the dicing region.

In the lead frame according to the present invention, the lead section in one package region is connected to the lead section in another package region adjacent to the package region of interest, by a lead connecting portion.

In the lead frame according to the present invention, the die pad in one package region is connected to the die pad in another package region adjacent to the package region of interest, by a die pad connecting portion.

In the lead frame according to the present invention, the die pad in one package region and the lead section in a first package region adjacent to the package region of interest are connected to each other by a first inclined reinforcement piece positioned in the dicing region, and the die pad in one package region and the lead section in a second package region adjacent to the package region of interest, the second package region being positioned at a side opposite to the first package region with regard to the package region of interest, are connected to each other by a second inclined reinforcement piece positioned in the dicing region.

In the lead frame according to the present invention, the die pad in one package region and the lead section in another package region adjacent to the package region of interest are connected to each other by a first inclined reinforcement piece positioned in the dicing region. The lead section in one package region and the die pad in another package region adjacent to the package region of interest are connected to each other by a second inclined reinforcement piece positioned in the dicing region.

In the lead frame according to the present invention, the die pad in one package region is connected to the lead sections in diagonally upward and diagonally downward package regions adjacent to the die pad in the package region of interest, by one pair of additional inclined reinforcement pieces positioned in the dicing region.

In the lead frame according to the present invention, the lead section in one package region is connected to the lead sections in diagonally upward and diagonally downward package regions adjacent to the lead section in the package region of interest, by one pair of additional inclined reinforcement pieces positioned in the dicing region.

A lead frame for mounting LED elements, according to the present invention, includes: a frame body region; and a large number of package regions arranged in multiple rows and columns in the frame body region, the package regions each including a die pad on which an LED element is to be mounted and a lead section adjacent to the die pad, the package regions being further constructed to be interconnected via a dicing region. The lead section in at least one package region is connected to the lead section in another package region adjacent to the package region of interest, by a lead connecting portion. The lead section in one package region and the die pad in another package region adjacent to the package region of interest are connected to each other by an inclined reinforcement piece positioned in the dicing region.

In the lead frame according to the present invention, the inclined reinforcement piece includes a main body and a plated layer formed on the main body.

A resin-containing lead frame according to the present invention includes a lead frame and a reflecting resin disposed on edges of package regions in the lead frame.

A method for manufacturing a semiconductor device according to the present invention includes the steps of: providing a resin-containing lead frame; mounting an independent LED element on each of die pads, inside a reflecting resin of the resin-containing lead frame; interconnecting the LED element and a lead section via an electric conducting portion; filling the reflecting resin of the resin-containing lead frame with a sealing resin; and separating the reflecting resin and the lead frame, for each LED element, by cutting the reflecting resin and the lead frame.

A lead frame for mounting semiconductor elements, according to the present invention, includes: a frame body region; and a large number of package regions arranged in multiple rows and columns in the frame body region, the package regions each including a die pad on which a semiconductor element is to be mounted and a lead section adjacent to the die pad, the package regions being constructed to be interconnected via a dicing region. The die pad in one package region and the lead section in another package region adjacent to the package region of interest are connected to each other by an inclined reinforcement piece positioned in the dicing region.

In the lead frame according to the present invention, the lead section in one package region is connected to the lead section in another package region adjacent to the package region of interest, by a lead connecting portion.

In the lead frame according to the present invention, the die pad in one package region is connected to the die pad in another package region adjacent to the package region of interest, by a die pad connecting portion.

In the lead frame according to the present invention, the die pad in one package region and the lead section in a first package region adjacent to the package region of interest are connected to each other by a first inclined reinforcement piece positioned in the dicing region. The die pad in one package region and the lead section in a second package region adjacent to the package region of interest, the second package region being positioned at a side opposite to the first package region with regard to the package region of interest, are connected to each other by a second inclined reinforcement piece positioned in the dicing region.

In the lead frame according to the present invention, the die pad in one package region and the lead section in another package region adjacent to the package region of interest are connected to each other by a first inclined reinforcement piece positioned in the dicing region, and the lead section in one package region and the die pad in another package region adjacent to the package region of interest are connected to each other by a second inclined reinforcement piece positioned in the dicing region.

In the lead frame according to the present invention, the die pad in one package region is connected to the lead sections in diagonally upward and diagonally downward package regions adjacent to the die pad in the package region of interest, by one pair of additional inclined reinforcement pieces positioned in the dicing region.

In the lead frame according to the present invention, the lead section in one package region is connected to the lead sections in diagonally upward and diagonally downward package regions adjacent to the lead section in the package region of interest, by one pair of additional inclined reinforcement pieces positioned in the dicing region.

A lead frame for mounting semiconductor elements, according to the present invention, includes: a frame body region; and a large number of package regions arranged in multiple rows and columns in the frame body region, the package regions each including a die pad on which a semiconductor element is to be mounted and a lead section adjacent to the die pad, the package regions being further constructed to be interconnected via a dicing region. The lead section in at least one package region is connected to the lead section in another package region adjacent to the package region of interest, by a lead connecting portion. The lead section in one package region and the die pad in another package region adjacent to the package region of interest are connected to each other by an inclined reinforcement piece positioned in the dicing region.

In accordance with the present invention, since the die pad in one package region and the lead section in another package region adjacent to the package region of interest are connected to each other by an inclined reinforcement piece positioned in the dicing region, this structural characteristic prevents spatial gaps between the die pads and the lead sections from becoming connected, thus a plurality of elongated spaces parallel to one side of the lead frame from being formed, and hence, deformation of the lead frame during handling is prevented.

A lead frame for mounting LED elements, according to the present invention, includes: a frame body region; and a large number of package regions arranged in multiple rows and columns in the frame body region, the package regions each including a die pad on which an LED element is to be mounted and a lead section adjacent to the die pad, the package regions being further constructed to be interconnected via a dicing region. The die pad and lead section in one package region are connected to the die pad and lead section in another package region adjacent to the package region of interest, by a die pad connecting portion and a lead connecting portion, respectively. The die pad connecting portion and the lead connecting portion are connected to each other by a reinforcement piece positioned in the dicing region.

In the lead frame according to the present invention, the reinforcement piece extends over entire inside length of the frame body region and connects a plurality of die pad connecting portions and lead connecting portions.

In the lead frame according to the present invention, the die pad connecting portion and lead connecting portion connecting the die pads and lead sections, respectively, in both of one package region and a first package region adjacent thereto, are connected to each other by a reinforcement piece positioned in the dicing region. The die pad connecting portion and lead connecting portion connecting the die pads and lead sections, respectively, in both of the package region of interest and a second package region adjacent thereto, the second package region being positioned at a side opposite to the first package region with regard to the package region of interest and being adjacent to the package region of interest, are not connected to each other by a reinforcement piece.

In the lead frame according to the present invention, the reinforcement piece extends only between the die pad connecting portion and lead connecting portion connected to the die pad and lead section, respectively, in one package region, and connects the die pad connecting portion and the lead connecting portion.

In the lead frame according to the present invention, each package region includes one die pad and first and second lead sections, the first and second lead sections being positioned across the die pad. The die pad, first lead section, and second lead section existing in one package region are connected to the die pad, first lead section, and second lead section existing in another package region adjacent to the package region of interest, by a die pad connecting portion, a first-lead connecting portion, and a second-lead connecting portion, respectively. Between the package region of interest and a first package region adjacent thereto, the reinforcement piece extends only between the die pad connecting portion and the first-lead connecting portion, and connects the die pad connecting portion and the first-lead connecting portion. Between the package region of interest and a second package region adjacent thereto, the second package region being positioned at a side opposite to the first package region with regard to the package region of interest and being adjacent to the package region of interest, the reinforcement piece extends only between the die pad connecting portion and the second-lead connecting portion, and connects the die pad connecting portion and the second-lead connecting portion.

A lead frame for mounting LED elements, according to the present invention, includes: a frame body region; and a large number of package regions arranged in multiple rows and columns in the frame body region, the package regions each including a die pad on which an LED element is to be mounted and a lead section adjacent to the die pad, the package regions being further constructed to be interconnected via a dicing region. The die pad and lead section in one package region are connected to the die pad and lead section in another package region longitudinally adjacent to the package region of interest, by a die pad connecting portion and a lead connecting portion, respectively. The die pad connecting portions and lead connecting portions positioned in part of a plurality of dicing regions extending in a lateral direction are connected to each other by reinforcement pieces positioned in the part of the dicing regions.

In the lead frame according to the present invention, of all the dicing regions extending in the lateral direction, only those each provided with a reinforcement piece are cyclically formed at a predetermined number of alternate positions.

In the lead frame according to the present invention, of all the dicing regions extending in the lateral direction, only those each provided with a reinforcement piece are formed irregularly.

In the lead frame according to the present invention, the reinforcement piece includes a main body and a plated layer formed on the main body.

A resin-containing lead frame according to the present invention includes a lead frame and a reflecting resin disposed on edges of package regions in the lead frame.

A method for manufacturing a semiconductor device according to the present invention includes the steps of: providing a resin-containing lead frame; mounting an independent LED element on each of die pads, inside a reflecting resin of the resin-containing lead frame; interconnecting the LED element and a lead section via an electric conducting portion; filling the reflecting resin of the resin-containing lead frame with a sealing resin; and separating the reflecting resin and the lead frame, for each LED element, by cutting the reflecting resin and the lead frame.

A lead frame for mounting semiconductor elements, according to the present invention, includes: a frame body region; and a large number of package regions arranged in multiple rows and columns in the frame body region, the package regions each including a die pad on which a semiconductor element is to be mounted and a lead section adjacent to the die pad, the package regions being further constructed to be interconnected via a dicing region. The die pad and lead section in one package region are connected to the die pad and lead section in another package region adjacent to the package region of interest, by a die pad connecting portion and a lead connecting portion, respectively, and the die pad connecting portion and the lead connecting portion are connected to each other by a reinforcement piece positioned in the dicing region.

In the lead frame according to the present invention, the reinforcement piece extends over entire inside length of the frame body region and connects a plurality of die pad connecting portions and lead connecting portions.

In the lead frame according to the present invention, the die pad connecting portion and lead connecting portion connecting the die pads and lead sections, respectively, in both of one package region and a first package region adjacent thereto, are connected to each other by a reinforcement piece positioned in the dicing region. The die pad connecting portion and lead connecting portion connecting the die pads and lead sections, respectively, in both of the package region of interest and a second package region adjacent thereto, the second package region being positioned at a side opposite to the first package region with regard to the package region of interest and being adjacent to the package region of interest, are not connected to each other by a reinforcement piece.

In the lead frame according to the present invention, the reinforcement piece extends only between the die pad connecting portion and lead connecting portion connected to the die pad and lead section, respectively, in one package region, and connects the die pad connecting portion and the lead connecting portion.

In the lead frame according to the present invention, each package region includes one die pad and first and second lead sections, the first and second lead sections being positioned across the die pad. The die pad, first lead section, and second lead section existing in one package region are connected to the die pad, first lead section, and second lead section existing in another package region adjacent to the package region of interest, by a die pad connecting portion, a first-lead connecting portion, and a second-lead connecting portion, respectively. Between the package region of interest and a first package region adjacent thereto, the reinforcement piece extends only between the die pad connecting portion and the first-lead connecting portion, and connects the die pad connecting portion and the first-lead connecting portion. Between the package region of interest and a second package region adjacent thereto, the second package region being positioned at a side opposite to the first package region with regard to the package region of interest and being adjacent to the package region of interest, the reinforcement piece extends only between the die pad connecting portion and the second-lead connecting portion, and connects the die pad connecting portion and the second-lead connecting portion.

A lead frame for mounting semiconductor elements, according to the present invention, includes: a frame body region; and a large number of package regions arranged in multiple rows and columns in the frame body region, the package regions each including a die pad on which a semiconductor element is to be mounted and a lead section adjacent to the die pad, the package regions being further constructed to be interconnected via a dicing region. The die pad and lead section in one package region are connected to the die pad and lead section in another package region longitudinally adjacent to the package region of interest, by a die pad connecting portion and a lead connecting portion, respectively. The die pad connecting portions and lead connecting portions positioned in part of a plurality of dicing regions extending in a lateral direction are connected to each other by reinforcement pieces positioned in the part of the dicing regions.

In the lead frame according to the present invention, of all the dicing regions extending in the lateral direction, only those each provided with a reinforcement piece are cyclically formed at a predetermined number of alternate positions.

In the lead frame according to the present invention, of all the dicing regions extending in the lateral direction, only those each provided with a reinforcement piece are formed irregularly.

In accordance with the present invention, since the die pad connecting portion and the lead connecting portion are connected to each other by an reinforcement piece positioned in the dicing region, this structural feature prevents spatial gaps between die pads and lead sections from becoming connected, thus a plurality of elongated spaces parallel to one side of the lead frame from being formed, and hence, deformation of the lead frame during handling.

MODES FOR CARRYING OUT THE INVENTION

First Embodiment

Hereunder, a first embodiment of the present invention will be described referring to the accompanying drawings. FIGS. 1 to 6 show the first embodiment of the present invention.

Figure 1:
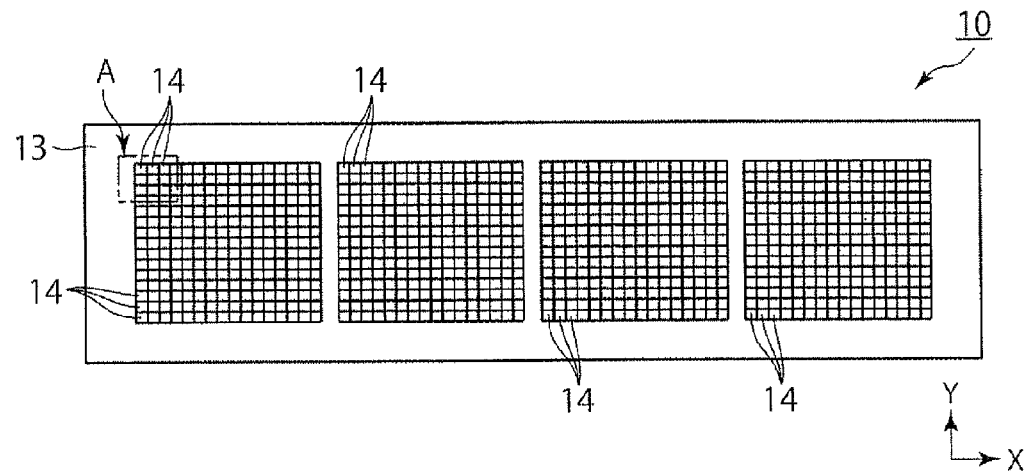
FIG. 1 is an overall plan view of a lead frame according to a first embodiment of the present invention.

The first embodiment of the present invention is described below referring to FIGS. 1 to 20.
Leaf Frame Configuration First, a lead frame for mounting LED elements, according to the present embodiment, is outlined below per FIGS. 1 to 3. FIG. 1 is an overall plan view of the lead frame according to the present embodiment, FIG. 2 is an enlarged view of section A shown in FIG. 1, and FIG. 3 is a sectional view taken along line B-B in FIG. 2.

Figure 4:
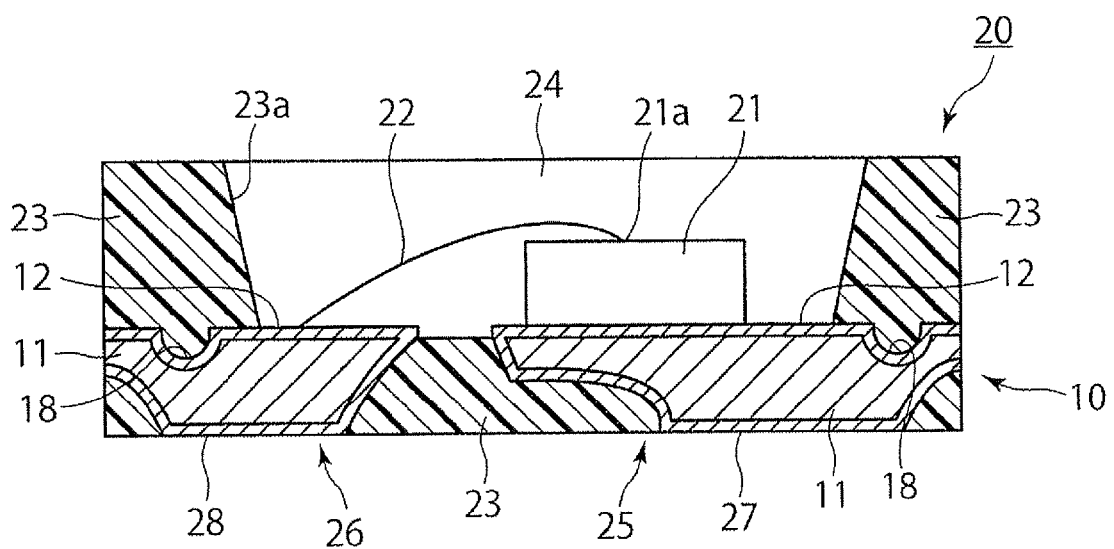
FIG. 4 is a sectional view showing a semiconductor device fabricated using the lead frame according to the first embodiment of the present invention, the sectional view being taken along line C-C in FIG. 5.
Figure 5:
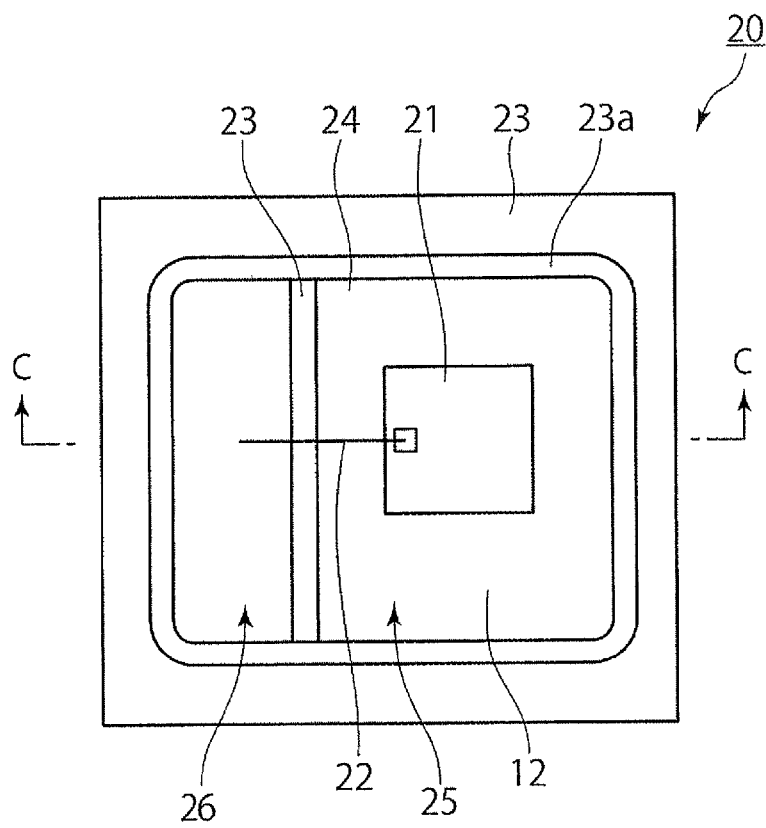
FIG. 5 is a plan view showing the semiconductor device fabricated using the lead frame according to the first embodiment of the present invention.
Figure 6:
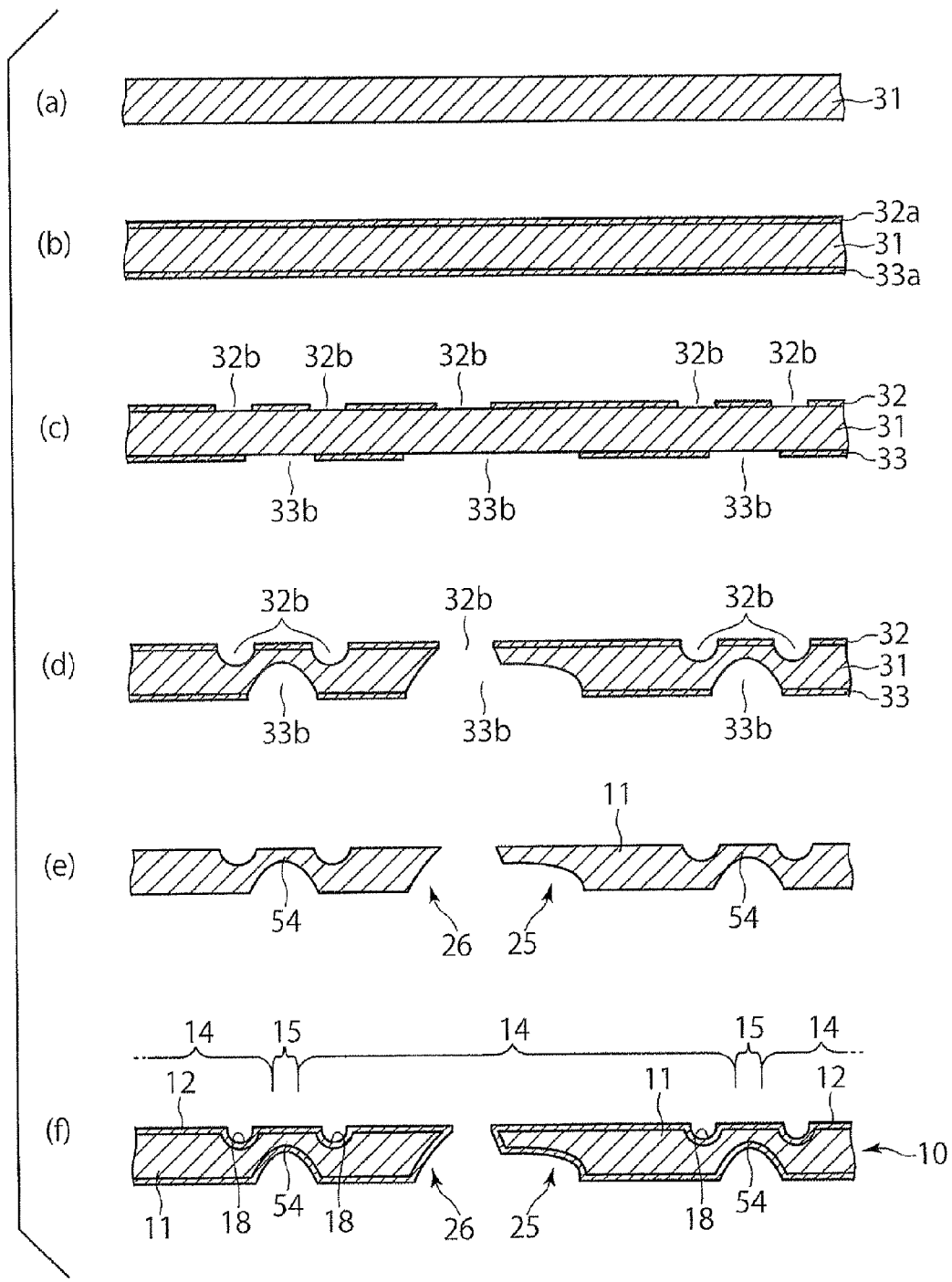
FIG. 6 is a diagram showing a method of manufacturing the lead frame according to the first embodiment of the present invention.
Figure 7:
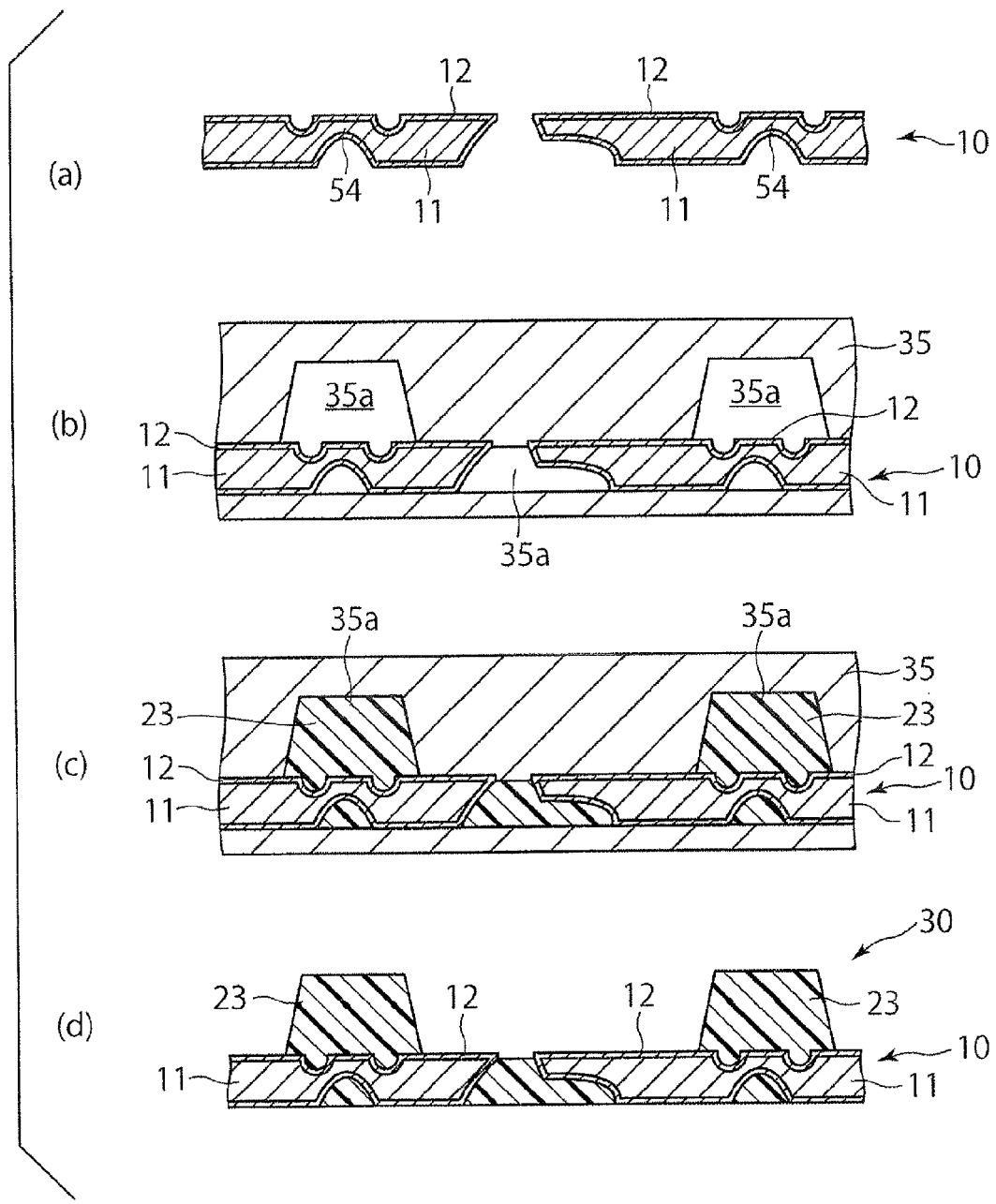
FIG. 7 is a diagram that shows steps for manufacturing the semiconductor device using the lead frame according to the first embodiment of the present invention.
Figure 8:
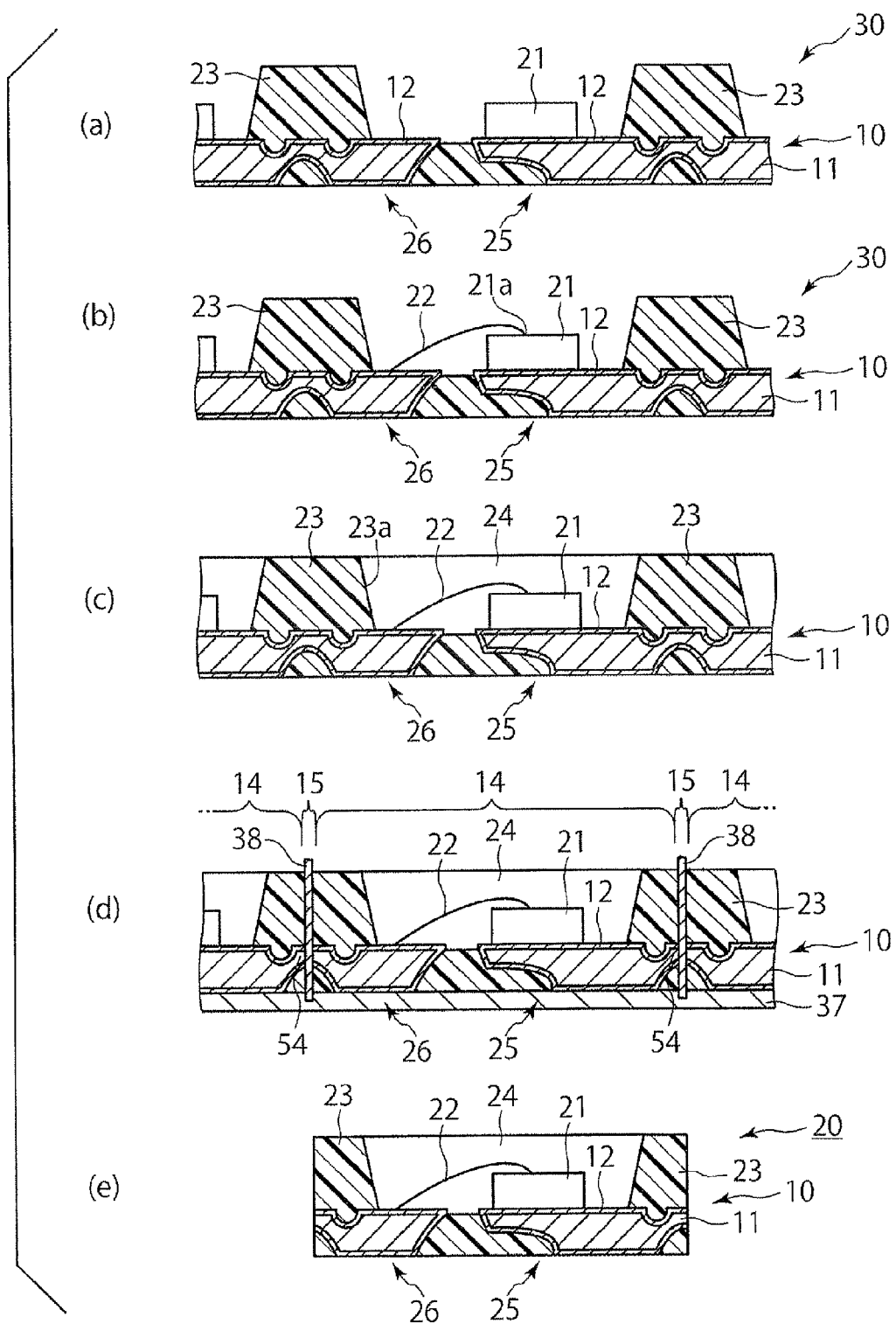
FIG. 8 is a diagram that showing further steps for manufacturing the semiconductor device using the lead frame according to the first embodiment of the present invention.
Figure 9:
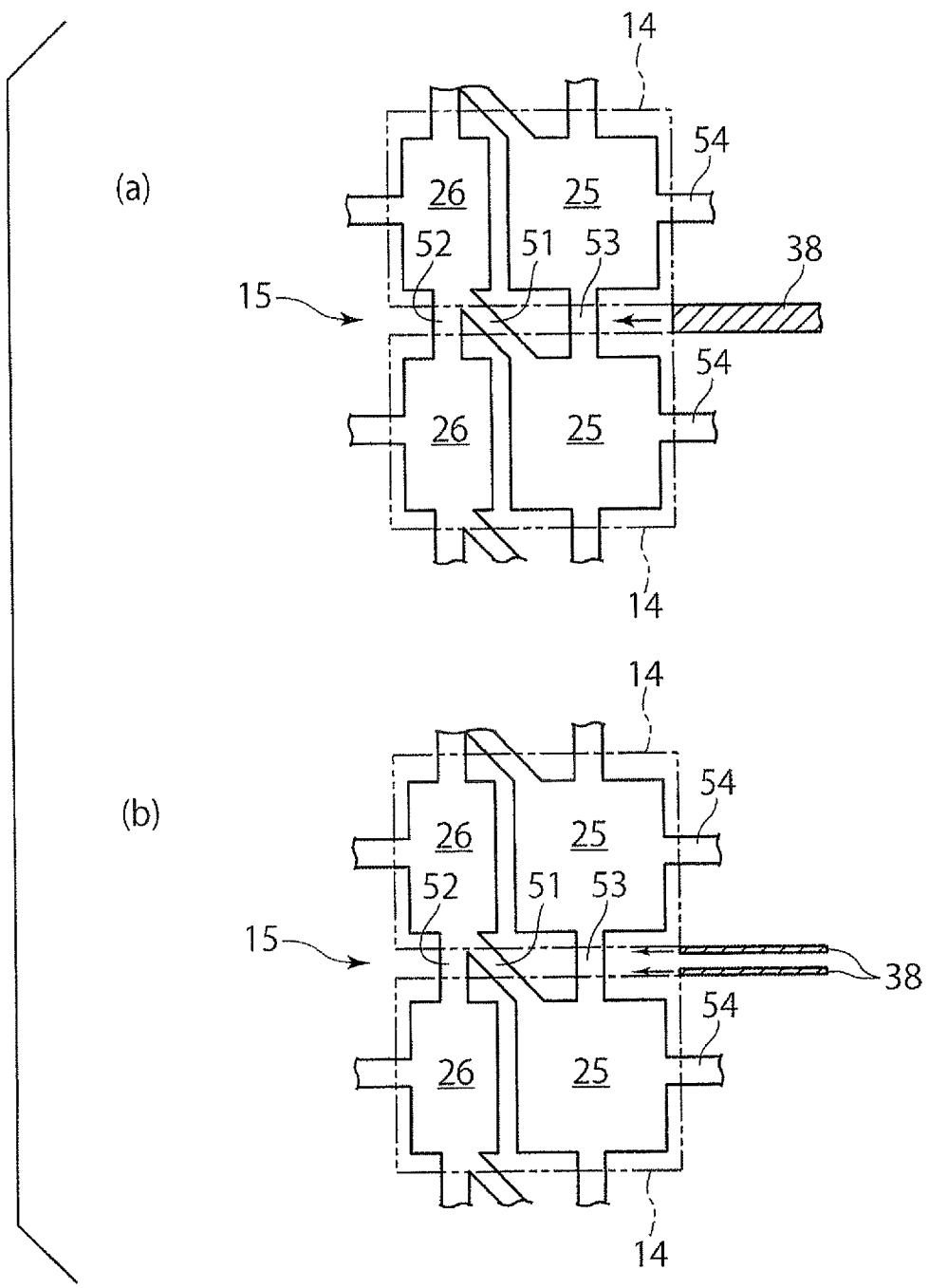
FIG. 9 is a diagram that shows dicing, one of the steps for manufacturing the semiconductor device.

The lead frame 10 shown in FIG. 1 is used to fabricate semiconductor devices 20 each having an LED element 21 mounted thereupon, one of the semiconductor devices 20 being shown in FIGS. 4 and 5. The lead frame 10 includes a frame body region 13 having an outline of a rectangular shape, and a large number of package regions 14 arranged in multiple rows and columns (i.e., in matrix form) inside the frame body region 13.

Figure 2:
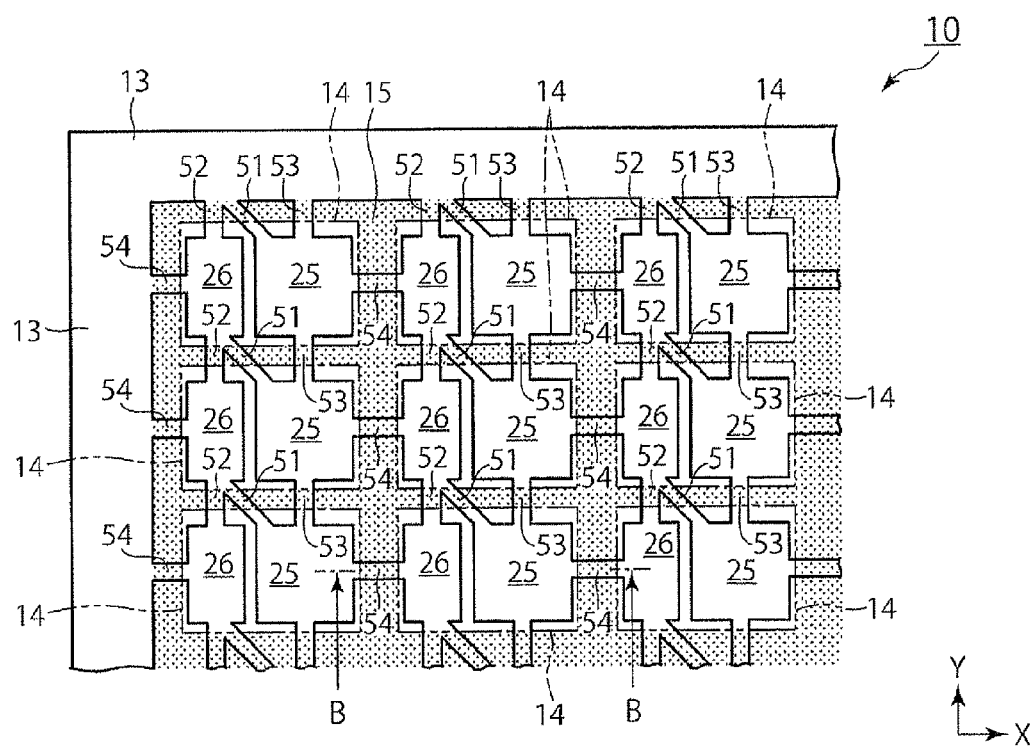
FIG. 2 is a partly enlarged plan view of the lead frame according to the first embodiment of the present invention, the plan view showing section A of FIG. 1.
Figure 3:
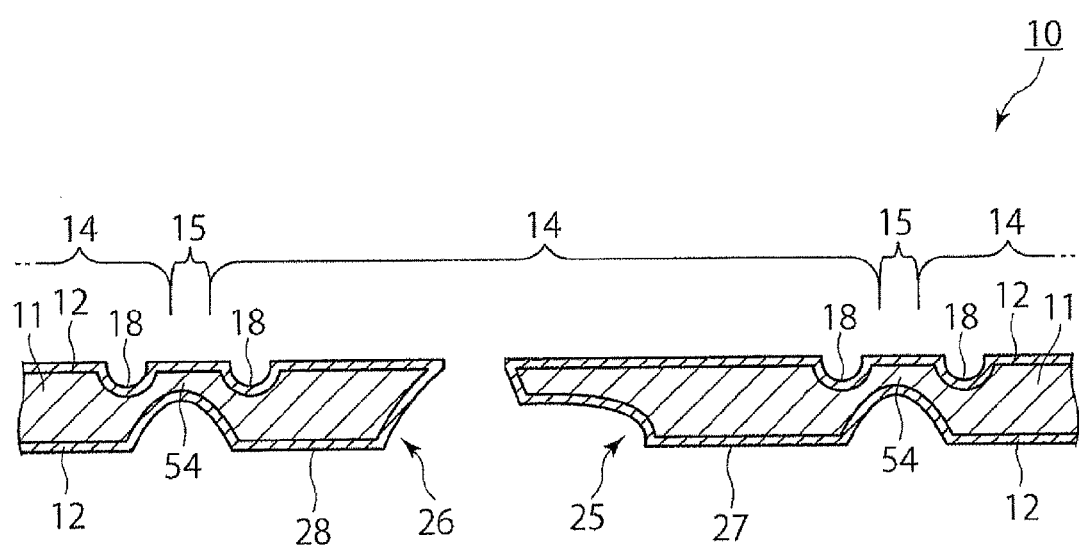
FIG. 3 is a sectional view of the lead frame according to the first embodiment of the present invention, the sectional view being taken along line B-B in FIG. 2.

As shown in FIG. 2, the package regions 14 each include a die pad 25 on which an LED element 21 is to be mounted, and a lead section 26 adjacent to the die pad 25. The package regions 14 are also connected to one another via dicing regions 15.

A spatial gap is formed between the die pad 25 and lead section 26 in one package region 14, and the lead frame 10 is constructed so that the die pad 25 and the lead section 26 are electrically insulated from one another after dicing of the lead frame. Each package region 14 is provided for an independent semiconductor device 20. Each package region 14 is shown with a double-dotted line in FIG. 2.

On the other hand, the dicing regions 15 each extend in both longitudinal and lateral directions between the package regions 14. As will be detailed later herein, each dicing region 15 serves as a region through which blades 38 pass during the manufacture of semiconductor devices 20 when the lead frame 10 is separated for each package region 14. Each dicing region 15 is shown in hatched or shaded form in FIG. 2.

In this specification, as shown in FIG. 2, the lateral direction in which the lead sections 26 and die pads 25 in each package region 14 are arranged side by side corresponds to a direction of X, and the longitudinal direction in which the lead sections 26 and die pads 25 are arranged in tandem corresponds to a direction of Y. In addition, a plus side of the Y-direction and a minus side of the Y-direction are hereinafter referred to as upward and downward, and a plus side of the X-direction and a minus side of the X-direction, as rightward and leftward.

As shown in FIG. 2, the die pad 25 in one package region 14 and the lead section 26 in another package region 14 upward adjacent to that package region 14 are connected to each other by an inclined reinforcement piece 51. The lead section 26 in one package region 14 and the die pad 25 in another package region 14 downward adjacent to that package region 14 are connected to each other by another inclined reinforcement piece 51. Each inclined reinforcement piece 51 is positioned in one dicing region 15, the reinforcement piece 51 being disposed so as to be oblique with respect to both of the X- and Y-directions in FIG. 2.

The lead sections 26 in each package region 14 are connected to the lead sections 26 in other package regions 14 upward and downward adjacent to the particular package region 14, by respective lead connecting portions 52. In addition, the die pads 25 in each package region 14 are connected to the die pads 25 in other package regions 14 upward and downward adjacent to the particular package region 14, by respective die pad connecting portions 53. The lead connecting portions 52 and the die pad connecting portions 53 are all positioned in dicing regions 15, the connecting portions 52, 53 each being disposed in parallel to the Y-direction.

The die pad 25 in the package region 14 is further connected to the lead section 26 in another package region 14 rightward adjacent to the particular package region 14, by a package region connecting portion 54. Additionally, the lead section 26 in the package region 14 is further connected to the die pad 25 in another package region 14 leftward adjacent to the particular package region 14, by another package region connecting portion 54. Each package region connecting portion 54 is positioned in one dicing region 15, the connecting portion 54 being disposed in parallel to the X-direction.

The lead sections 26 and die pads 25 in outermost package regions 14 are each connected to the frame body region 13 by one of an inclined reinforcement piece 51, a lead connecting portion 52, a die pad connecting portion 53, and a package region connecting portion 54, or a plurality of these elements.

As shown in the sectional view of FIG. 3, the lead frame 10 includes a lead frame main body 11 and a plated layer 12 formed on the lead frame main body 11.

The lead frame main body (hereinafter referred to simply as the lead frame body) 11 is formed from a sheet of metal. The metal sheet constituting the lead frame body 11 can be of a material such as copper, copper alloy, or 42-alloy (a Fe alloy with a 42% Ni content). Thickness of the lead frame body 11 depends on the configuration of the semiconductor device. Preferable thickness, however, ranges between 0.05 mm and 0.5 mm, inclusive.

The plated layer 12 is provided on entire upper and lower surfaces of the lead frame body 11. The plated layer 12 on the upper-surface side functions as a reflective layer for reflecting light from an LED element 21. The plated layer 12 on the lower-surface side, on the other hand, plays a role in enhancing adhesion to solder. This plated layer 12 is formed from an electroplated layer of silver (Ag), for example. The plated layer 12 is formed to have extremely small thickness. More specifically, this value preferably ranges between 0.005 µm and 0.2 µm, inclusive. The plated layer 12 does not always need to be provided on the upper and lower surfaces of the lead frame body 11, and may only be provided on part of the upper and lower surfaces of the lead frame body 11.

In addition, a first outer lead section 27 is formed on a lower surface of the die pad 25, and a second outer lead section 28 on a lower surface of the lead section 26. The first outer lead section 27 and the second outer lead section 28 are used to interconnect the semiconductor device 20 and an external wiring substrate, respectively.

Grooves 18 for enhancing adhesion between the lead frame 10 and a reflecting resin 23 (described later herein) are also formed on the upper surface of the lead frame 10. Representation of the grooves 18 is omitted in FIG. 2.

Semiconductor Device Configuration

Next, an embodiment of a semiconductor device fabricated using the lead frame shown in FIGS. 1 to 3 is described below per FIGS. 4 and 5. FIG. 4 is a sectional view of the semiconductor device (SON type), and FIG. 5 is a plan view thereof.

As shown in FIGS. 4 and 5, the semiconductor device 20 includes a (singulated) lead frame 10, an LED element 21 rested on a die pad 25 of the lead frame 10, and a bonding wire (electric conductor) 22 that electrically interconnects the LED element 21 and a lead section 26 of the lead frame 10.

In addition, a reflecting resin 23 with a recess 23a is provided around the LED element 21. The reflecting resin 23 is integrated with the lead frame 10. Furthermore, the LED element and the bonding wire 22 are both sealed with a light-transmissive sealing resin 24. The recess 23a in the reflecting resin 23 is filled with the sealing resin 24.

Members that constitute the thus-configured semiconductor device 20 are described in order below.

If a material formed from compound semiconductor single crystals such as GaP, GaAs, GaAlAs, GaAsP, AlInGaP, and/or InGaN, is appropriately selected for a light-emitting layer, a light-emission wavelength ranging between those of ultraviolet light and those of infrared light, inclusive, can be selected for the LED element 21. A commonly used conventional element can be used as such an LED element 21.

The LED element 21 is fixedly mounted on the die pad 25, inside the recess 23a of the reflecting resin 23, via solder or a die-bonding paste. If a die-bonding paste is to be used, the die-bonding paste can be that formed from a light-resistant epoxy resin or silicone resin.

The bonding wire 22 is formed from a highly electroconductive material such as gold, with one end thereof being connected to a terminal section 21a of the LED element 21, and with the other end thereof being connected to an upper portion of the lead section 26.

The reflecting resin 23 is formed by, for example, thermoplastic resin injection molding or transfer molding over the lead frame 10, for example. The reflecting resin 23 can vary in shape according to a design of a mold used during the injection molding or transfer molding of the resin. For example, the entire reflecting resin 23 can be formed into a regularly parallelepipedic shape as shown in FIGS. 4 and 5, or formed into a shape of a cylinder, pyramid/cone, or the like. The recess 23a can have either a rectangular, circular, elliptical, or polygonal bottom. Sidewalls of the recess 23a may have either a rectilinear cross-sectional shape as shown in FIG. 4, or have a curvilinear one.

A material excelling particularly in heat resistance, weatherability, and mechanical strength is desirably selected for the thermoplastic resin used as the reflecting resin 23. The useable kinds of thermoplastic resin materials are polyamide, polyphthalalamide, polyphenylene sulfide, liquid-crystal polymers, polyether sulphone, silicone, epoxies, polyetherimide, polyurethane, polybutylene terephthalate, and the like. If titanium dioxide, zirconium dioxide, potassium titanate, aluminum nitride, or boron nitride is added as a light-reflecting agent to the resin, this increases a reflectance of light from the light-emitting element, at the bottom and sidewalls of the recess 23a, thus increasing optical extraction efficiency of the entire semiconductor device 20.

A material high in an index of refraction as well as in optical transmittance at the light-emission wavelength of the semiconductor device 20 is desirably selected as the sealing resin 24. An epoxy resin or a silicone resin can therefore be selected as a resin that satisfies high heat resistance, weatherability, and mechanical strength requirements. To use a high-luminance LED, in particular, as the LED element 21, the sealing resin 24 is preferably formed from a highly weatherable silicone resin material since the sealing resin 24 is exposed to strong light.

The configuration of the lead frame 10 has already been described using FIGS. 1 to 3, so further detailed description of the lead frame 10 is omitted herein.

Method of Manufacturing the Lead Frame for Mounting LED Elements

Next, a method of manufacturing the lead frame 10 shown in FIGS. 1 to 3 is described below using FIGS. 6(a) to 6(f).

First, a metallic substrate 31 of a flat-plate shape is provided as shown in FIG. 6(a). The metallic substrate 31 can, as outlined above, be that formed from copper, a copper alloy, a 42-alloy (a Fe alloy with a 42% Ni content), and/or the like. Both sides of the metallic substrate 31 are preferably degreased and cleaned beforehand.

Next as shown in FIG. 6(b), entire upper and lower surfaces of the metallic substrate 31 are coated with photosensitive resists 32a and 33a, respectively, and then the resists are dried. The photosensitive resists 32a, 33a can be conventionally known ones.

Following the above, light exposure of the metallic substrate 31 via a photomask takes place, and developing further follows. Etching resist layers 32 and 33 with desired openings 32b and 33b, respectively, are then formed as shown in FIG. 6(c).

Next as shown in FIG. 6(d), etching of the metallic substrate 31 with an etchant occurs using the etching resist layers 32, 33 as anti-etching films. An appropriate chemical as the etchant can be selected according to a material of the metallic substrate 31 to be used. For example, to use copper as the metallic substrate 31, the substrate can usually be spray-etched from both sides using an aqueous ferric chloride solution.

After that, the etching resist layers 32, 33 are peeled off, whereby the lead frame body 11 is then obtained as shown in FIG. 6(e). At this time, the inclined reinforcement pieces 51, lead connecting portions 52, die pad connecting portions 53, and package region connecting portions 54 shown in FIG. 2 are also formed as a result of etching.

Next, the upper and lower surfaces of the lead frame body 11 are provided with electrolytic plating to deposit a metal (silver) onto the lead frame body 11 and form a plated layer 12 on the upper and lower surfaces of the lead frame body 11. This state is shown in FIG. 6(f). In this case, since the inclined reinforcement pieces 51, the lead connecting portions 52, the die pad connecting portions 53, and the package region connecting portions 54 all include the main body (the lead frame body 11) and the plated layer 12 formed on the body, the inclined reinforcement pieces 51, the lead connecting portions 52, the die pad connecting portions 53, and the package region connecting portions 54 are enhanced in strength.

More specifically, during the formation of the above, the lead frame body 11 goes through steps such as electrolytic degreasing, pickling, chemical polishing, copper striking, water washing, neutral degreasing, cyanide cleaning, and silver plating, in that order, to be formed with the plated layer 12 on the lead frame body 11. An electroplating solution used in the silver-plating step can be, for example, a silver-plating solution composed mainly of silver cyanide. In an actual process, water washing is added between steps, as required. Alternatively, the plated layer 12 may be formed on part of the lead frame body 11 by adding a patterning step midway in the process.

In this manner, the lead frame 10 that was shown in FIGS. 1 to 3 is obtained. FIG. 6(f) shows the as-fabricated state of the lead frame 10.

While the method of manufacturing the lead frame 10 by etching in FIGS. 6(a) to 6(f) has been shown and described, this manufacturing method may be replaced by fabrication with a press.

Method of Manufacturing the Semiconductor Device

Next, a method of manufacturing the semiconductor device 20 shown in FIGS. 4 and 5 is described below using FIGS. 7(a) to 7(d), 8(a) to 8(e), and 9(a) and 9(b).

First, the lead frame 10 is fabricated in the steps of FIGS. 6(a) to 6(f). FIG. 7(a) shows the thus-fabricated lead frame 10.

After the fabrication, the lead frame 10 is mounted in a mold 35 of an injection molding machine or transfer molding machine (not shown), as in FIG. 7(b). Spaces 35a appropriate for the shape of the reflecting resin 23 are formed in the mold 35.

Next, a thermoplastic resin is poured into the mold 35 from a resin supply section (not shown) of the injection molding machine or transfer molding machine, and then cured. This forms the reflecting resin 23 on the plated layer 12 of the lead frame 10, as shown in FIG. 7(c).

The lead frame 10 with the reflecting resin 23 formed therein is removed from the mold 35. As shown in FIG. 7(d), a resin-containing lead frame 30 is thus obtained as a structure formed by integrating the reflecting resin 23 and the lead frame 10. In this way, the present embodiment also provides a resin-containing lead frame 30 that includes the lead frame 10 and the reflecting resin 23 disposed on edges of each package region 14 in the lead frame 10.

Next, an LED element 21 is mounted on the die pad 25 of the lead frame 10, in each reflecting resin 23 of the resin-containing lead frame 30. In this case, as shown in FIG. 8(a), the LED element 21 is rested on and fixed to the die pad 25 by use of solder or a die-bonding paste (this step is called die-attaching).

Next as shown in FIG. 8(b), the terminal section 21a of the LED element 21 and an upper surface of the lead section 26 are electrically connected to each other via a bonding wire 22 (this step is called wire bonding).

After this, the recess 23a in the reflecting resin 23 is filled with a sealing resin 24, whereby the LED element 21 and the bonding wire 22 are then sealed with the sealing resin 24. This state is shown in FIG. 8(c).

Next as shown in FIG. 8(d), the reflecting resin 23 and the lead frame 10 are separated for each LED element 21 by cutting those sections of the dicing region 15 that correspond to the reflecting resin 23 and the lead frame 10 (this cutting step is called dicing). At this time, the lead frame 10 is first rested on and fixed to a dicing tape 37, and then the inclined reinforcement pieces 51, lead connecting portions 52, die pad connecting portions 53, and package region connecting portions 54 of the lead frame 10, in addition to the reflecting resin 23 between the LED elements 21, are cut using, for example, a blade 38 made of a diamond grinding wheel or the like.

During the cutting step, as shown in FIG. 9(a), the lead frame 10 may be cut using a relatively thick blade 38 appropriate for particular width of the dicing region 15. In this case, adjacent package regions 14 can be efficiently separated from each other in one cutting operation. As an alternative, the lead frame 10 may be cut in two cutting operations using a relatively thin blade 38 narrower than the width of the dicing region 15, as shown in FIG. 9(b). In this case, the blade 38 can be increased in feed rate per cutting operation and extended in life.

The semiconductor device 20 shown in FIGS. 4 and 5 is thus obtained. FIG. 8(e) shows the lead frame being cut.

As described above, in accordance with the present embodiment, the die pad 25 in one package region 14 and the lead section 26 in another package region 14 adjacent to that package region 14 are connected to each other by an inclined reinforcement piece 51 positioned in the dicing region. In addition, the die pad 25 in one package region 14 is connected to the lead section 26 in another package region 14 adjacent to that package region 14, by a package region connecting portion 54. These structural features and characteristics prevent an elongated space from occurring in a vertical direction of the lead frame 10, and hence prevent the lead frame 10 from being formed into a vertically slit blind/screen or interdigitated shape, and from becoming deformed during handling.

Furthermore, the lead section 26 in one package region 14 is connected to the lead section 26 in another package region 14 adjacent to that package region 14, by a lead connecting portion 52, and the die pad 25 in one package region 14 is connected to the die pad 25 in another package region 14 adjacent to that package region 14, by a die pad connecting portion 53. These structural features and characteristics prevent an elongated space from occurring in a horizontal direction of the lead frame 10, and hence prevent the lead frame 10 from being formed into a horizontally slit blind/screen or interdigitated shape, and from becoming deformed during handling.

The deformation of the lead frame 10 is thus prevented, so when the reflecting resin 23 is formed in the lead frame 10 as shown in FIGS. 7(b) and 7(c), a forming position of the reflecting resin 23 with respect to the lead frame 10 does not shift. It is therefore easy to mount a large-area LED element 21 in a small package region 14, to mount a plurality of LED elements 21, or to mount an antistatic protection element in addition to an LED element 21.

Additionally, the present embodiment makes it unnecessary to provide tie bars of a matrix format around any package regions 14, thus allows package regions 14 to be arranged in proximity to one another, and hence the number of package regions 14 in one lead frame 10 to be increased by higher-density mounting.

Furthermore, in the present embodiment, since a connecting bar such as a hanging lead is absent at any corners of a package region 14, the reflecting resin 23 is not likely to peel from the lead frame 10, at corners of the semiconductor device 20, and thus, reliability of the semiconductor device 20 improves.

Modifications of the Lead Frame

Hereunder, various examples of modification, as modifications 1-1 to 1-8, of the lead frame according to the present embodiment are described referring to FIGS. 10 to 17. FIGS. 10 to 17 are partly enlarged plan views showing the modifications of the lead frame, the plan views each corresponding to FIG. 2. In FIGS. 10 to 17, the same elements as those shown in FIGS. 1 to 9 are each assigned the same reference number or symbol, and detailed description of these elements is omitted herein.

Modification 1-1

Figure 10:
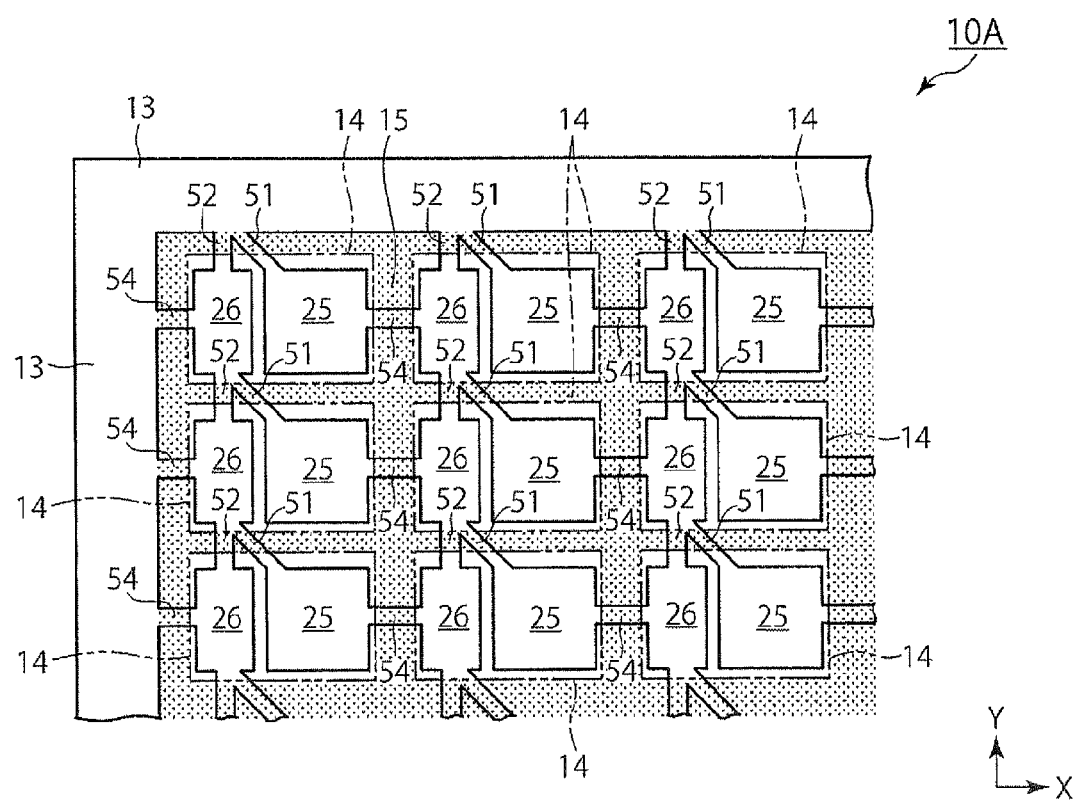
FIG. 10 is a partly enlarged plan view that shows modification 1-1, an example of modification, of the lead frame according to the first embodiment of the present invention.

FIG. 10 shows a lead frame 10A according to one modification (modification 1-1) of the present embodiment. Unlike that of the embodiment shown in FIGS. 1 to 9, the lead frame 10A shown in FIG. 10 does not include a die pad connecting portion 53 that connects any die pads 25.

In other words, the die pad 25 in one package region 14 is connected to the lead section 26 in another package region 14 upward adjacent to that package region 14, by an inclined reinforcement piece 51, and is connected to the lead section 26 in yet another package region 14 rightward adjacent to that package region 14, by a package region connecting portion 54. The die pad 25 in one package region 14, however, is not directly connected to the die pad 25 in other package regions 14 upward or downward adjacent to that package region 14.

Not providing a die pad connecting portion 53 in this way allows a dicing load upon the blade 38 to be alleviated. Other structural features and characteristics are substantially the same as those of the embodiment shown in FIGS. 1 to 9.

Modification 1-2

Figure 11:
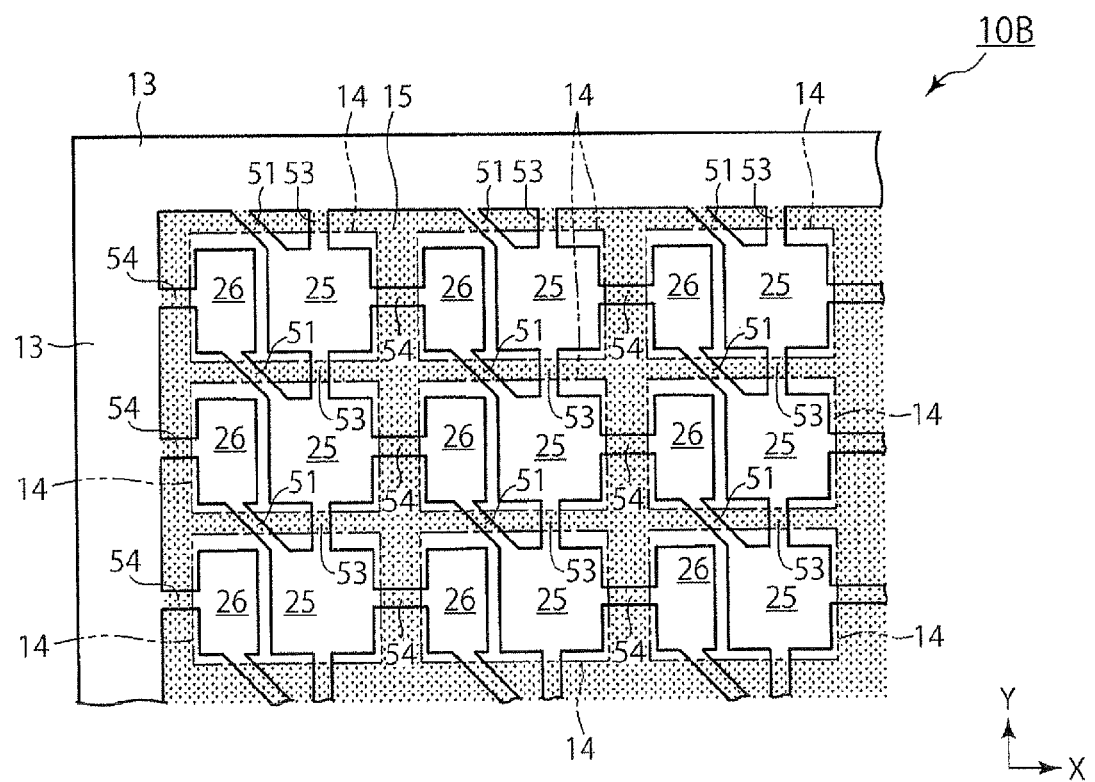
FIG. 11 is a partly enlarged plan view that shows modification 1-2, another example of modification, of the lead frame according to the first embodiment of the present invention.

FIG. 11 shows a lead frame 10B according to another modification (modification 1-2) of the present embodiment. Unlike that of the embodiment shown in FIGS. 1 to 9, the lead frame 10B shown in FIG. 11 does not include a lead connecting portion 52 that connects any lead sections 26.

In other words, the lead section 26 in one package region 14 is connected to the die pad 25 in another package region 14 downward adjacent to that package region 14, by an inclined reinforcement piece 51, and is connected to the die pad 25 in yet another package region 14 leftward adjacent to that package region 14, by a package region connecting portion 54. The lead section 26 in one package region 14, however, is not directly connected to the lead sections 26 in other package regions 14 upward or downward adjacent to that package region 14.

Not providing a lead connecting portion 52 in this way allows the dicing load upon the blade 38 to be alleviated. Other structural features and characteristics are substantially the same as those of the embodiment shown in FIGS. 1 to 9.

Modification 1-3

Figure 12:
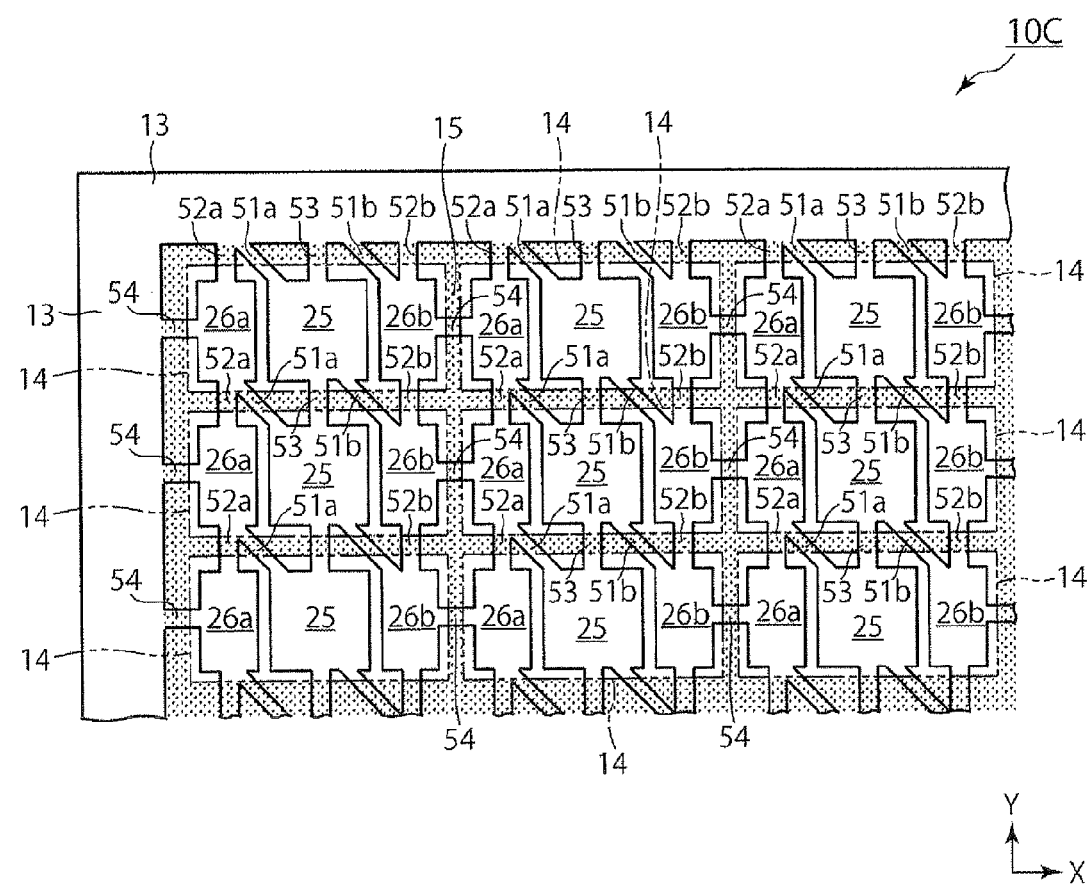
FIG. 12 is a partly enlarged plan view that shows modification 1-3, yet another example of modification, of the lead frame according to the first embodiment of the present invention.

FIG. 12 shows a lead frame 10C according to yet another modification (modification 1-3) of the present embodiment. Unlike those of the embodiment shown in FIGS. 1 to 9, package regions 14 in the lead frame 10C shown in FIG. 12, each include one die pad 25 and one pair of lead sections positioned across the die pad 25, namely 26a and 26b (hereinafter, these lead sections are also referred to as first lead section 26a and second lead section 26b; and this kind of lead frame is called a three-pin type).

In this case, the die pad 25 in one package region 14 and the first lead section 26a in a package region 14 (a first package region) upward adjacent to that package region 14 are connected to each other by a first inclined reinforcement piece 51a. In addition, the die pad 25 in one package region 14 and the second lead section 26b in a package region 14 (a second package region positioned at a side opposite to the first package region with regard to that package region 14) that is downward adjacent to the particular package region 14 are connected to each other by a second inclined reinforcement piece 51b. The first inclined reinforcement piece 51a and the second inclined reinforcement piece 51b are both positioned in a dicing region 15.

Furthermore, the die pad 25 in one package region 14 is connected to the die pads 25 in the package regions 14 (the first package region and second package region) that are upward and downward adjacent to that package region 14, by respective die pad connecting portions 53. Similarly, the first lead section 26a in one package region 14 is connected to the first lead sections 26a in the package regions 14 (the first package region and second package region) that are upward and downward adjacent to that package region 14, by respective first lead connecting portions 52a. Similarly, the second lead section 26b in one package region 14 is connected to the second lead sections 26b in the package regions 14 (the first package region and second package region) that are upward and downward adjacent to that package region 14, by respective second lead connecting portions 52b.

Moreover, the second lead section 26b in one package region 14 is connected to the first lead section 26a in another package region 14 rightward adjacent to that package region 14, by a package region connecting portion 54. Besides, the first lead section 26a in one package region 14 is connected to the second lead section 26b in yet another package region 14 leftward adjacent to that package region 14, by another package region connecting portion 54.

Even when each package region 14 thus includes one die pad, 25, and one pair of lead sections, 26a and 26b, the present embodiment prevents the lead frame 10 from being formed into a vertically slit blind/screen or interdigitated shape, and thus from becoming deformed during handling.

Modification 1-4

Figure 13:
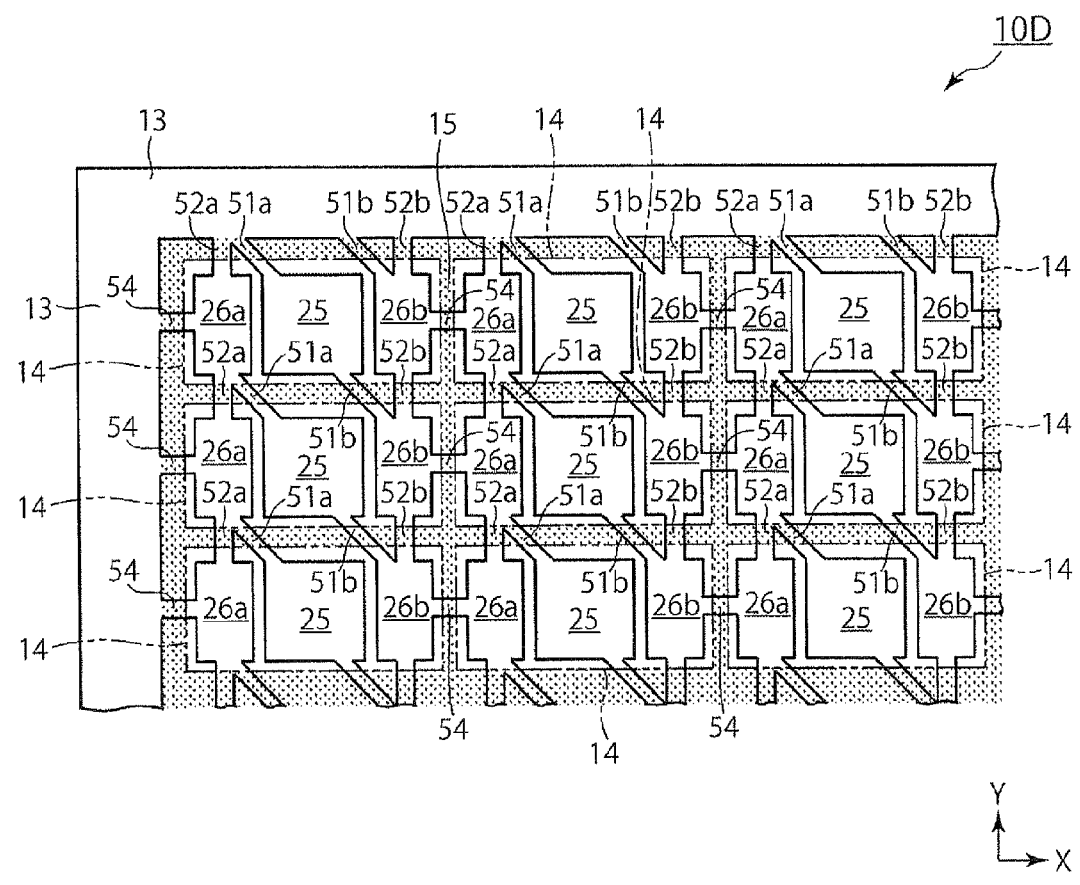
FIG. 13 is a partly enlarged plan view that shows modification 1-4, a further example of modification, of the lead frame according to the first embodiment of the present invention.

FIG. 13 shows a lead frame 10D according to a further modification (modification 1-4) of the present embodiment. Unlike that of modification 1-3 shown in FIG. 12, the lead frame 10D shown in FIG. 13 does not include a die pad connecting portion 53 that connects any die pads 25.

In other words, the die pad 25 in one package region 14 is connected to the first lead section 26a in another package region 14 (first package region) upward adjacent to that package region 14, by a first inclined reinforcement piece 51a, and is connected to the second lead section 26b in yet another package region 14 (second package region) downward adjacent to that package region 14, by a second inclined reinforcement piece 51b. The die pad 25 in one package region 14, however, is not directly connected to the die pads 25 in other package regions 14 (first package region and second package region) upward or downward adjacent to that package region 14.

Not providing a die pad connecting portion 53 in this way allows the dicing load upon the blade 38 to be alleviated. Other structural features and characteristics are substantially the same as those of modification 1-3 shown in FIG. 12.
Modification 1-5

Figure 14:
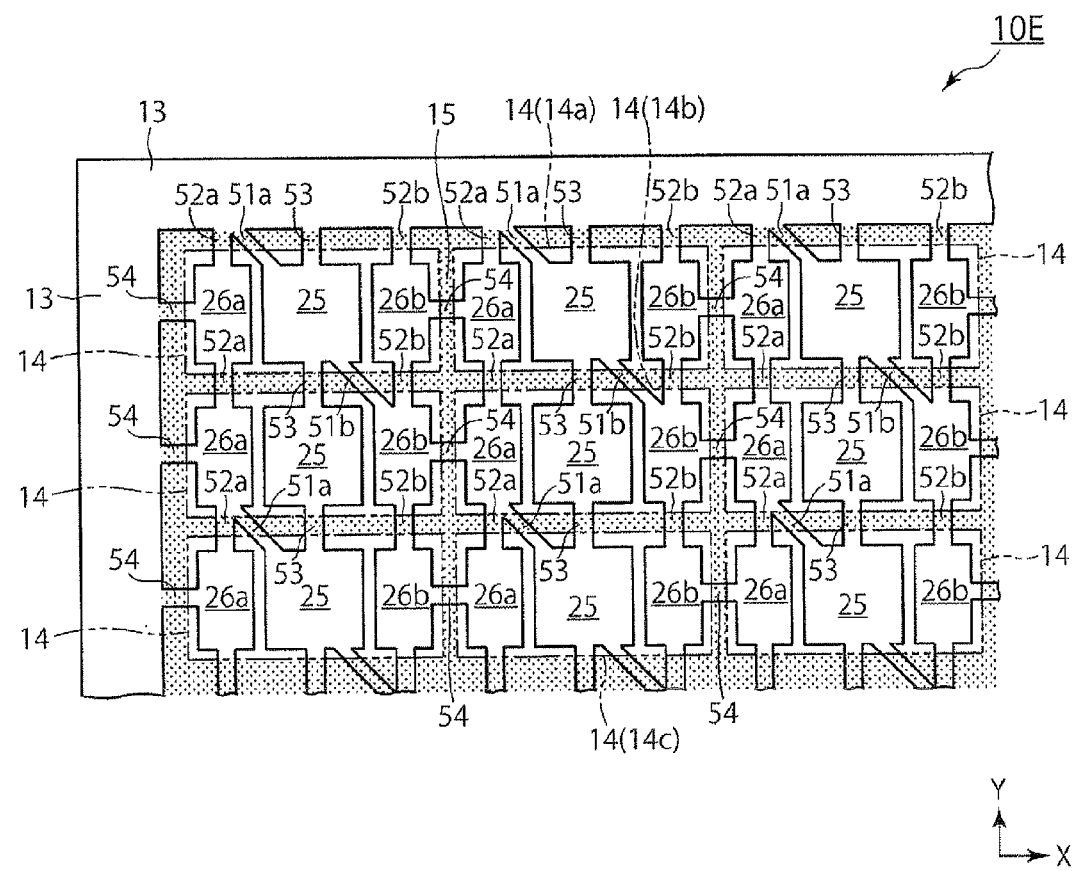
FIG. 14 is a partly enlarged plan view that shows modification 1-5, a further example of modification, of the lead frame according to the first embodiment of the present invention.

FIG. 14 shows a lead frame 10E according to a further modification (modification 1-5) of the present embodiment. Unlike that of modification 1-3 shown in FIG. 12, the lead frame 10E shown in FIG. 14 includes die pads 25 to each of which a first inclined reinforcement piece 51a and a second inclined reinforcement piece 51b are both connected, and die pads 25 to which neither a first inclined reinforcement piece 51a nor a second inclined reinforcement piece 51b is connected. The two types of die pads 25 are each provided at alternate positions in a longitudinal direction.

Referring to FIG. 14, neither a first inclined reinforcement piece 51a nor a second inclined reinforcement piece 51b is connected to, for example, the die pad 25 in a package region 14(14b). As opposed to this, a first inclined reinforcement piece 51a and a second inclined reinforcement piece 51b are both connected to, for example, a package region 14(14a) upward adjacent to the package region 14(14b) and a package region 14(14c) downward adjacent to the package region 14(14b), respectively.

Reducing the number of first inclined reinforcement pieces 51a and second inclined reinforcement pieces 51b in this way allows the dicing load upon the blade 38 to be alleviated. Other structural features and characteristics are substantially the same as those of modification 1-3 shown in FIG. 12.
Modification 1-6

Figure 15:
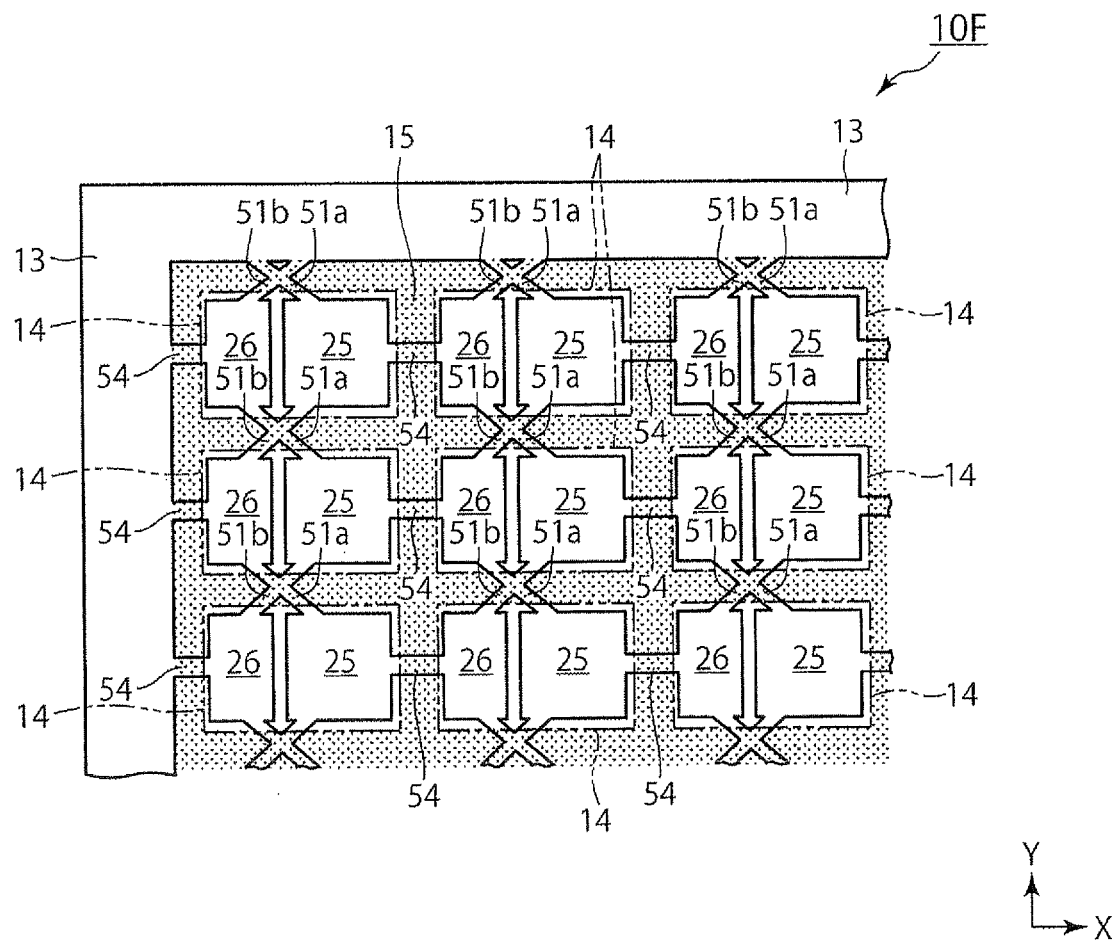
FIG. 15 is a partly enlarged plan view that shows modification 1-6, a further example of modification, of the lead frame according to the first embodiment of the present invention.

FIG. 15 shows a lead frame 10F according to a further modification (modification 1-6) of the present embodiment. Unlike that of the embodiment shown in FIGS. 1 to 9, the lead frame 10F shown in FIG. 15 includes neither a die pad connecting portion 53 nor a lead connecting portion 52.

In this case, the die pad 25 in one package region 14 and the lead section 26 in a package region 14 upward adjacent to that package region 14 are connected to each other by a first inclined reinforcement piece 51a. In addition, the lead section 26 in one package region 14 and the die pad 25 in a package region 14 upward adjacent to the particular package region 14 are connected to each other by a second inclined reinforcement piece 51b. The first inclined reinforcement piece 51a and the second inclined reinforcement piece 51b are both positioned in a dicing region 15. In addition, the first inclined reinforcement piece 51a and the second inclined reinforcement piece 51b intersect with each other to form a shape of the letter X.

Furthermore, the die pad 25 in one package region 14 and the lead section 26 in a package region 14 downward adjacent to that package region 14 are connected to each other by a second inclined reinforcement piece 51b. Moreover, the lead section 26 in one package region 14 and the die pad 25 in a package region 14 downward adjacent to the particular package region 14 are connected to each other by a first inclined reinforcement piece 51a.

Not providing a die pad connecting portion 53 or a lead connecting portion 52 in this way allows the dicing load upon the blade 38 to be alleviated. Other structural features and characteristics are substantially the same as those of modification 1-3 shown in FIGS. 1 to 9.
Modification 1-7

Figure 16:
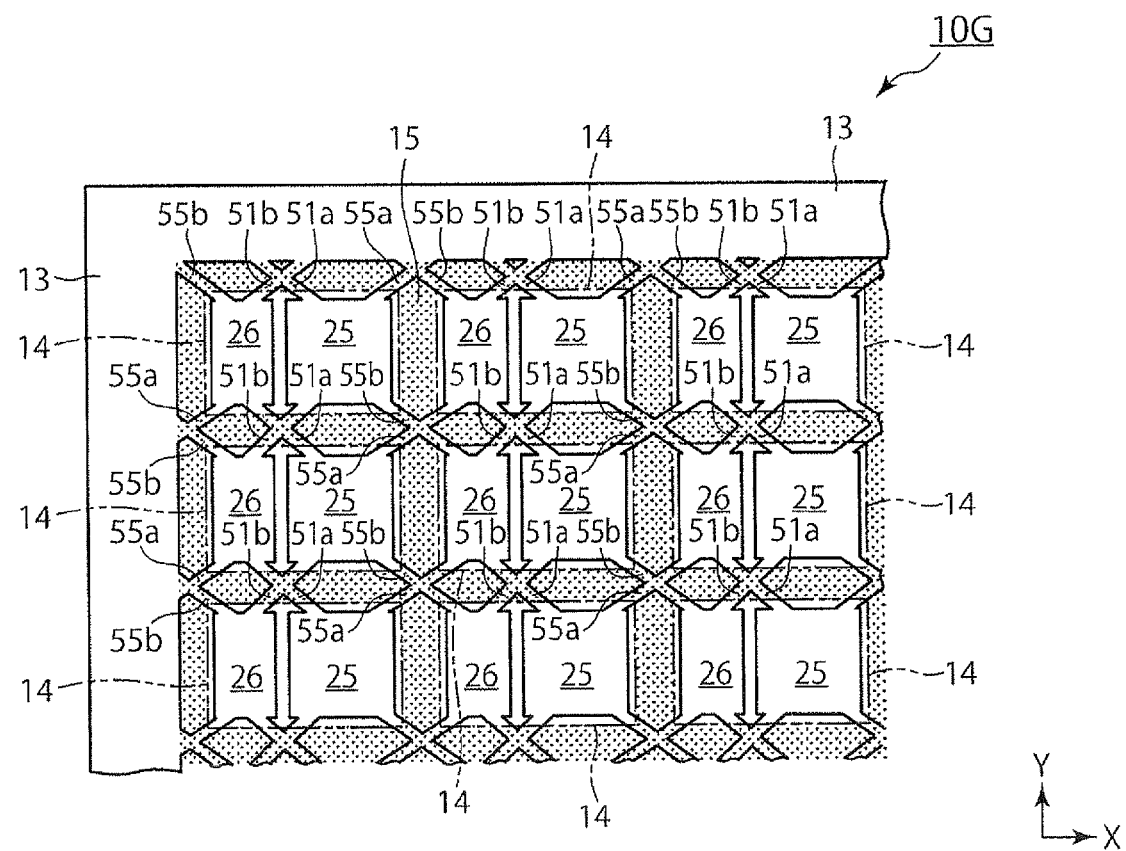
FIG. 16 is a partly enlarged plan view that shows modification 1-7, a further example of modification, of the lead frame according to the first embodiment of the present invention.

FIG. 16 shows a lead frame 10G according to a further modification (modification 1-7) of the present embodiment. Unlike that of modification 1-6 shown in FIG. 15, the lead frame 10G shown in FIG. 16 does not include package region connecting portions 54.

In this case, the die pad 25 in one package region is connected to the lead sections 26 in diagonally right upward and diagonally right downward package regions 14 adjacent to the die pad 25 in that package region, by one pair of additional inclined reinforcement pieces 55a, 55b positioned in a dicing region. In other words, the die pad 25 in one package region is connected to the lead section 26 in a diagonally right upward package region 14 adjacent to that package region, by an additional inclined reinforcement piece 55a, and is connected to the lead section 26 in a diagonally right downward package region 14 adjacent to the foregoing package region, by an additional inclined reinforcement piece 55b.

In addition, the lead section 26 in one package region 14 is connected to the die pads 25 in diagonally left upward and diagonally left downward package regions 14 adjacent to the lead section 26 in that package region, by one pair of additional inclined reinforcement pieces 55b, 55a positioned in different dicing regions. In other words, the lead section 26 in one package region 14 is connected to the die pad 25 in a diagonally left upward package region 14 adjacent to that package region, by an additional inclined reinforcement piece 55b, and is connected to the lead section 26 in a diagonally left downward package region 14 adjacent to the foregoing package region, by an additional inclined reinforcement piece 55a. Other structural features and characteristics are substantially the same as those of modification 1-6 shown in FIG. 15.
Modification 1-8

Figure 17:
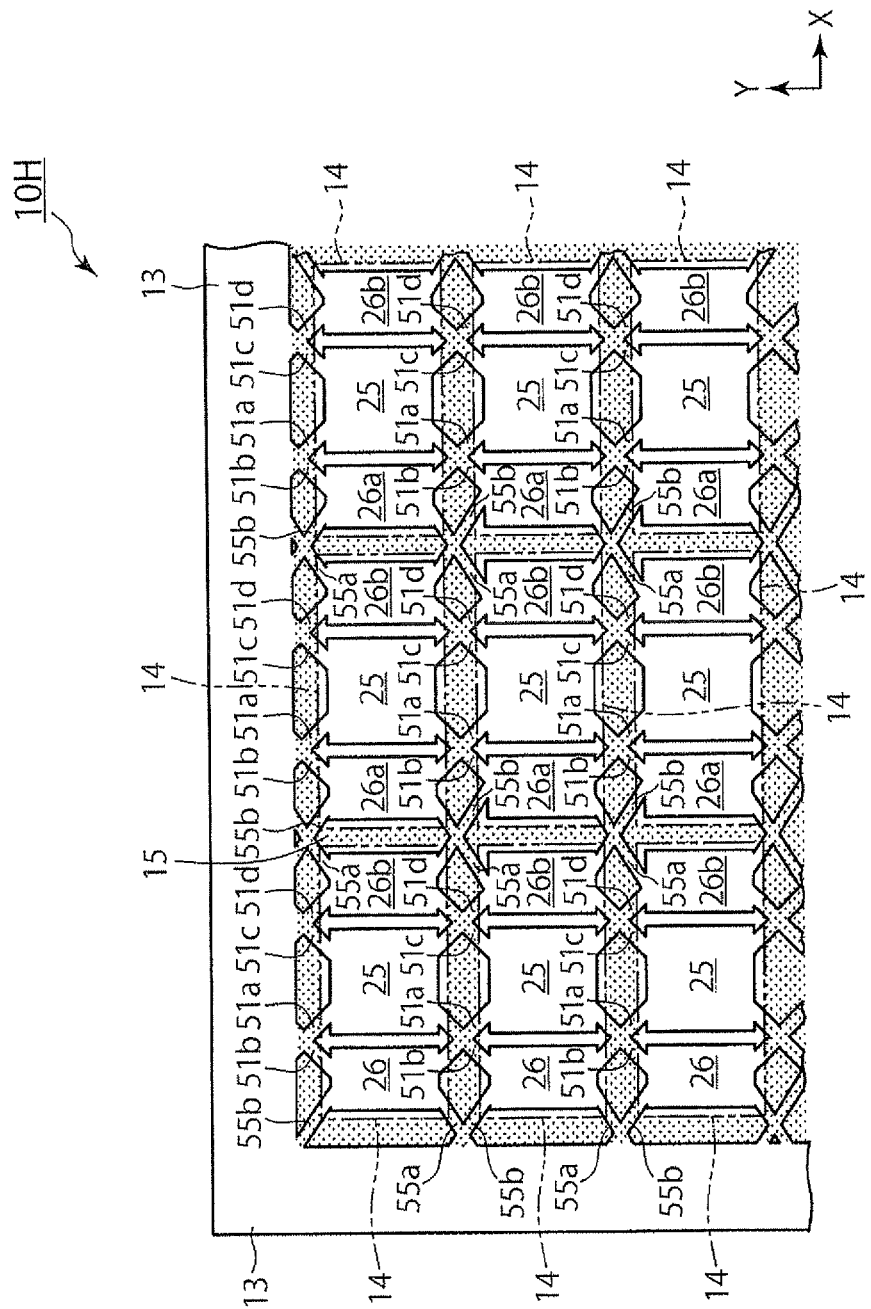
FIG. 17 is a partly enlarged plan view that shows modification 1-8, a further example of modification, of the lead frame according to the first embodiment of the present invention.

FIG. 17 shows a lead frame 10H according to a further modification (modification 1-8) of the present embodiment. Unlike those of modification 1-7 shown in FIG. 16, package regions 14 in the lead frame 10H shown in FIG. 17, each include one die pad 25 and one pair of lead sections positioned across the die pad 25, namely 26a and 26b (hereinafter, these lead sections are also referred to as first lead section 26a and second lead section 26b).

In this case, the die pad 25 in one package region 14 and the first lead section 26a in a package region 14 upward adjacent to that package region 14 are connected to each other by a first inclined reinforcement piece 51a positioned in a dicing region 15. Similarly, the die pad 25 in one package region 14 and the first lead section 26a in a package region 14 downward adjacent to that package region 14 are connected to each other by a second inclined reinforcement piece 51b positioned in the dicing region 15.

In addition, the die pad 25 in one package region 14 and the second lead section 26b in a package region 14 upward adjacent to that package region 14 are connected to each other by a third inclined reinforcement piece 51c positioned in the dicing region 15. Similarly, the die pad 25 in one package region 14 and the second lead section 26b in a package region 14 downward adjacent to that package region 14 are connected to each other by a fourth inclined reinforcement piece 51d positioned in the dicing region 15.

The first lead section 26a in one package region 14 is connected to the second lead section 26b in diagonally left upward and diagonally left downward package regions 14 adjacent to the first lead section 26a in that package region, by one pair of additional inclined reinforcement pieces 55b, 55a positioned in another dicing region 15. Moreover, the first lead section 26a in one package region 14 is connected to the die pads 25 in upward and downward package regions 14 adjacent to that package region, by a second inclined reinforcement piece 51b and a first inclined reinforcement piece 51a, respectively.

The second lead section 26b in one package region 14 is connected to the first lead sections 26a in diagonally right upward and diagonally right downward package regions 14 adjacent to the second lead section 26b in that package region, by one pair of additional inclined reinforcement pieces 55b, 55a positioned in different dicing regions. Besides, the second lead section 26b in one package region 14 is connected to the die pads 25 in upward and downward package regions 14 adjacent to that package region, by a fourth inclined reinforcement piece 51d and a third inclined reinforcement piece 51c, respectively.

For the above reasons, the lead frames according to modifications 1-1 to 1-8 shown in FIGS. 10 to 17, respectively, yield substantially the same advantageous effects as those of the embodiment shown in FIGS. 1 to 9.

Modifications of the Semiconductor Device

Figure 18:
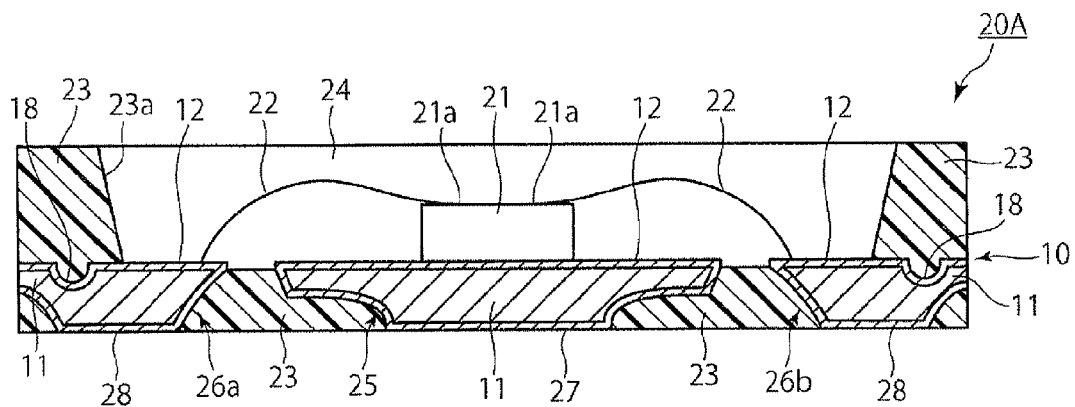
FIG. 18 is a sectional view that shows modification A, an example of modification, of the semiconductor device.
Figure 19:
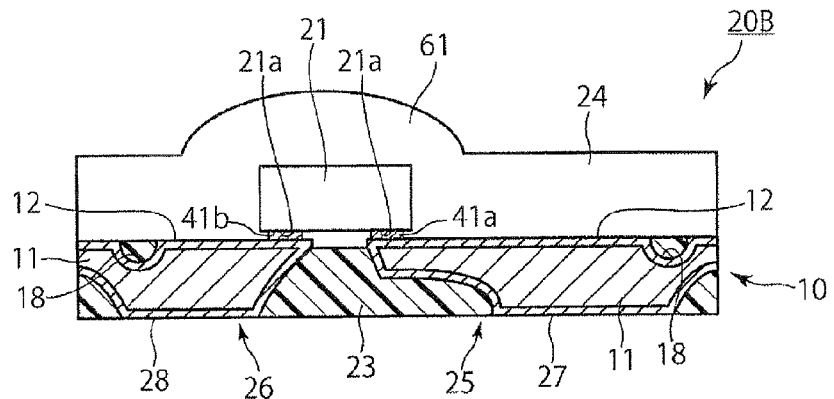
FIG. 19 is a sectional view that shows modification B, another example of modification, of the semiconductor device.
Figure 20:
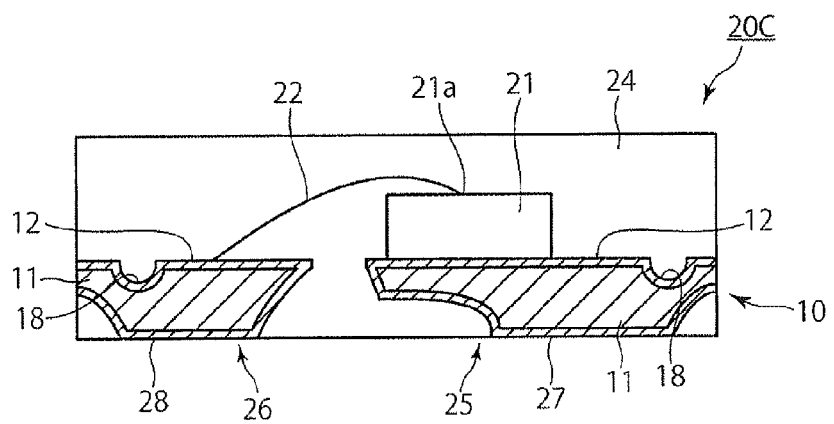
FIG. 20 is a sectional view that shows modification C, yet another example of modification, of the semiconductor device.

Next, examples of modification, as modifications A to C, of the semiconductor device according to the present embodiment are described below referring to FIGS. 18 to 20. FIGS. 18 to 20 are sectional views showing the modifications of the semiconductor device, the sectional views each corresponding to FIG. 4. In FIGS. 18 to 20, the same elements as those shown in FIGS. 4 and 5 are each assigned the same reference number or symbol, and detailed description of these elements is omitted herein.

Modification A

FIG. 18 shows a semiconductor device 20A according to one modification (three-pin type) of the present embodiment. A lead frame 10 in the semiconductor device 20A shown in FIG. 18 includes one die pad 25 and one pair of lead sections positioned across the die pad 25, namely 26a and 26b (hereinafter, these lead sections are also referred to as first lead section 26a and second lead section 26b).

In addition, an LED element 21 includes one pair of terminal sections 21a, one of the paired terminal sections 21a being connected to the first lead section 26a via a bonding wire 22 and the other terminal section 21a being connected to the second lead section 26b via another bonding wire 22. The lead frame 10 in this case can be, for example, any one of the lead frames 10C, 10D, 10E, and 10H shown in FIGS. 12, 13, 14, and 17, respectively. Other structural features and characteristics are substantially the same as those of the semiconductor device shown in FIGS. 4 and 5.

Modification B

FIG. 19 shows a semiconductor device 20B according to another modification (lens-fitted batch-molded type) of the present embodiment. In the semiconductor device 20B of FIG. 19, a reflecting resin 23 is placed between a die pad 25 and a lead section 26. Unlike that of the semiconductor device 20 shown in FIGS. 4 and 5, however, the reflecting resin 23 is not provided on a lead frame 10.

Additionally, in FIG. 19, an LED element 21 is connected to a lead frame 10 via solder balls (electroconductive portions) 41a and 41b, instead of a bonding wire 22. That is to say, one of the solder balls 41a, 41b is connected to the die pad 25 and the other solder ball is connected to the lead section 26. Furthermore, in FIG. 19, a dome-shaped lens 61 is formed on an upper surface of a sealing resin 24, to control an irradiating direction of light from the LED element 21.

Modification C

FIG. 20 shows a semiconductor device 20C according to yet another modification (batch-molded type) of the present embodiment. In the semiconductor device 20C of FIG. 20, an LED element 21 and a bonding wire 22 are simultaneously sealed together by a sealing resin 24 only, without using the reflecting resin 23. The sealing resin 24 is also placed between a die pad 25 and a lead section 26, to fill a spatial gap therebetween.

Second Embodiment

Next, a second embodiment of the present invention is described below referring to FIGS. 21 to 41. FIGS. 21 to 41 show the second embodiment of the present invention. In FIGS. 21 to 41, the same elements as those of the first embodiment are each assigned the same reference number or symbol, and detailed description of these elements is omitted herein.

Lead Frame Configuration

Figure 21:
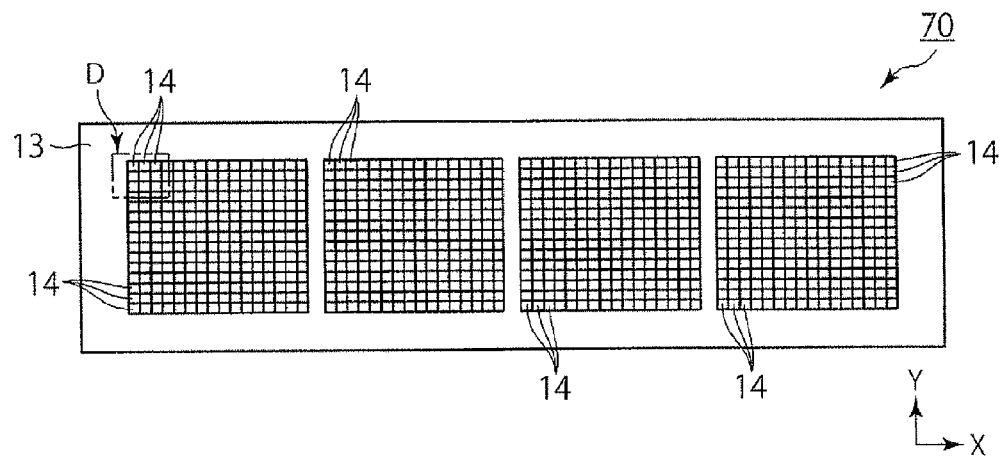
FIG. 21 is an overall plan view of a lead frame according to a second embodiment of the present invention.

First, a lead frame for mounting LED elements, according to the present embodiment, is outlined below per FIGS. 21 to 23. FIG. 21 is an overall plan view of the lead frame according to the present embodiment, FIG. 22 is an enlarged view of section D shown in FIG. 21, and FIG. 23 is a sectional view taken along line E-E in FIG. 22.

Figure 22:
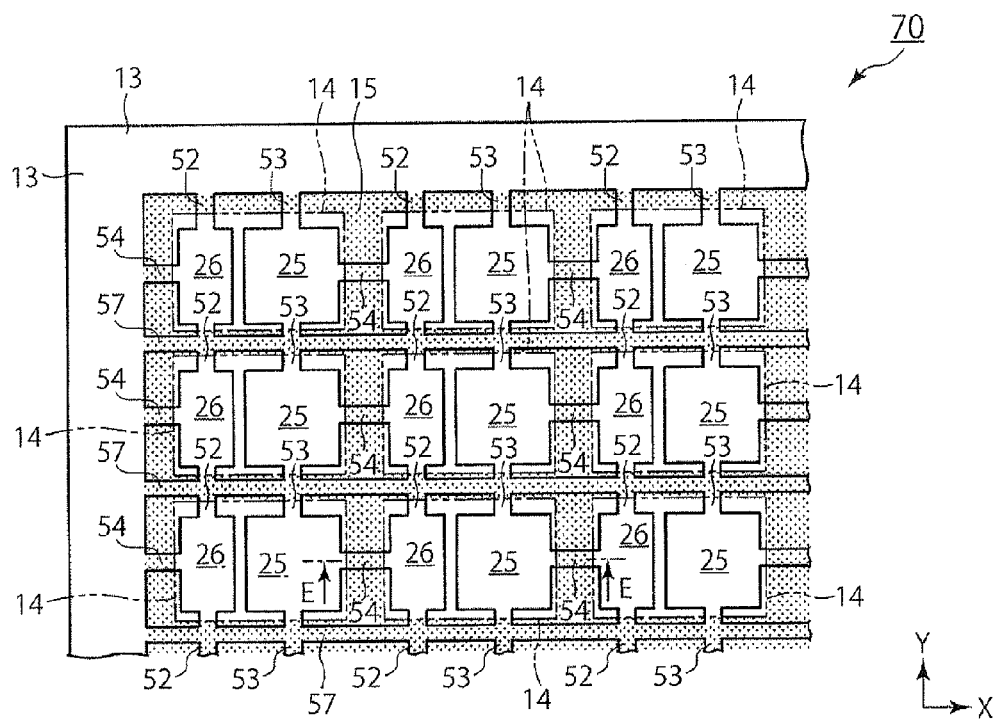
FIG. 22 is a partly enlarged plan view of the lead frame according to the second embodiment of the present invention, the plan view showing section D of FIG. 21.
Figure 23:
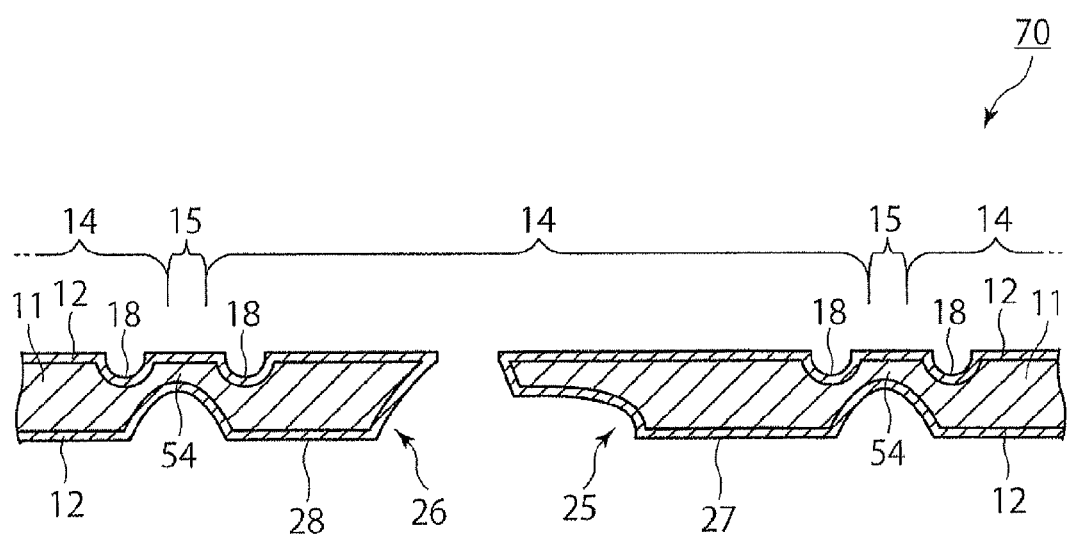
FIG. 23 is a sectional view of the lead frame according to the second embodiment of the present invention, the sectional view being taken along line E-E in FIG. 22.
Figure 24:
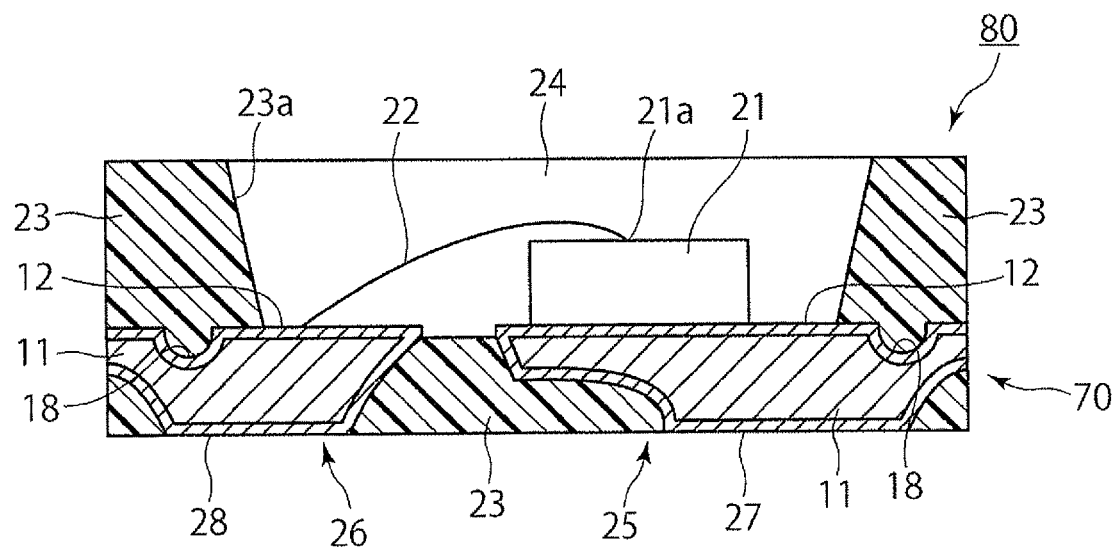
FIG. 24 is a sectional view showing a semiconductor device fabricated using the lead frame according to the second embodiment of the present invention, the sectional view being taken along line F-F in FIG. 25.
Figure 25:
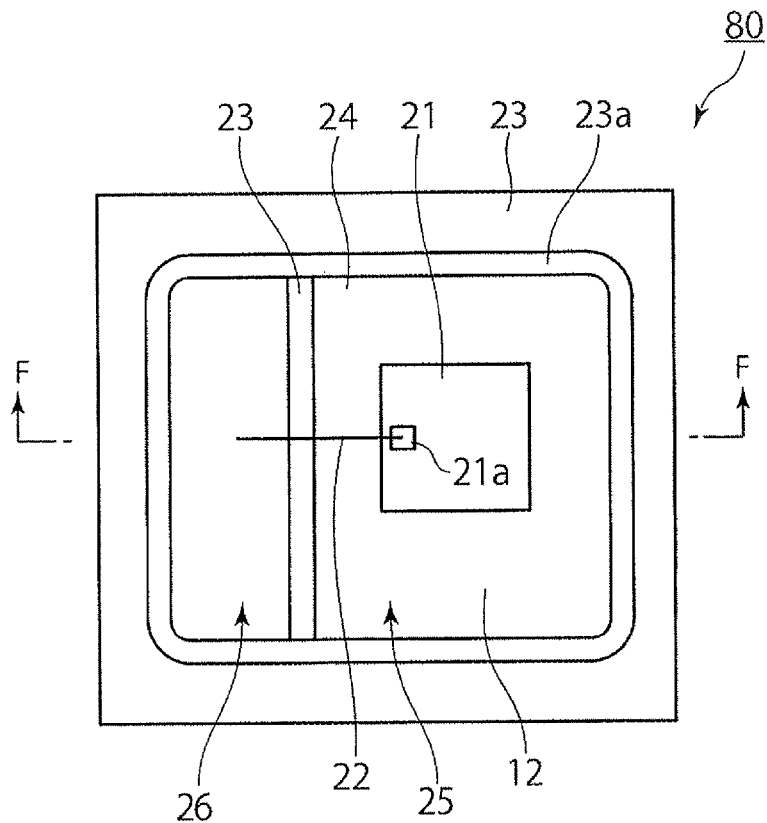
FIG. 25 is a plan view showing the semiconductor device fabricated using the lead frame according to the second embodiment of the present invention.

The lead frame 70 shown in FIGS. 21 to 23 is used to fabricate semiconductor devices 80 each having an LED element 21 mounted thereupon, one of the semiconductor devices 80 being shown in FIGS. 24 and 25. The lead frame 70 includes a frame body region 13 having an outline of a rectangular shape, and a large number of package regions 14 arranged in multiple rows and columns (i.e., in matrix form) inside the frame body region 13.

As shown in FIG. 22, the package regions 14 each include a die pad 25 on which an LED element 21 is to be mounted, and a lead section 26 adjacent to the die pad 25. The package regions 14 are also connected to one another via dicing regions 15.

A spatial gap is formed between the die pad 25 and lead section 26 in one package region 14, and the lead frame 70 is constructed so that the die pad 25 and the lead section 26 are electrically insulated from one another after dicing of the lead frame. Each package region 14 is provided for an independent semiconductor device 80. Each package region 14 is shown with a double-dotted line in FIG. 22.

The dicing regions 15 each extend in both longitudinal and lateral directions between the package regions 14. As will be detailed later herein, each dicing region 15 serves as a region through which blades 38 are to pass during manufacture of the semiconductor devices 80 when the lead frame 70 is separated for each package region 14. Each package region 14 is shown in hatched or shaded form in FIG. 22.

As shown in FIG. 22, the lead section 26 in one package region 14 and the lead sections 26 in other package regions 14 upward and downward adjacent to that package region 14 are interconnected across dicing regions 15 by respective lead connecting portions 52. Further, the die pad 25 in one package region 14 and the die pads 25 in other package regions 14 upward and downward adjacent to that package region 14 are also interconnected across the same dicing regions 15 as above, by respective die pad connecting portions 53. The lead connecting portions 52 and the die pad connecting portions 53 are each arranged in parallel to a Y direction in FIG. 22.

In addition, each die pad connecting portion 53 and each lead connecting portion 52 are connected to each other by a reinforcement piece 57 positioned in one dicing region 15. In this case, the reinforcement piece 57 is disposed in parallel to an X direction as shown in FIG. 22, and extends rectilinearly over entire inside length of the frame body region 13, thus connecting a plurality of die pad connecting portions 53 and a plurality of lead connecting portions 52.

Furthermore, the die pad 25 in one package region 14 is connected to the lead section 26 in another package region 14 rightward adjacent to that package region, by a package region connecting portion 54. Moreover, the lead section 26 in one package region 14 is connected to the die pad 25 in another package regions 14 leftward adjacent to the particular package region 14, by a package region connecting portion 54. Each package region connecting portion 54 is disposed in parallel with respect to the X-direction.

The lead sections 26 and die pads 25 in outermost package regions 14 are each connected to the frame body region 13 by one of a lead connecting portion 52, a die pad connecting portion 53, and a package region connecting portion 54, or a plurality of the three elements.

Referring to FIGS. 21 to 23, a lead frame main body 11 of the lead frame and a plated layer 12 are substantially of the same configuration as in the first embodiment, and detailed description of the lead frame body 11 and plated layer 12 is therefore omitted herein.

Semiconductor Device Configuration

Next, a second embodiment of a semiconductor device fabricated using the lead frame shown in FIGS. 21 to 23 is described below per FIGS. 24 and 25. FIG. 24 is a sectional view of the semiconductor device (SON type), and FIG. 25 is a plan view thereof.

As shown in FIGS. 24 and 25, the semiconductor device 80 includes a (singulated) lead frame 70, an LED element 21 rested on a die pad 25 of the lead frame 70, and a bonding wire (electric conductor) 22 that electrically interconnects the LED element 21 and a lead section 26 of the lead frame 70.

In addition, a reflecting resin 23 with a recess 23a is provided around the LED element 21. The reflecting resin 23 is integrated with the lead frame 70. Furthermore, the LED element and the bonding wire 22 are both sealed with a light-transmissive sealing resin 24. The recess 23a in the reflecting resin 23 is filled with the sealing resin 24.

Configurations of the LED element 21, bonding wire 22, reflecting resin 23, and sealing resin 24 constituting the thus-configured semiconductor device 80 are also substantially the same as in the first embodiment, so description of these constituent elements is omitted herein.

Figure 26:
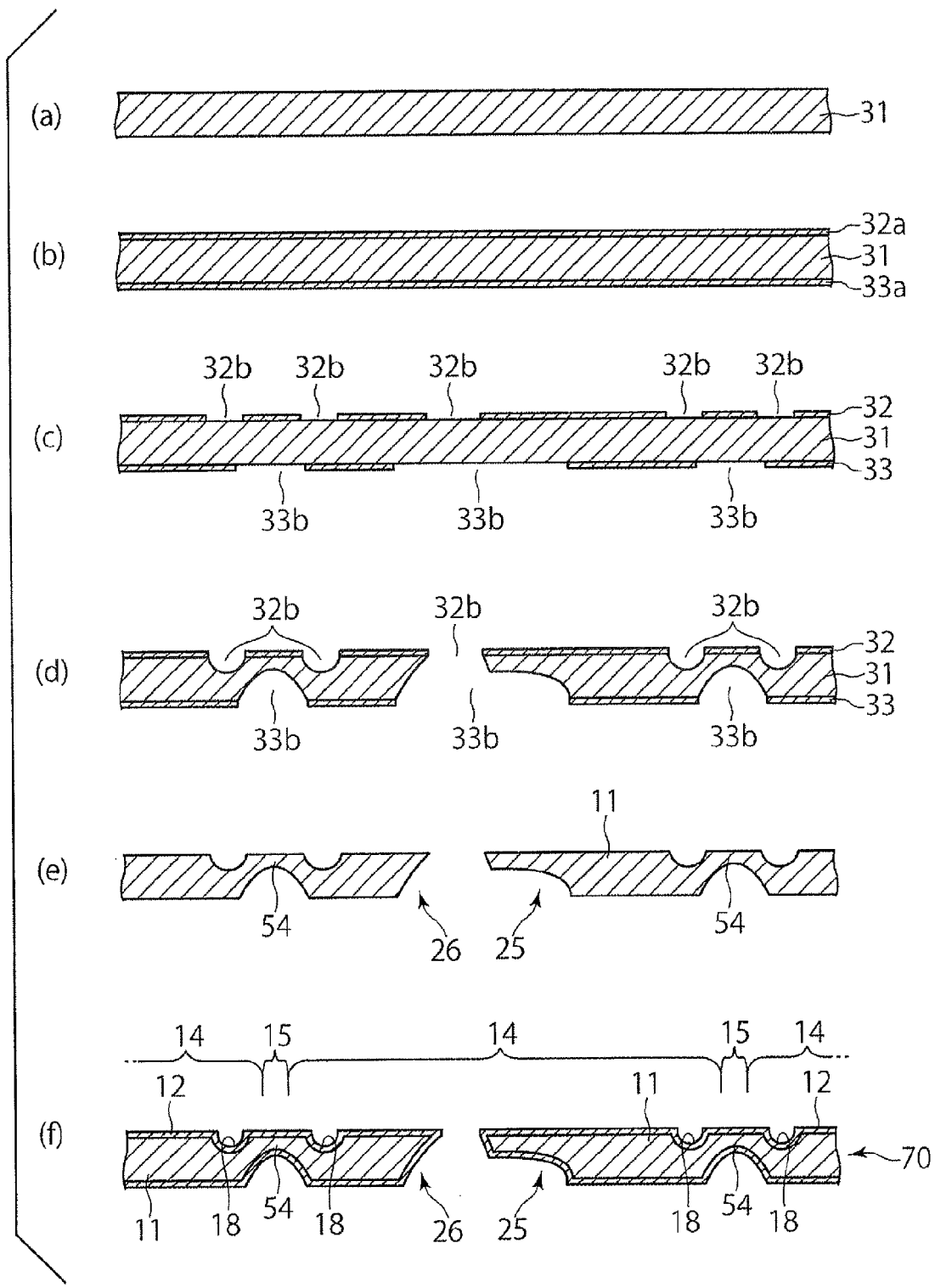
FIG. 26 is a diagram showing a method of manufacturing the lead frame according to the second embodiment of the present invention.
Figure 27:
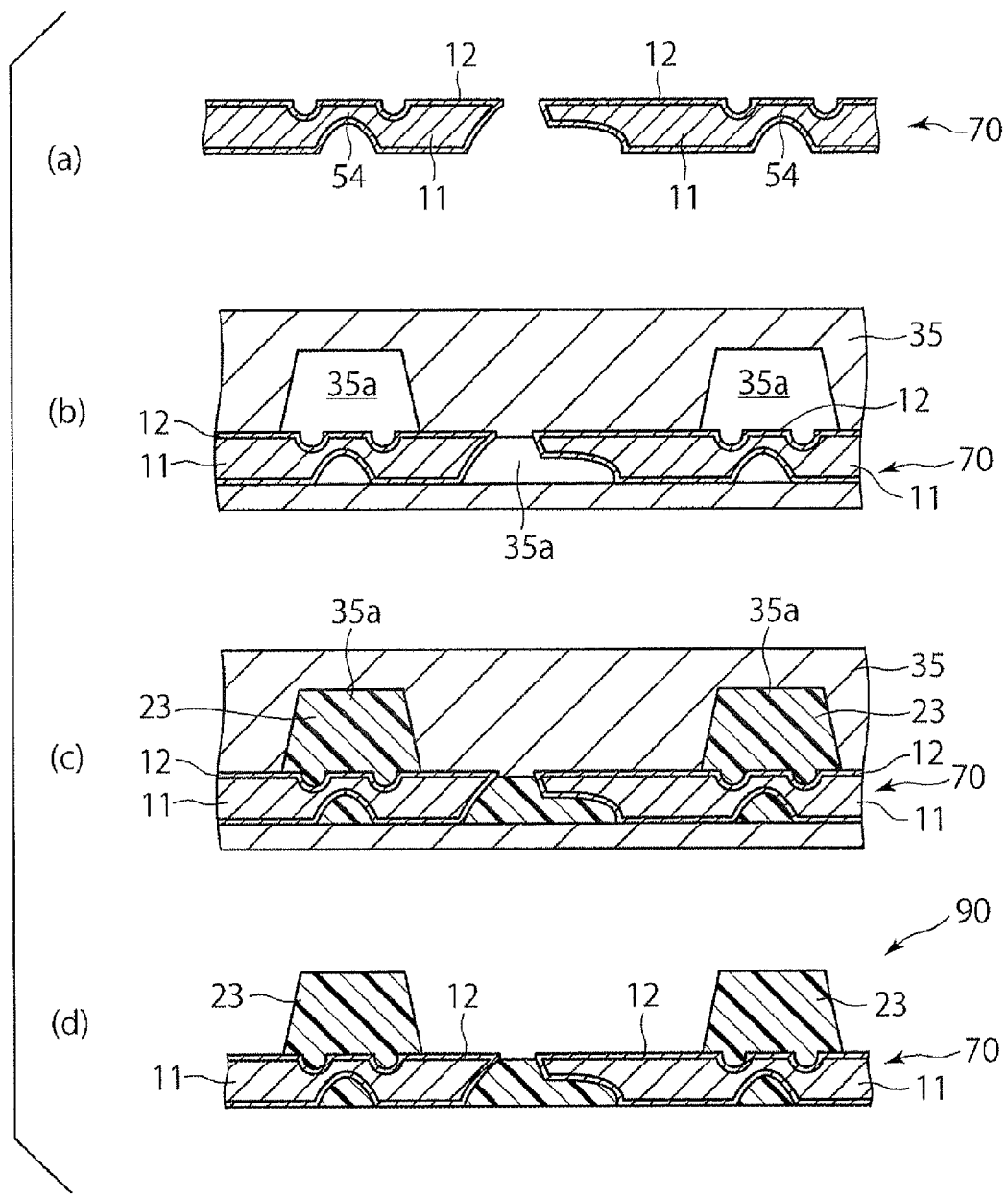
FIG. 27 is a diagram that shows steps for manufacturing the semiconductor device using the lead frame according to the second embodiment of the present invention.
Figure 28:
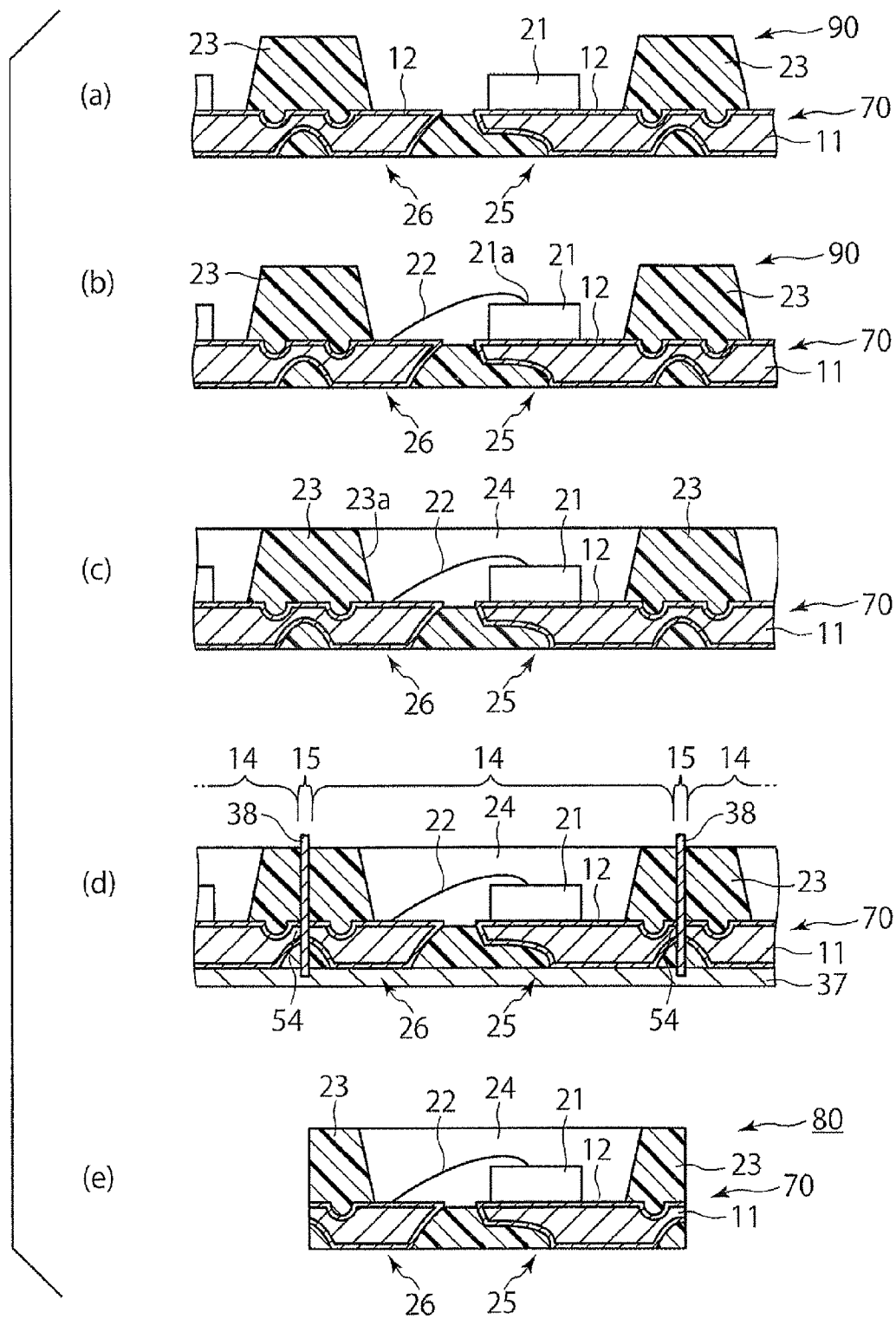
FIG. 28 is a diagram that showing further steps for manufacturing the semiconductor device using the lead frame according to the second embodiment of the present invention.
Figure 29:
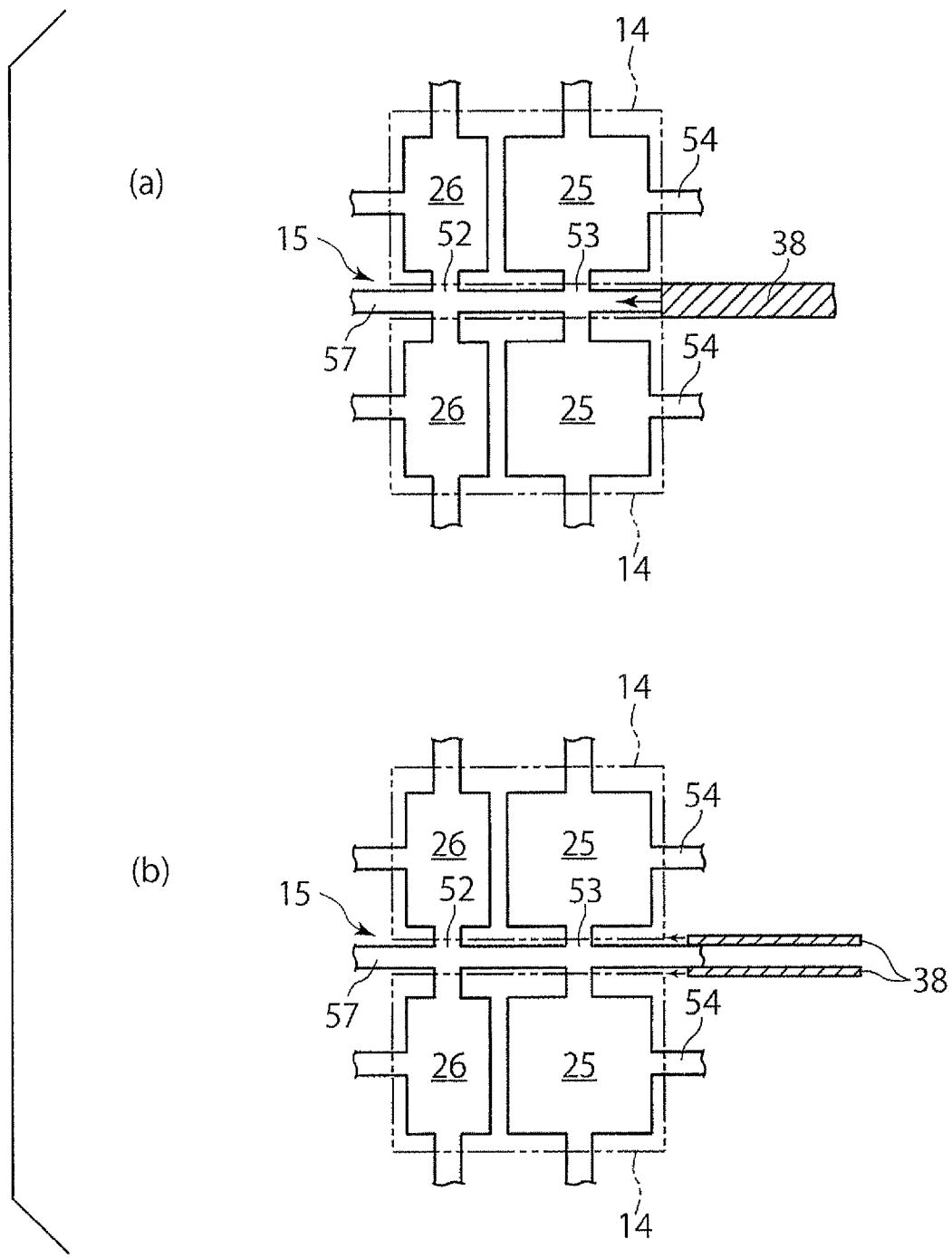
FIG. 29 is a diagram that shows dicing, one of the steps for manufacturing the semiconductor device.

Method of Manufacturing the LED Element Mounting Lead Frame and the Semiconductor Device Next, a method of manufacturing the lead frame 70 shown in FIGS. 21 to 23, and the semiconductor device 80 shown in FIGS. 24 and 25, is described below using FIGS. 26 to 29. The manufacturing method shown in FIGS. 26 to 28 is substantially the same as that shown in FIGS. 6 to 8, and description of a part of the manufacturing method is therefore omitted herein.

First, a metallic substrate 31 of a flat-plate shape is provided as shown in FIG. 26(a). Next as shown in FIG. 26(b), entire upper and lower surfaces of the metallic substrate 31 are coated with photosensitive resists 32a and 33a, respectively, and then the resists are dried.

Following the above, light exposure of the metallic substrate 31 via a photomask takes place, and developing further follows. Etching resist layers 32 and 33 with desired openings 32b and 33b, respectively, are then formed as shown in FIG. 26(c). Next as shown in FIG. 26(d), etching of the metallic substrate 31 with an etchant occurs using the etching resist layers 32, 33 as anti-etching films.

After that, the etching resist layers 32, 33 are peeled off, whereby a lead frame body 11 is then obtained as shown in FIG. 26(e). At this time, the reinforcement pieces 57, lead connecting portions 52, die pad connecting portions 53, and package region connecting portions 54 shown in FIG. 22 are also formed as a result of etching.

Next, upper and lower surfaces of the lead frame body 11 are provided with electrolytic plating to deposit a metal (silver) onto the lead frame body 11 and form a plated layer 12 on the upper and lower surfaces of the lead frame body 11. This state is shown in FIG. 26(f). In this case, since the reinforcement pieces 57, the lead connecting portions 52, the die pad connecting portions 53, and the package region connecting portions 54 all include the main body (the lead frame body 11) and the plated layer 12 formed on the body, the reinforcement pieces 57, the lead connecting portions 52, the die pad connecting portions 53, and the package region connecting portions 54 are enhanced in strength.

In this manner, the lead frame 70 that was shown in FIGS. 21 to 23 is obtained. FIG. 26(f) shows the thus-fabricated state of the lead frame 70.

After this, the thus-obtained lead frame 70 shown in FIG. 27(a) is mounted in a mold 35 of an injection molding machine or transfer molding machine (not shown), as shown in FIG. 27(b). Next, a thermoplastic resin is poured into the mold 35 and cured. This forms the reflecting resin 23 on the plated layer 12 of the lead frame 70, as shown in FIG. 27(c).

The lead frame 70 with the reflecting resin 23 formed therein is removed from the mold 35. A resin-containing lead frame is thus obtained, as shown in FIG. 27(d). In this way, the present embodiment also provides a resin-containing lead frame 90 that includes the lead frame 10 and the reflecting resin 23 disposed on edges of each package region 14 in the lead frame 10.

Next as shown in FIG. 28(a), an LED element 21 is mounted on the die pad 25 of the lead frame 70, in each reflecting resin 23 of the resin-containing lead frame 90.

Next as shown in FIG. 28(b), the LED element 21 and the lead section 26 are electrically interconnected at a terminal section 21a of the former and an upper surface of the latter via a bonding wire 22.

After this, the recess 23a in the reflecting resin 23 is filled with a sealing resin 24, whereby the LED element 21 and the bonding wire 22 are then sealed with the sealing resin 24. This state is shown in FIG. 28(c).

Next as shown in FIG. 28(d), the reflecting resin 23 and the lead frame 70 are separated for each LED element 21 by cutting those sections of the dicing region 15 that correspond to the reflecting resin 23 and the lead frame 70. At this time, the lead frame 10 is first rested on and fixed to a dicing tape 37, and then each reinforcement piece 57, lead connecting portion 52, die pad connecting portion 53, and package region connecting portion 54 of the lead frame 70, in addition to the reflecting resin 23 between the LED elements 21, are cut using, for example, a blade 38 made of a diamond grinding wheel or the like.

During the cutting step, as shown in FIG. 29(a), the lead frame 70 may be cut using a relatively thick blade 38 appropriate for particular width of the dicing region 15. More specifically, the reinforcement piece 57 of the lead frame 70 and the lead connecting portion 52 and die pad connecting portion 53 positioned around the reinforcement piece 57 may be collectively cut by moving the blade 38 along the reinforcement piece 57. In this case, adjacent package regions 14 can be efficiently separated from each other in one cutting operation.

As an alternative, the lead frame 70 may be cut in two cutting operations using a relatively thin blade 38 narrower than the width of the dicing region 15, as shown in FIG. 29(b). More specifically, the reinforcement piece 57 of the lead frame 70 may be cut indirectly and only the lead connecting portions 52 and die pad connecting portions 53 positioned around the reinforcement piece 57 may be cut directly, by moving the blade 38 in parallel with respect to the reinforcement piece 57. In this case, the blade 38 can be increased in feed rate per cutting operation and extended in life.

In this way, the semiconductor device 80 shown in FIGS. 24 and 25 can be obtained. FIG. 28(e) shows the thus-fabricated state of the semiconductor device 80.

As described above, in accordance with the present embodiment, one die pad connecting portion 53 and one lead connecting portion 52 are connected to each other by the reinforcement piece 57 positioned in one dicing region 15. In addition, the die pad 25 in one package region 14 is connected to the lead section 26 in another package region 14 adjacent to that package region 14, by a package region connecting portion 54. These structural features and characteristics prevent an elongated space from occurring in a vertical direction of the lead frame 70, and hence prevent the lead frame 70 from being formed into a vertically slit blind/screen or interdigitated shape, and from becoming deformed during handling.

Furthermore, the lead section 26 in one package region 14 is connected to the lead section 26 in another package region 14 adjacent to that package region 14, by a lead connecting portion 52, and the die pad 25 in one package region 14 is connected to the die pad 25 in another package region 14 adjacent to that package region 14, by a die pad connecting portion 53. These structural features and characteristics prevent an elongated space from occurring in a horizontal direction of the lead frame 70, and hence prevent the lead frame 70 from being formed into a horizontally slit blind/screen or interdigitated shape, and from becoming deformed during handling.

The deformation of the lead frame 70 is thus prevented, so when the reflecting resin 23 is formed in the lead frame 70 as shown in FIGS. 27(b) and 27(c), a forming position of the reflecting resin 23 with respect to the lead frame 70 does not shift. It is therefore easy to mount a large-area LED element 21 in a small package region 14, to mount a plurality of LED elements 21, or to mount an antistatic protection element in addition to an LED element 21.

Additionally, since the present embodiment makes it unnecessary to provide tie bars of a matrix format around any package regions 14, package regions 14 can be arranged in proximity to one another, and hence the number of package regions 14 in one lead frame 70 can be increased by higher-density mounting.

Furthermore, since a connecting bar such as a hanging lead is absent at any corners of a package region 14 in the present embodiment, peeling of the reflecting resin 23 from the lead frame 70, at corners of the semiconductor device 80, is unlikely and thus, reliability of the semiconductor device 80 improves.

Modifications of the Lead Frame

Hereunder, various examples of modification, as modifications 2-1 to 2-6, of the lead frame according to the present embodiment are described referring to FIGS. 30 to 35. FIGS. 30 to 35 are partly enlarged plan views showing the modifications of the lead frame, the plan views each corresponding to FIG. 2. In FIGS. 30 to 35, the same elements as those shown in FIGS. 21 to 29 are each assigned the same reference number or symbol, and detailed description of these elements is omitted herein.

Modification 2-1

Figure 30:
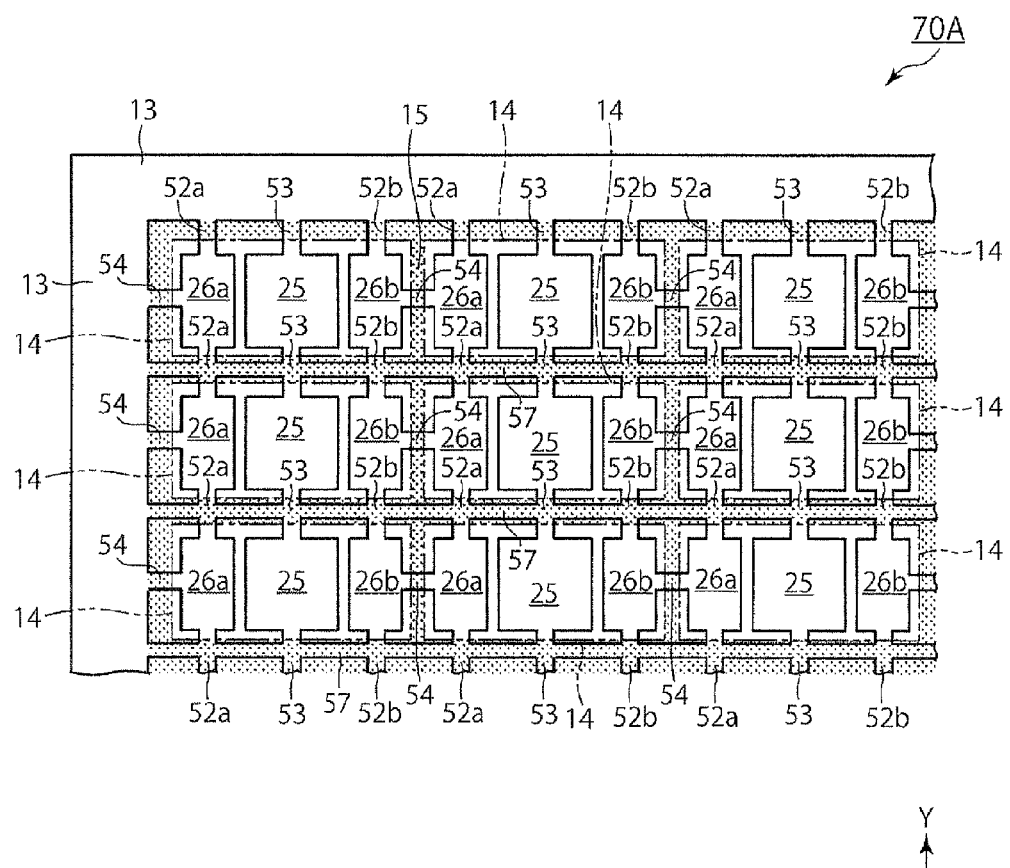
FIG. 30 is a partly enlarged plan view that shows modification 2-1, an example of modification, of the lead frame according to the second embodiment of the present invention.

FIG. 30 shows a lead frame 70A according to one modification (modification 2-1) of the present embodiment. Unlike those of the embodiment shown in FIGS. 21 to 29, package regions 14 in the lead frame 70A shown in FIG. 30, each include one die pad 25 and one pair of lead sections positioned across the die pad 25, namely 26a and 26b (hereinafter, these lead sections are also referred to as first lead section 26a and second lead section 26b; and this kind of lead frame is called a three-pin type).

In this case, the first lead section 26a in one package region 14 and the first lead sections 26a in other package regions 14 upward and downward adjacent to that package region 14 are interconnected across dicing regions 15 by respective first lead connecting portions 52a. The second lead section 26b in one package region 14 and the second lead sections 26b in other package regions 14 upward and downward adjacent to that package region 14 are also interconnected across dicing regions 15 by respective second lead connecting portions 52b.

Additionally, the die pad 25 in one package region 14 and the die pads 25 in other package regions 14 upward and downward adjacent to that package region 14 are interconnected across dicing regions 15 by respective die pad connecting portions 53. Furthermore, one die pad connecting portion 53, one first lead connecting portion 52a, and one second lead connecting portion 52b are connected to each other by a reinforcement piece 57 positioned in a dicing region 15. In this case, the reinforcement piece 57 extends rectilinearly over entire inside length of the frame body region 13 and connects a plurality of die pad connecting portions 53, a plurality of first lead connecting portions 52a and a plurality of second lead connecting portions 52b.

Furthermore, the second lead section 26b in one package region 14 is connected to the first lead section 26a in another package region 14 rightward adjacent to that package region, by a package region connecting portion 54. Moreover, the first lead section 26a in one package region 14 is connected to the second lead section 26b in another package regions 14 leftward adjacent to the particular package region 14, by a package region connecting portion 54.

Even when each package region 14 thus includes a die pad 25 and one pair of lead sections, 26a and 26b, the provision of reinforcement pieces 57 prevents an elongated space from occurring in a vertical direction of the lead frame 70A, and hence prevents the lead frame 70A from being formed into a vertically slit blind/screen or interdigitated shape, and from becoming deformed during handling.

Modification 2-2

Figure 31:
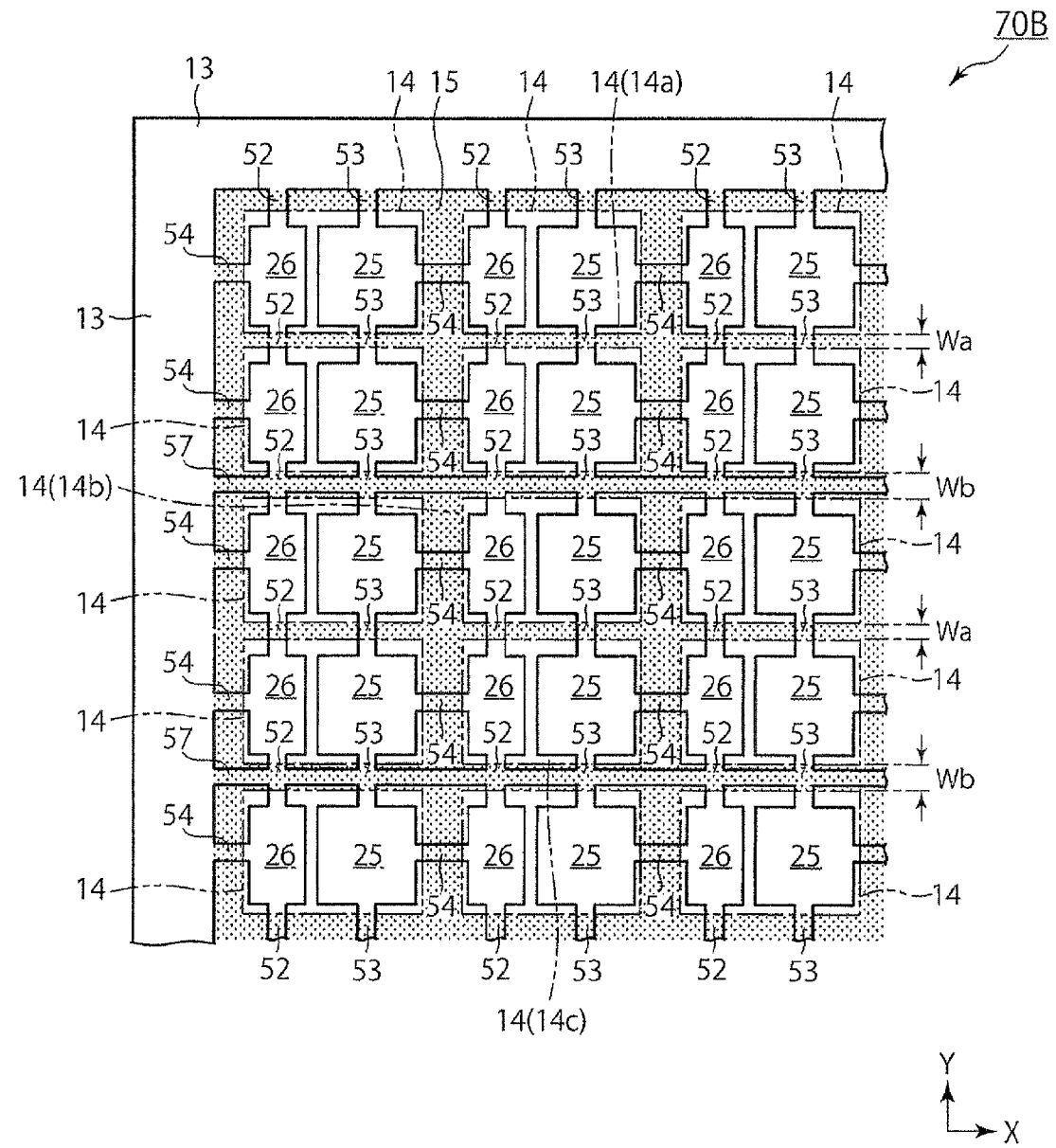
FIG. 31 is a partly enlarged plan view that shows modification 2-2, another example of modification, of the lead frame according to the second embodiment of the present invention.

FIG. 31 shows a lead frame 70B according to another modification (modification 2-2) of the present embodiment. The lead frame 70B shown in FIG. 31 differs from the embodiment of FIGS. 21 to 29 at least in that of a plurality of dicing regions 15 extending in a lateral direction, those with a reinforcement piece 57, and those without a reinforcement piece 57 are arranged at alternate positions in a longitudinal direction.

That is to say, let a package region 14(14a) upward adjacent to a package region 14(14b) in FIG. 31 be a first package region 14a, and let a package region 14(14c) downward adjacent to the package region 14(14b) be a second package region 14c.

In this case, a die pad connecting portion 53 that connects the die pad 25 in the package region 14b and that of the first package region 14a, and a lead connecting portion 52 that connects the lead section 26 in the package region 14b and that of the first package region 14a are both connected to each other by a reinforcement piece 57 positioned on a dicing region 15. On the other hand, neither a die pad connecting portion 53 that connects the die pad 25 in the package region 14b and that of the second package region 14c, nor a lead connecting portion 52 that connects the lead section 26 in the package region 14b and that of the second package region 14c are connected to each other by a reinforcement piece 57.

Reducing the number of reinforcement pieces 57 in this way allows a dicing load upon a blade 38 to be alleviated. Other structural features and characteristics are substantially the same as those of the embodiment shown in FIGS. 21 to 29.

Among the plurality of dicing regions 15 that extend in the lateral direction, those without a reinforcement piece 57 are preferably narrowed to width ($W_a$) smaller than width ($W_b$) of the dicing regions each having a reinforcement piece 57, that is, $W_a < W_b$ is preferable. In this case, the number of package regions 14 in one lead frame 70 can be increased. In addition, to cut dicing regions 15 using a relatively thin blade 38, as in FIG. 29(b), the number of cutting operations can be reduced since the dicing regions 15 without a reinforcement piece 57 can each be cut in one cutting operation.

Modification 2-3

Figure 32:
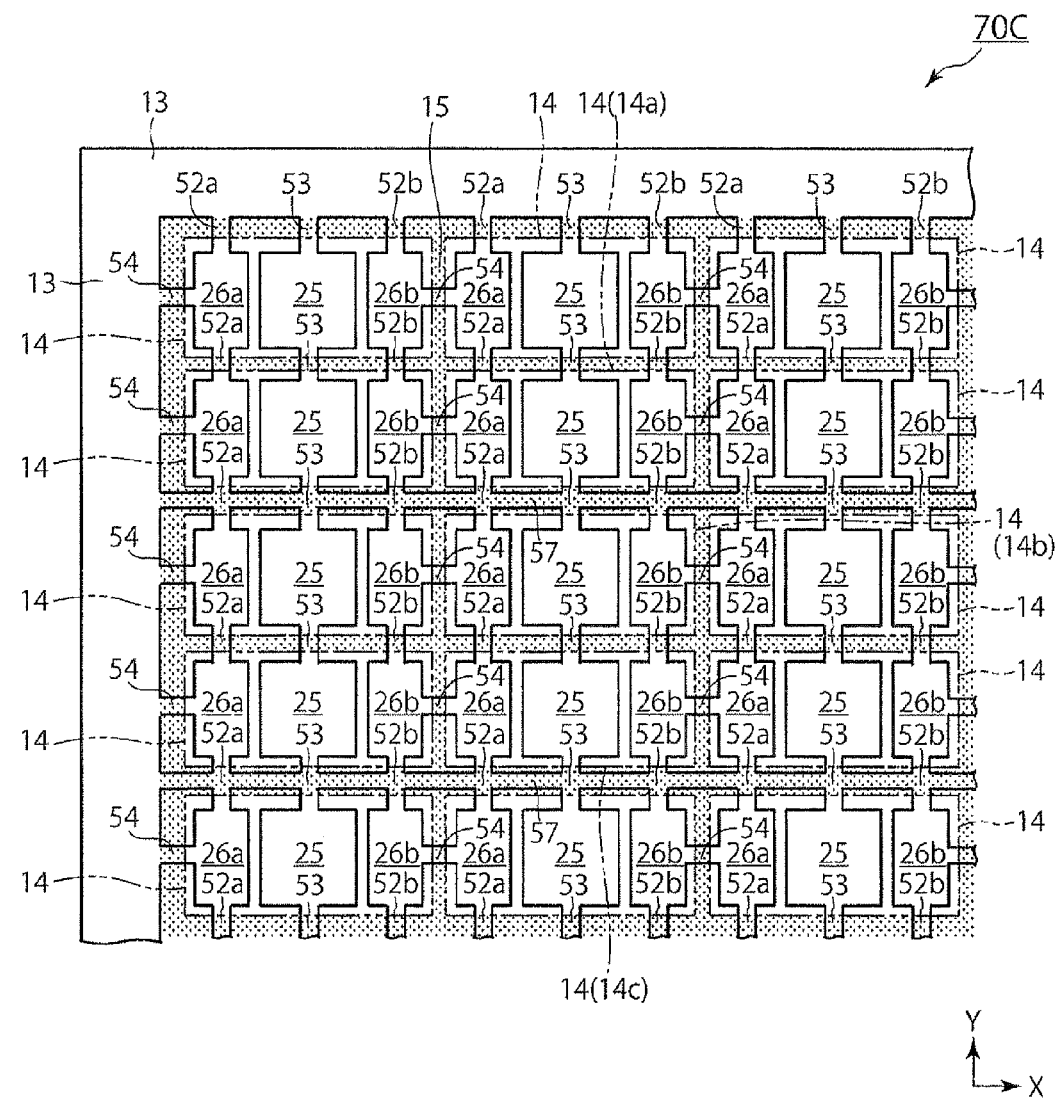
FIG. 32 is a partly enlarged plan view that shows modification 2-3, yet another example of modification, of the lead frame according to the second embodiment of the present invention.

FIG. 32 shows a lead frame 70C according to yet another modification (modification 2-3) of the present embodiment. The lead frame 70C shown in FIG. 32 is a combination of modification 2-1 shown in FIG. 30 and modification 2-2 shown in FIG. 31.

Package regions 14 in FIG. 32 each include one die pad 25 and one pair of lead sections positioned across the die pad 25, namely 26a and 26b (hereinafter, these lead sections are also referred to as first lead section 26a and second lead section 26b; and this kind of lead frame is called a three-pin type).

Among a plurality of dicing regions 15 extending in a lateral direction in FIG. 32, those with a reinforcement piece 57, and those without a reinforcement piece 57 exist at alternate positions in a longitudinal direction.

In other words, in FIG. 32, a die pad connecting portion 53 that connects the die pad 25 in one package region 14(14b) and that of a second package region 14(14b) upward adjacent to the particular package region 14(14b), a first lead connecting portion 52a that connects the lead section 26a in the package region 14(14b) and that of the second package region 14(14a), and a second lead connecting portion 52b that connects the lead section 26b in the package region 14(14b) and that of the second package region 14(14b) are connected to each other by a reinforcement piece 57 positioned on a dicing region 15.

On the other hand, neither a die pad connecting portion 53 that connects the die pad 25 in one package region 14(14b) and that of a second package region 14(14c) downward adjacent to the particular package region 14(14b), a first lead connecting portion 52a that connects the lead section 26a in the package region 14(14b) and that of the second package region 14(14c) downward adjacent to the particular package region 14(14b), nor a second lead connecting portion 52b that connects the lead section 26b in the package region 14(14b) and that of the second package region 14(14c) downward adjacent to the particular package region 14(14b) are connected to each other by a reinforcement piece 57.

Other structural features and characteristics are substantially the same as those of modifications 2-1 and 2-2 shown in FIGS. 30 and 31, respectively.

Modification 2-4

Figure 33:
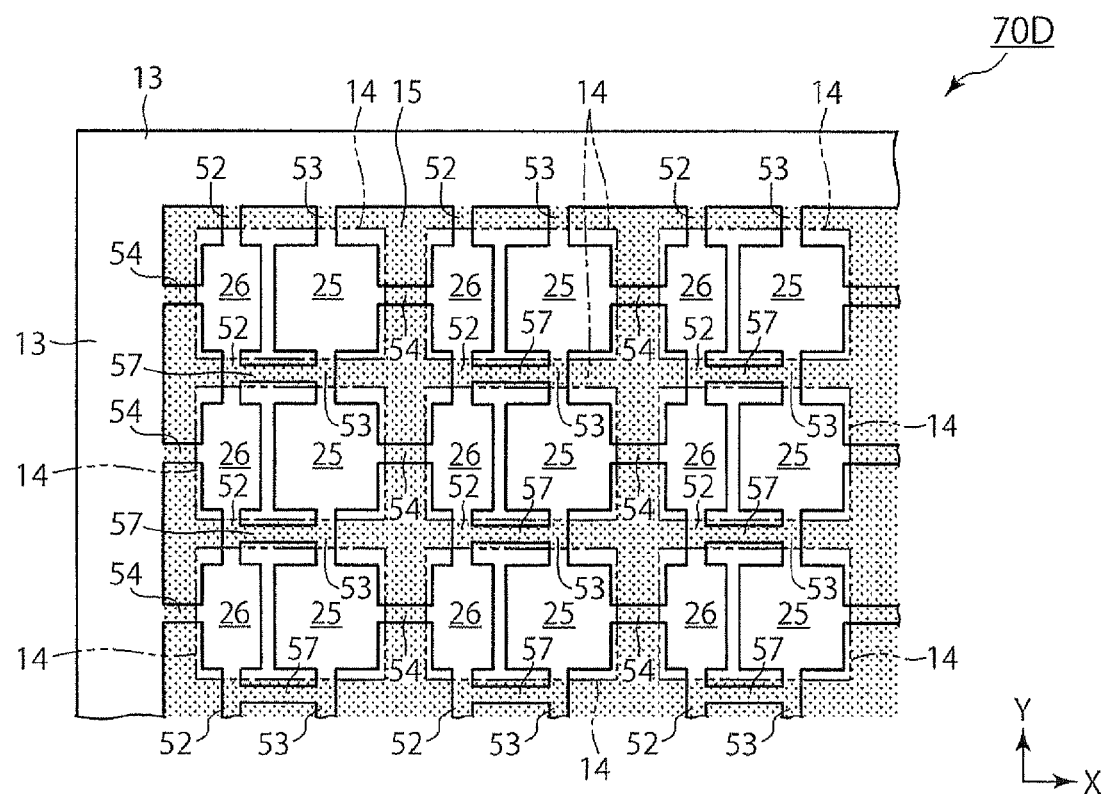
FIG. 33 is a partly enlarged plan view that shows modification 2-4, a further example of modification, of the lead frame according to the second embodiment of the present invention.

FIG. 33 shows a lead frame 70D according to a further modification (modification 2-4) of the present embodiment. Unlike those of the embodiment shown in FIGS. 21 to 29, reinforcement pieces 57 of the lead frame 70D shown in FIG. 33, each extend only between the die pad connecting portion 53 and lead connecting portion 52 connected to the die pad 25 and lead section 26, respectively, in each package region 14, and connect the die pad connecting portion 53 and the lead connecting portion 52.

In other words, the die pad 25 and lead section 26 in one package region 14 are connected to the die pad 25 and lead section 26 in another package region 14 upward (or downward) adjacent to that package region 14, by a die pad connecting portion 53 and a lead connecting portion 52, respectively. In this case, a reinforcement piece 57 extends only between the lead connecting portion 52 and the die pad connecting portion 53, and connects both thereof. The reinforcement piece 57, on the other hand, does not extend to a left edge of the lead connecting portion 52 or a right edge of the die pad connecting portion 53.

Reducing overall length of the reinforcement piece 57 in one dicing region 15 in this way allows a dicing load upon a blade 38 to be alleviated. Other structural features and characteristics are substantially the same as those of the embodiment shown in FIGS. 21 to 29.

Modification 2-5

Figure 34:
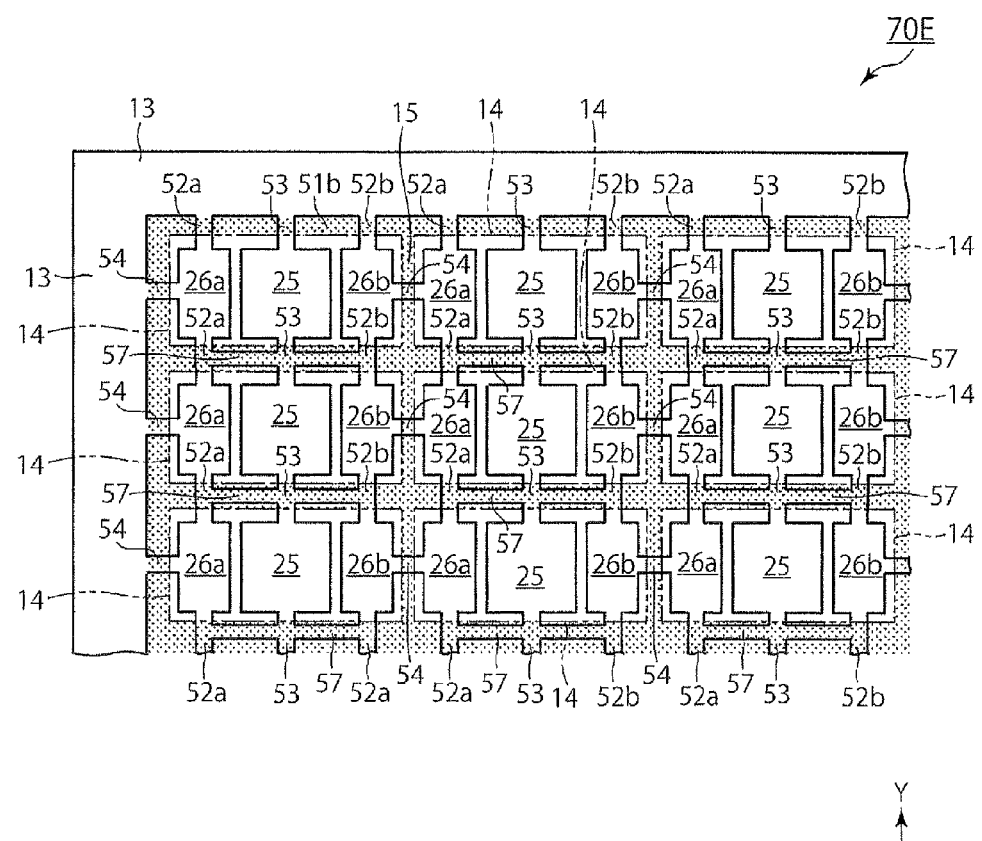
FIG. 34 is a partly enlarged plan view that shows modification 2-5, a further example of modification, of the lead frame according to the second embodiment of the present invention.

FIG. 34 shows a lead frame 70E according to a further modification (modification 2-5) of the present embodiment. The lead frame 70E shown in FIG. 34 is a combination of modification 2-1 shown in FIG. 30 and modification 2-4 shown in FIG. 33.

Package regions 14 in FIG. 34 each include one die pad 25 and one pair of lead sections positioned across the die pad 25, namely 26a and 26b (hereinafter, these lead sections are also referred to as first lead section 26a and second lead section 26b; and this kind of lead frame is called a three-pin type).

Referring also to FIG. 34, reinforcement pieces 57 each extend only between the first lead connecting portion 52a, die pad connecting portion 53, and second lead connecting portion 52b connected to the die pad 25 and lead sections 26a, 26b, respectively, in each package region 14, and connect the first lead connecting portion 52a, the die pad connecting portion 53, and the second lead connecting portion 52b.

Reducing overall length of the reinforcement piece 57 in one dicing region 15 in this way allows a dicing load upon a blade 38 to be alleviated. Other structural features and characteristics are substantially the same as those of modifications 2-1 and 2-4 shown in FIGS. 30 and 33, respectively.

Modification 2-6

Figure 35:
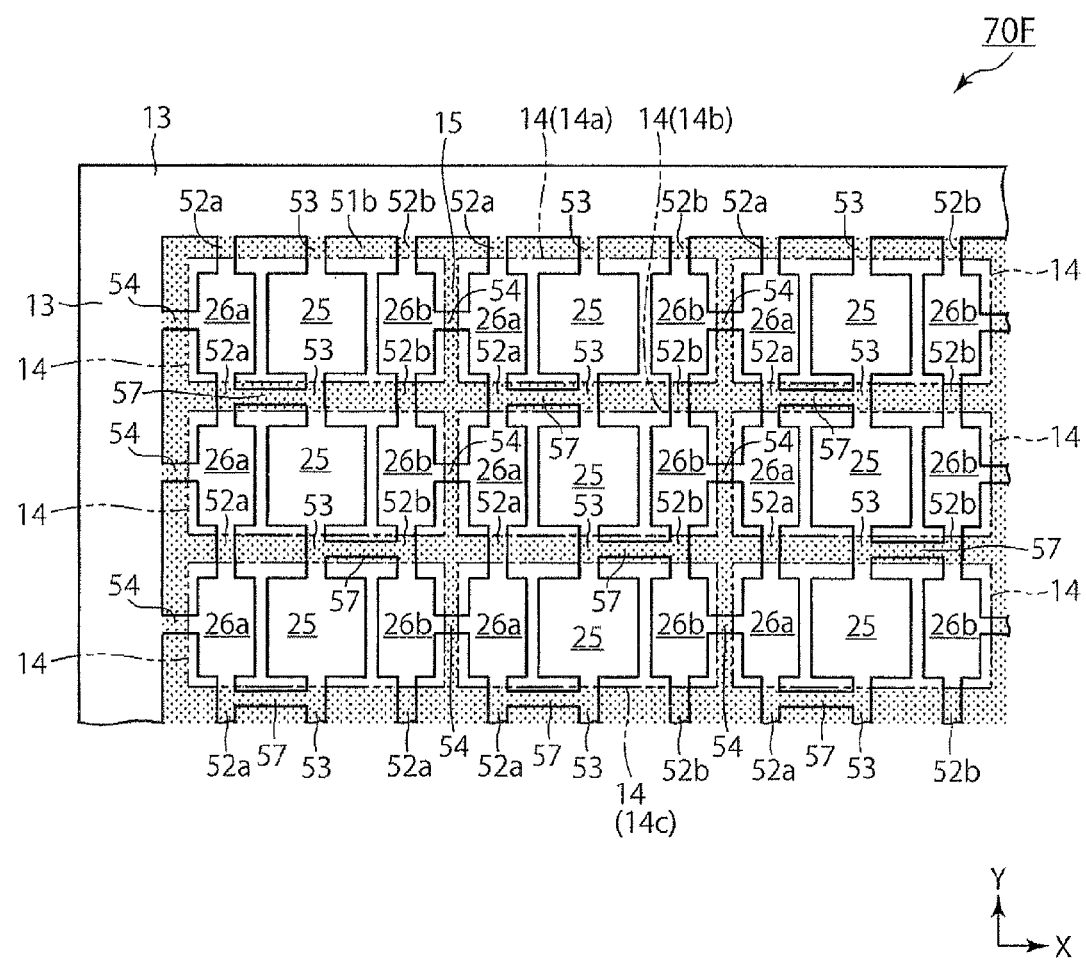
FIG. 35 is a partly enlarged plan view that shows modification 2-6, a further example of modification, of the lead frame according to the second embodiment of the present invention.

FIG. 35 shows a lead frame 70F according to a further modification (modification 2-6) of the present embodiment. Package regions 14 in the lead frame 70F shown in FIG. 35, each include one die pad 25 and one pair of lead sections positioned across the die pad 25, namely 26a and 26b (hereinafter, these lead sections are also referred to as first lead section 26a and second lead section 26b; and this kind of lead frame is called a three-pin type).

The die pad 25, first lead section 26a, and second lead section 26b in one package region 14 are connected to the die pads 25, first lead sections 26a, and second lead sections 26b in other package regions 14 upward and downward adjacent to that package region, by a die pad connecting portion 53, a first lead connecting portion 52a, and a second lead connecting portion 52b, respectively.

As shown in FIG. 35, a reinforcement piece 57 that connects only a die pad connecting portion 53 and a first lead connecting portion 52a, and a reinforcement piece 57 that connects only a die pad connecting portion 53 and a second lead connecting portion 52b are provided at alternate positions in a longitudinal direction.

That is to say, let a package region 14(14a) upward adjacent to a package region 14(14b) in FIG. 35 be a first package region 14a, and let a package region 14(14c) downward adjacent to the package region 14(14b) be a second package region 14c.

In this case, in a dicing region 15 between the package region 14b and the first package region 14a, the reinforcement piece 57 extends only between the die pad connecting portion 53 and the first lead connecting portion 52a, and connects only the die pad connecting portion 53 and the first lead connecting portion 52a.

In a dicing region 15 between the package region 14b and the second package region 14c, on the other hand, the reinforcement piece 57 extends only between the die pad connecting portion 53 and the second lead connecting portion 52b, and connects only the die pad connecting portion 53 and the second lead connecting portion 52b.

Reducing the number of reinforcement pieces 57 in this way allows a dicing load upon a blade 38 to be alleviated. Other structural features and characteristics are substantially the same as those of modification 2-5 shown in FIG. 34.

The reinforcement pieces in the present embodiment can also be applied to other examples of a lead frame. These examples include, but are not limited to, the following. One is a four-pin type of embodiment, which includes in individual package regions 14, as with a lead frame 70G (modification 2-7) shown in FIG. 36, two die pads, 25a and 25b (hereinafter, also referred to as first die pad 25a and second die pad 25b), and one pair of lead sections, 26a and 26b (also referred to as first lead section 26a and second lead section 26b), positioned adjacently to either side of the die pads 25a, 25b. One is another four-pin type of embodiment, which includes in individual package regions 14, as with a lead frame 70H (modification 2-8) shown in FIG. 38, one die pad, 25, one pair of lead sections, 26a and 26b (hereinafter, also referred to as first lead section 26a and second lead section 26b), positioned adjacently to one side of the die pad 25, and one lead section, 26c, positioned adjacently to the other side of the die pad 25.

Problems common to these examples are the followings. Since the die pads 25 (25a, 25b) and lead sections 26 (26a, 26b, 26c) in each package region 14 are arranged linearly in one row, if arrangement of the lead connecting portions 52 and die pad connecting portions 53 that connect package regions 14 is attempted to prevent short-circuiting between the die pads 25 and the lead sections 26, then this makes it likely to form spatial gaps connected between the die pads 25 and the lead sections 26, thus causing a plurality of elongated spaces parallel to one side of the lead frame 70, and hence structurally deforming the lead frame 70. These problems, however, as already described, can be effectively solved by using the reinforcement pieces 57 of the present embodiment. In modifications 2-7 to 2-10 described below (see FIGS. 36 to 41), the same elements as in the embodiment shown in FIGS. 21 to 29 are also each assigned the same reference number or symbol, and detailed description of these elements is omitted herein.

Modification 2-7

Figure 36:
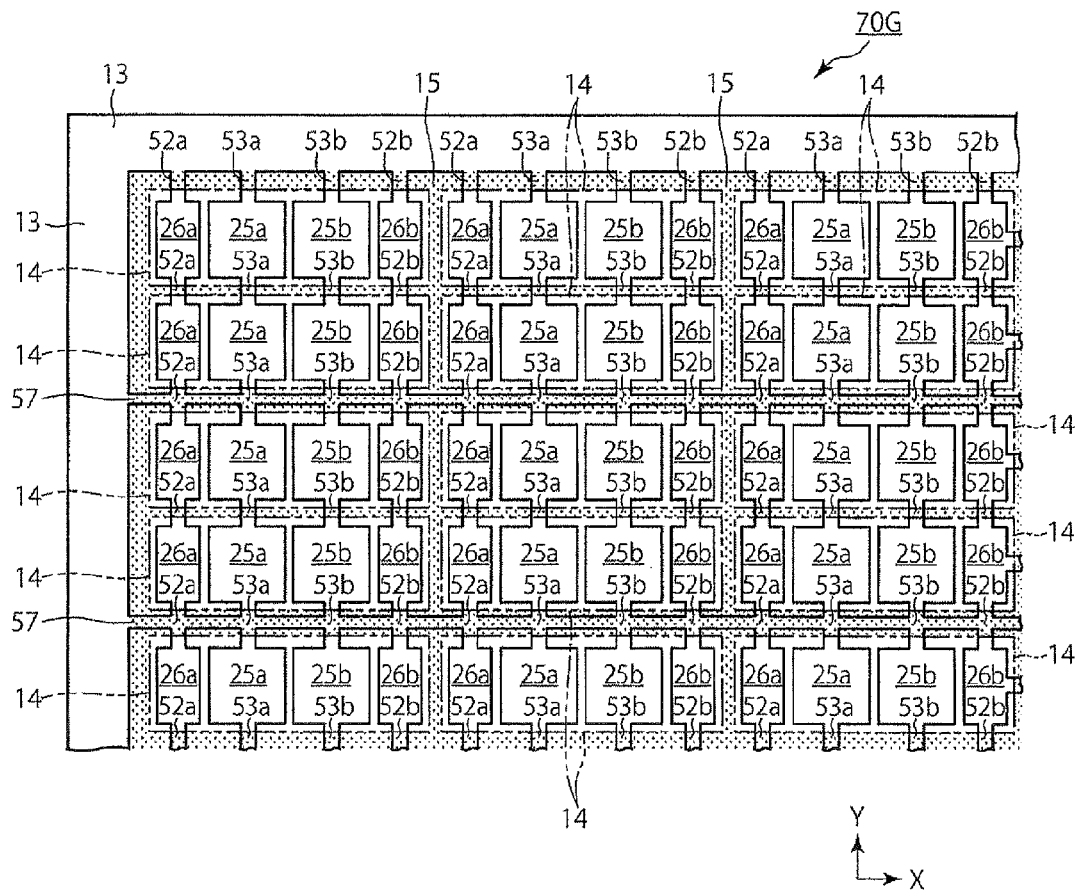
FIG. 36 is a partly enlarged plan view that shows modification 2-7, a further example of modification, of the lead frame according to the second embodiment of the present invention.
Figure 37:
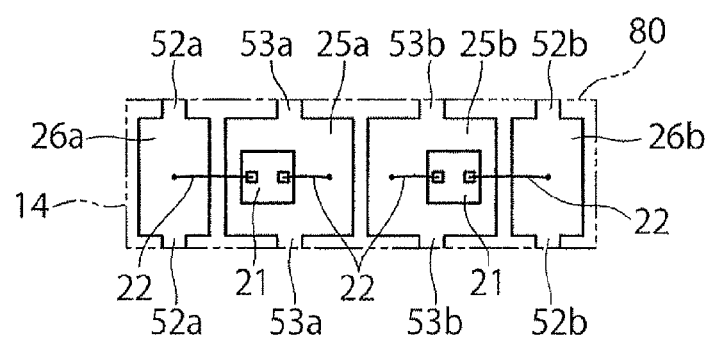
FIG. 37 is a schematic plan view showing the semiconductor device fabricated using the lead frame according to modification 2-7 (FIG. 36).

FIG. 36 shows the lead frame 70G according to modification 2-7 of the present embodiment. Unlike those of the embodiment shown in FIGS. 21 to 29, each package region 14 of the lead frame 70G shown in FIG. 36 includes two die pads, 25a and 25b (hereinafter, also referred to as first die pad 25a and second die pad 25b), and one pair of lead sections, 26a and 26b (also referred to as first lead section 26a and second lead section 26b), positioned adjacently to either side of the die pads 25a, 25b. By using such a lead frame 70G, a semiconductor device 80 in which two LED elements 21 are stored within one package can be realized, as shown in FIG. 37.

In modification 2-7, the first lead section 26a in one package region 14 and the first lead sections 26a in other package regions 14 upward and downward adjacent to that package region 14 are interconnected across dicing regions 15 by respective first lead connecting portions 52a. The second lead section 26b in one package region 14 and the second lead sections 26b in other package regions 14 upward and downward adjacent to that package region 14 are also interconnected across dicing regions 15 by respective second lead connecting portions 52b.

In addition, the first die pad 25a and second die pad 25b in one package region 14 are connected to the corresponding die pads 25a and 25b in other package regions 14 upward and downward adjacent to that package region 14, across dicing regions 15 by a first die pad connecting portion 53a and a second die pad connecting portion 53b, respectively. Furthermore, each first die pad connecting portion 53a, second die pad connecting portion 53b, first lead connecting portion 52a, and second lead connecting portion 52b are connected to each other by a reinforcement piece 57 positioned in a dicing region 15. In this case, the reinforcement piece 57 extends rectilinearly over entire inside length of the frame body region 13 and connects a plurality of first die pad connecting portions 53a, a plurality of second die pad connecting portions 53b, a plurality of first lead connecting portions 52a, and a plurality of second lead connecting portions 52b.

Among the plurality of dicing regions 15 extending in a lateral direction in the lead frame 70G shown in FIG. 36, those with a reinforcement piece 57 and those without a reinforcement piece 57 are arranged at alternate positions in a longitudinal direction.

Even when each package region 14 thus includes two die pads, 25a and 25b, and one pair of lead sections, 26a and 26b, the provision of reinforcement pieces 57 prevents an elongated space from occurring in a vertical direction of the lead frame 70G, and hence prevents the lead frame 70G from being formed into a vertically slit blind/screen or interdigitated shape, and from becoming deformed during handling. In addition, dicer tooth wear can be mitigated since the reinforcement pieces 57 exist only in part of the dicing regions 15.

Modification 2-8

Figure 38:
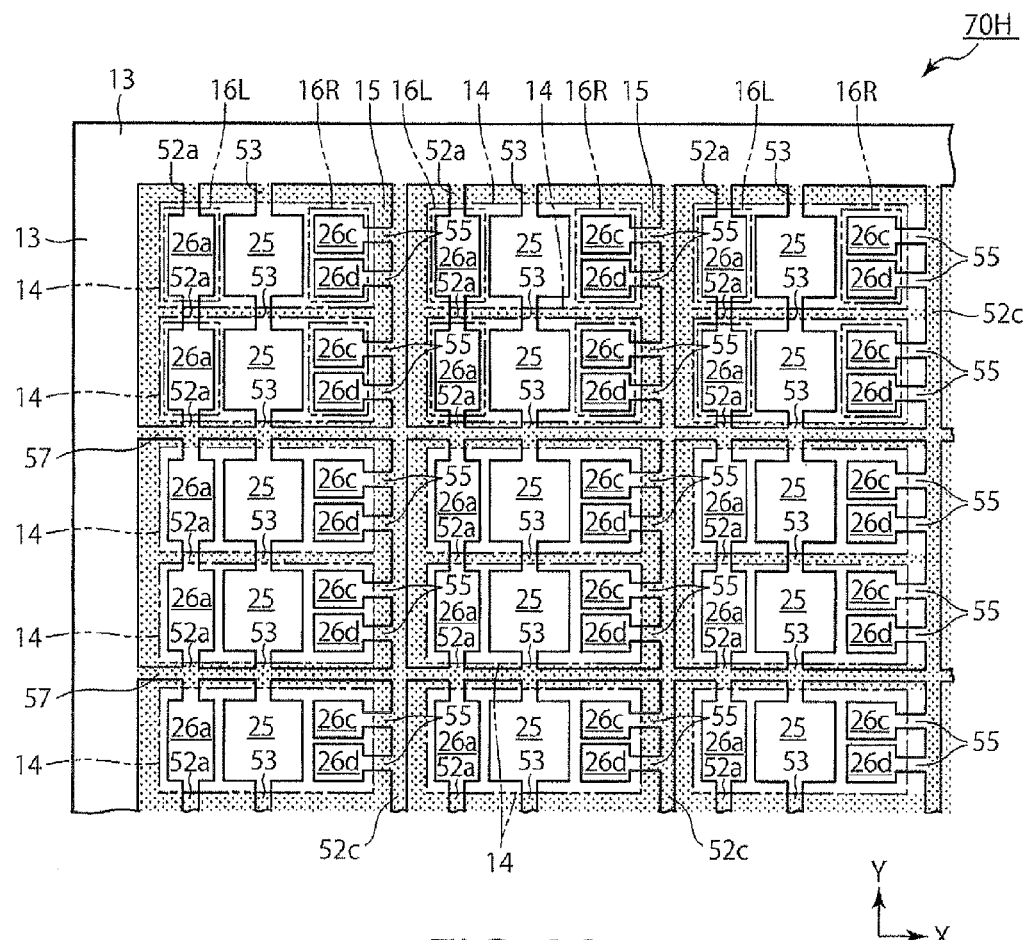
FIG. 38 is a partly enlarged plan view that shows modification 2-8, a further example of modification, of the lead frame according to the second embodiment of the present invention.
Figure 39:
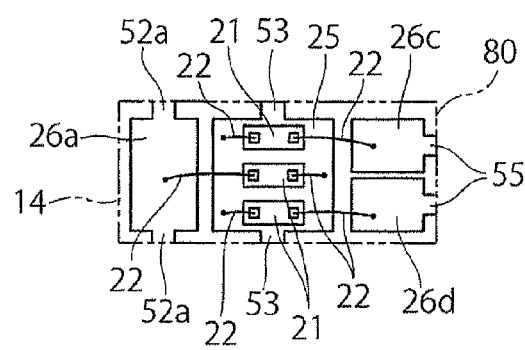
FIG. 39 is a schematic plan view showing the semiconductor device fabricated using the lead frame according to modification 2-8 (FIG. 38).

FIG. 38 shows the lead frame 70H according to modification 2-8 of the present embodiment. Each package region 14 in the lead frame 70H of FIG. 38 includes a die pad 25 and one pair of lead layout regions, 16L and 16R, positioned across the die pad 25. In the lead layout region 16L, a lead section 26a is disposed, and in the lead layout region 16R, two lead sections, 26c and 26d, are arranged in one row along the die pad 25 (hereinafter, the lead sections 26a, 26c, 26d are also referred to as first lead section 26a, second lead section 26c, and third lead section 26d). By using such a lead frame 70H, a semiconductor device 80 in which three LED elements 21 are stored within one package can be realized, as shown in FIG. 39.

Modification 2-8 differs from modification 2-1 (FIG. 30) or modification 2-3 (FIG. 32) in that the former includes the second lead sections 26c and the third lead sections 26d. In the lead frame 70H of FIG. 38, however, partial lead connecting portions 55 each for connecting one second lead section 26c and one third lead section 26c, are provided and each connects the second lead section 26c and the third lead section 26d via a second lead connecting portion 52c positioned in a dicing region 15. The second lead connecting portion 52c extends longitudinally over entire inside length of the frame body region 13, in each dicing region 15.

Between the package regions 14 in the lead frame 10H, the first lead section 26a in one package region 14 and the first lead sections 26a in package regions 14 upward and downward adjacent to that package region 14 are interconnected across dicing regions 15 by respective first lead connecting portions 52a. The second lead section 26c and third lead section 26d in one package region 14 are connected to the second lead sections 26c and third lead sections 26d, respectively, in package regions 14 upward and downward adjacent to that package region 14, across dicing regions 15 and via partial lead connecting portions 55 by second lead connecting portions 52c. As shown in this modification, when one second lead section 26c and one third lead section 26d can be handled as an integrated lead via the partial lead connecting portions 55, if the second lead section 26c and third lead section 26d to be integrally handled (i.e. the lead layout region 16R), the die pad 25, and the first lead section 26a are arranged rectilinearly in one line, using the reinforcement pieces 57 of the present invention prevents the lead frame from becoming deformed.

Among the plurality of dicing regions 15 extending in a lateral direction in the lead frame 70H of FIG. 38, those with a reinforcement piece 57 and those without a reinforcement piece 57 are arranged at alternate positions in the longitudinal direction.

Modification 2-9

Figure 40:
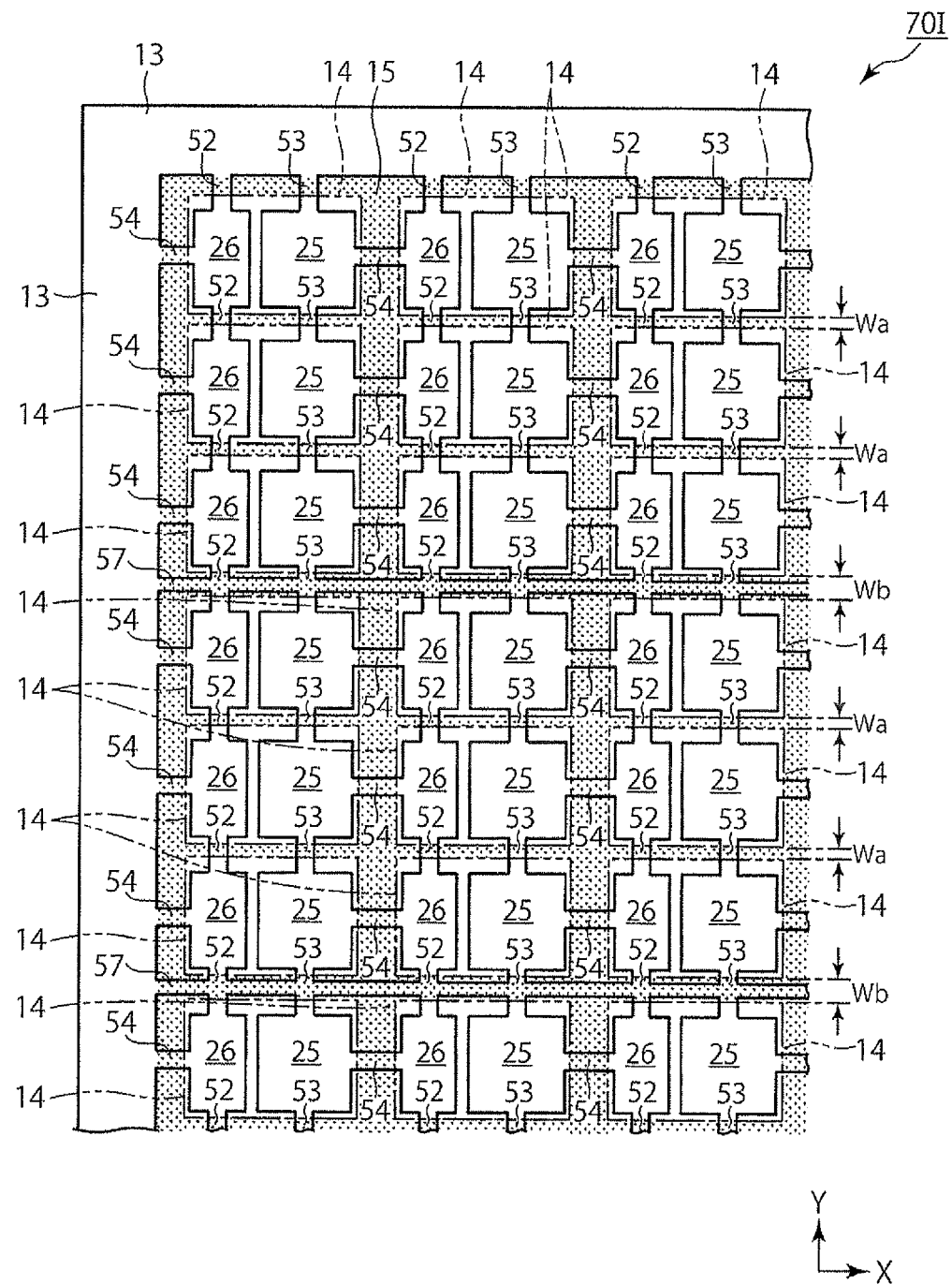
FIG. 40 is a partly enlarged plan view that shows modification 2-9, a further example of modification, of the lead frame according to the second embodiment of the present invention.

FIG. 40 shows a lead frame 70I according to modification 2-9 of the present embodiment. The lead frame 70I shown in FIG. 40 differs from modification 2-2 of FIG. 31 at least in that of a plurality of dicing regions 15 extending in a lateral direction, those each having a reinforcement piece 57 are cyclically provided at a predetermined number of dicing regions in a longitudinal direction. While dicing regions, each having a reinforcement piece 57, are provided every three positions in FIG. 40, the layout of the dicing regions is not limited to this rate and they may be provided at intervals of every four or five positions, for example.

Reducing the number of reinforcement pieces 57 in this way allows a dicing load upon a blade 38 to be alleviated. Other structural features and characteristics are substantially the same as those of modification 2 shown in FIG. 31.

Modification 2-10

Figure 41:
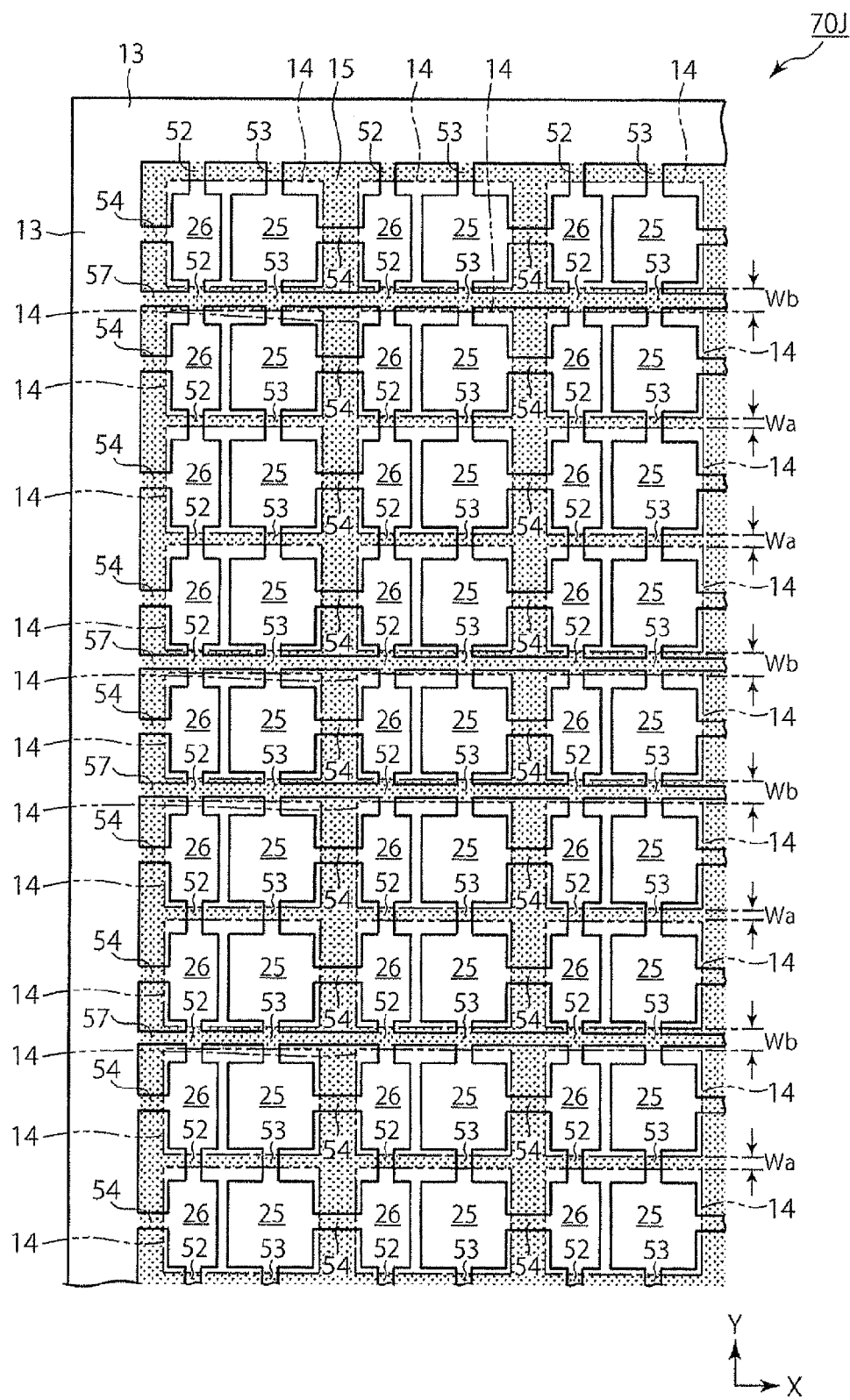
FIG. 41 is a partly enlarged plan view that shows modification 2-10, a further example of modification, of the lead frame according to the second embodiment of the present invention.

FIG. 41 shows a lead frame 70J according to modification 2-10 of the present embodiment. The lead frame 70J shown in FIG. 41 differs from modification 2-9 of FIG. 40 at least in that of all dicing regions 15 extending in a lateral direction, those each provided with a reinforcement piece 57 are formed irregularly, not at fixed intervals, in a longitudinal direction.

In this case, reducing the number of reinforcement pieces 57 also allows a dicing load upon a blade 38 to be alleviated. Other structural features and characteristics are substantially the same as those of modification 2-2 shown in FIG. 31.

For the above reasons, the lead frames according to modifications 2-1 to 2-10 shown in FIGS. 30 to 41, respectively, yield substantially the same advantageous effects as those of the embodiment shown in FIGS. 21 to 29.

The type of semiconductor device fabricated using any one of the lead frames 70, 70B, 70D, 70I, and 70J shown in FIGS. 21 to 23, 31, 33, 40, and 41, respectively, is not limited to that shown in FIGS. 24 and 25, and the semiconductor device may be that shown as modification B in FIG. 19, or as modification C in FIG. 20. In addition, the semiconductor device fabricated using any one of the lead frames 70A, 70C, 70E, and 70F shown in FIGS. 30, 32, 34, and 35, respectively, may be that shown as modification A in FIG. 18.

Third Embodiment

Figure 42:
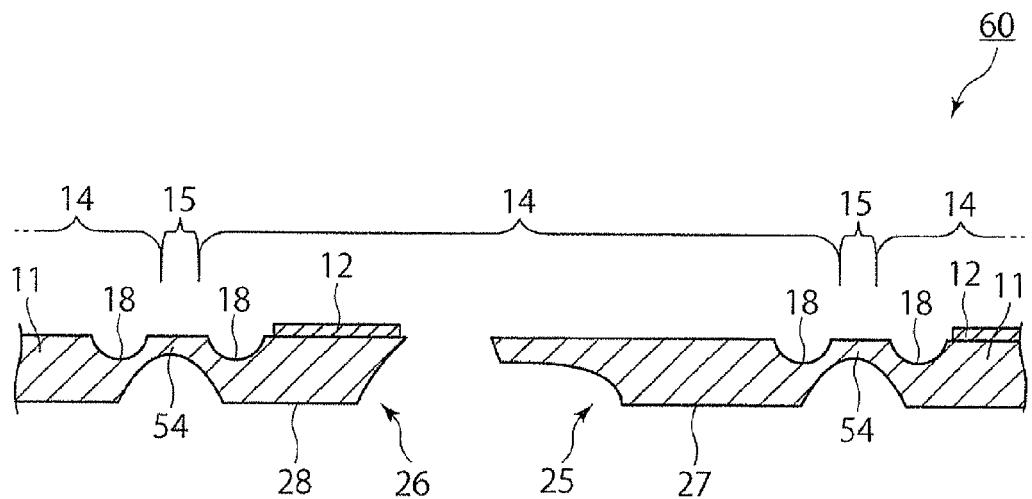
FIG. 42 is a sectional view of a lead frame according to a third embodiment of the present invention.
Figure 43:
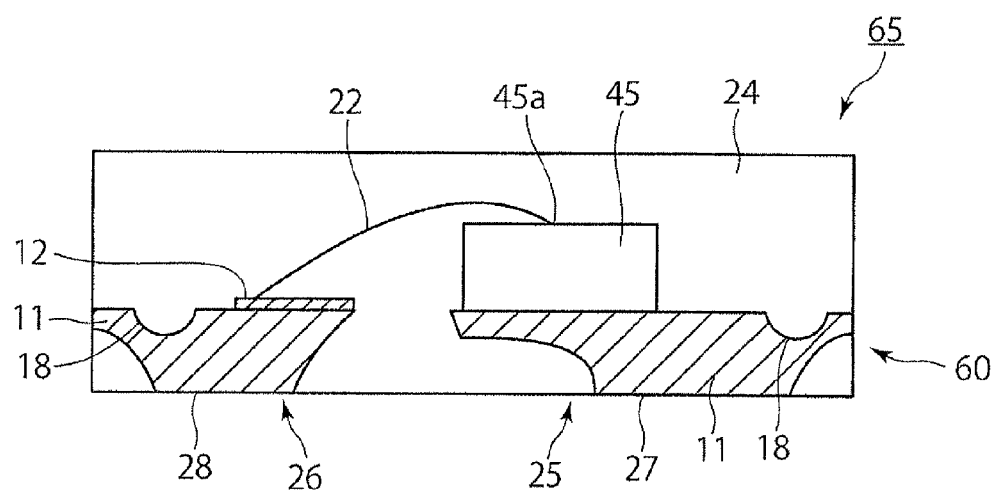
FIG. 43 is a sectional view showing a semiconductor device fabricated using the lead frame according to the third embodiment of the present invention.
Figure 44:
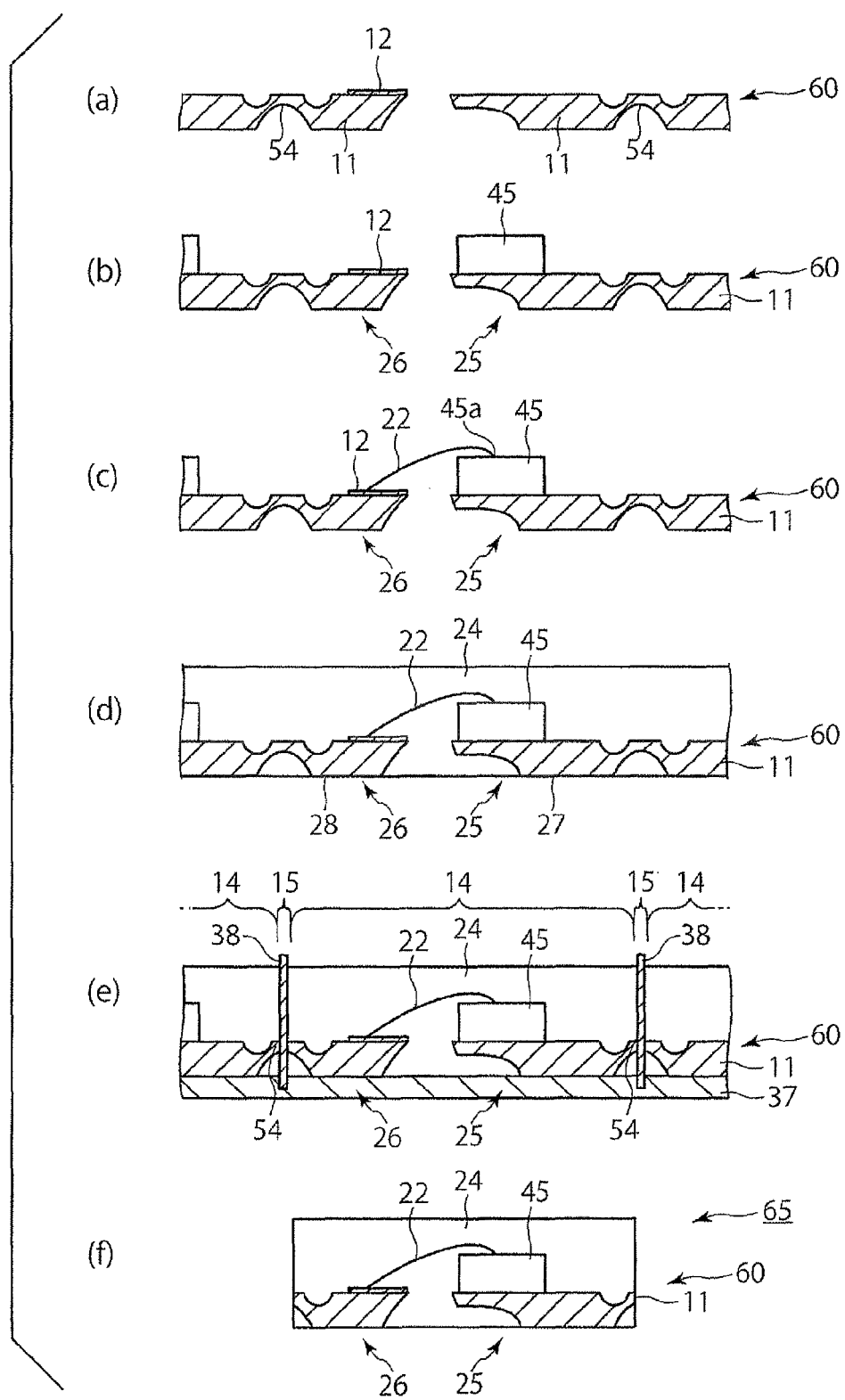
FIG. 44 is a sectional view that shows steps for manufacturing the semiconductor device using the lead frame according to the third embodiment of the present invention.

Next, a third embodiment of the present invention is described below referring to FIGS. 42 to 44. FIGS. 42 to 44 show the third embodiment of the present invention. The third embodiment shown in FIGS. 42 to 44 differs from the foregoing first and second embodiments primarily in that the LED elements 21 in the foregoing embodiments are replaced by semiconductor elements 45 such as diodes, and other structural features and characteristics are substantially the same as in the first and second embodiments. In FIGS. 42 to 44, the same elements as those of the first and second embodiments are each assigned the same reference number or symbol, and detailed description of these elements is omitted herein.

Lead Frame Configuration

FIG. 42 is a sectional view of a lead frame 60 according to the present embodiment. The lead frame 60 according to the present embodiment is for mounting diodes or other semiconductor elements 45 (see FIG. 42) instead of LED elements 21, and includes a plated layer 12 formed only on part of lead sections 26, this part being where a bonding wire 22 is connected. Other configurational features and characteristics are the same as those of the embodiment shown in FIGS. 1 to 3, or of the embodiment shown in FIGS. 21 to 23.

A planar shape of the lead frame 60 in the present embodiment is not limited to the shape of the lead frame 10 shown in FIGS. 1 to 3, or to the shape of the lead frame 70 shown in FIGS. 21 to 23; the lead frame 60 may have the shape of any one of the lead frames shown in FIGS. 10 to 17, or to the shape of any one of the lead frames shown in FIGS. 30 to 41.

Semiconductor Device Configuration

FIG. 43 shows a semiconductor device 65 according to the present embodiment. The semiconductor device 65, fabricated using the lead frame 60 shown in FIG. 42, includes the (singulated) lead frame 60 and a semiconductor element 45 rested on a die pad 25 of the lead frame 60. The semiconductor element 45 may include a discrete semiconductor element such as a diode. The semiconductor element 45 also includes a terminal section 45a, which is electrically connected to a plated layer 12 provided on a lead section 26, by a bonding wire 22. Additionally, the semiconductor element 45 and the bonding wire 22 are sealed with a sealing resin 24.

The sealing resin 24 can be that formed from an epoxy resin or a silicone resin. This sealing resin, however, unlike that of the first embodiment or the second embodiment, does not always need to be transparent and can include an opaque resin of black, for example.

Method of Manufacturing the Semiconductor Device

Next, a method of manufacturing the semiconductor device 65 shown in FIG. 43 is described below using FIGS. 44(a) to 44(f). FIGS. 44(a) to 44(f) show the method of manufacturing the semiconductor device according to the present embodiment.

First, the lead frame 60 is fabricated as in the steps of FIGS. 6(a) to 6(f) and FIGS. 26(a) to 26(f). FIG. 44(a) shows the thus-fabricated lead frame 60. In the step of forming the plated layer 12, that is, in FIG. 6(f) or 26(f), the plated layer 12 is formed only on part of a lead section 26, not over an entire surface of a lead frame body 11.

Next, the semiconductor element 45 is mounted on a die pad 25 of the lead frame 60. In this case, the semiconductor element 45 is rested on and fixed to the die pad 25 by use of solder or a die-bonding paste, as shown in FIG. 44(b).

Next, the terminal section 45a of the semiconductor element 45 and the plated layer 12 on the lead section 26 are electrically connected to each other via the bonding wire 22, as shown in FIG. 44(c).

After this, the semiconductor element 45 and the bonding wire 22 are simultaneously sealed together using the sealing resin 24, as shown in FIG. 44(d). At this time, a backing tape not shown may be attached to a lower surface of the lead frame 60 to prevent the sealing resin 24 from hanging down over a first outer lead section 27 and/or a second outer lead section 28.

Next as shown in FIG. 44(e), the sealing resin 24 and the lead frame 60 are separated for each semiconductor element 45 by cutting those sections of a dicing region 15 that correspond to the sealing resin 24 and the lead frame 60. At this time, the lead frame 60 is first rested on and fixed to a dicing tape 37, and then inclined reinforcement pieces 51 (or reinforcement pieces 57), lead connecting portions 52, die pad connecting portions 53, and package region connecting portions 54 of the lead frame 60, in addition to the sealing resin 24 between the semiconductor elements 45, are cut using, for example, a blade 38 made of a diamond grinding wheel or the like. Lead frame cutting with the blade 38 may use the method shown in FIGS. 9(*a*), 9(*b*) or FIGS. 29(*a*), 29(*b*).

The semiconductor device 65 shown in FIG. 43 is thus obtained. FIG. 44(*e*) shows the lead frame being cut.

As described above, in the present embodiment, the semiconductor element 45 such as a diode is rested instead of an LED element 21, and a reflecting resin 23 is not provided on the lead frame 60. In this case, in the process for manufacturing the semiconductor device 65 (FIGS. 44(*a*) to 44(*f*)), since a reflecting resin 23 to be used to strengthen the lead frame 60 is absent during the manufacturing process, a need arises to prevent deformation of the lead frame 60 shown in FIG. 44(*e*), at least until sealing with the sealing resin 24 has been conducted. More specifically, when the semiconductor element 45 is mounted, the lead frame 60 is, in some case, conveyed via its edge along a rail, at which time the need arises to prevent the deformation of the lead frame 60. Additionally, since bonding of the semiconductor element 45 by eutectic bonding involves lead frame heating (e.g., for 10 minutes at 400° C.), it is necessary to prevent reduction in strength of the lead frame 60 due to the heat. Furthermore, since heat and impacts are also applied during wire bonding, reduction in strength of the lead frame 60 due to this heat also needs to be prevented. The strength of the lead frame 60 is therefore required to be enhanced relative to that obtained if the lead frame includes a reflecting resin 23.

In accordance with the present embodiment, on the other hand, the die pad 25 in one package region 14 and the lead section 26 in another package region 14 adjacent to that package region are connected to each other by an inclined reinforcement piece 51 positioned in a dicing region 15. Alternatively, a die pad connecting portion 53 and a lead connecting portion 52 are connected to each other by a reinforcement piece 57 positioned in the dicing region 15. These reinforcement pieces prevent an elongated space from occurring in a vertical direction of the lead frame 60, and hence prevent the lead frame 60 from being formed into a vertically slit blind/screen or interdigitated shape, and from becoming deformed during handling.

Besides the above, the present embodiment also yields substantially the same operational effects as those of the first and second embodiments.

The invention claimed is:

1. A lead frame for mounting LED elements, comprising:
a frame body region; and
a large number of package regions arranged in multiple rows and columns in the frame body region, the package regions each including a die pad on which an LED element is to be mounted and a lead section adjacent to the die pad, via a spatial gap, the lead section being formed from the same material as the die pad and being designed to be electrically-connected to the LED element;
wherein the die pad in one package region and the lead section in another package region adjacent to the package region of interest are connected to each other by an inclined reinforcement piece.

2. The lead frame according to claim 1, wherein the inclined reinforcement piece is arranged so as to bridge across the package regions adjacent to each other.

3. The lead frame according to claim 1, wherein the lead section in one package region is connected to the lead section in another package region adjacent to the package region of interest, by a lead connecting portion.

4. The lead frame according to claim 1, wherein the die pad in one package region is connected to the die pad in another package region adjacent to the package region of interest, by a die pad connecting portion.

5. The lead frame according to claim 1, wherein:
the die pad in one package region and the lead section in a first package region adjacent to the package region of interest are connected to each other by a first inclined reinforcement piece; and
the die pad in one package region and the lead section in a second package region adjacent to the package region of interest, the second package region being positioned at a side opposite to the first package region with regard to the package region of interest, are connected to each other by a second inclined reinforcement piece.

6. The lead frame according to claim 1, wherein:
the die pad in one package region and the lead section in another package region adjacent to the package region of interest are connected to each other by a first inclined reinforcement piece; and
the lead section in one package region and the die pad in another package region adjacent to the package region of interest are connected to each other by a second inclined reinforcement piece.

7. The lead frame according to claim 1, wherein the die pad in one package region is connected to the lead sections in diagonally upward and diagonally downward package regions adjacent to the die pad in the package region of interest, by one pair of additional inclined reinforcement pieces.

8. The lead frame according to claim 1, wherein the lead section in one package region is connected to the lead sections in diagonally upward and diagonally downward package regions adjacent to the lead section in the package region of interest, by one pair of additional inclined reinforcement pieces.

9. The lead frame according to claim 1, wherein the inclined reinforcement piece includes a main body and a plated layer formed on the main body.

10. A resin-containing lead frame, comprising:
the lead frame according to claim 1; and
a reflecting resin disposed on edges of package regions in the lead frame.

11. A method for manufacturing a semiconductor device, comprising the steps of:
providing the resin-containing lead frame according to claim 10;
mounting an independent LED element on each of die pads, inside the reflecting resin of the resin-containing lead frame;
interconnecting the LED element and a lead section via an electric conducting portion;
filling the reflecting resin of the resin-containing lead frame with a sealing resin; and
separating the reflecting resin and the lead frame, for each LED element, by cutting the reflecting resin and the lead frame.

12. A lead frame for mounting LED elements, comprising:
a frame body region; and
a large number of package regions arranged in multiple rows and columns in the frame body region, the package regions each including a die pad on which an LED element is to be mounted and a lead section adjacent to the die pad via a spatial gap, the lead section being formed from the same material as the die pad and being designed to be electrically-connected to the LED element;

wherein the lead section in at least one package region is connected to the lead section in another package region adjacent to the package region of interest, by a lead connecting portion; and wherein the lead section in one package region and the die pad in another package region adjacent to the package region of interest are connected to each other by an inclined reinforcement piece.

13. The lead frame according to claim 12, wherein the inclined reinforcement piece is arranged so as to bridge across the package regions adjacent to each other.

14. A lead frame for mounting semiconductor elements, comprising:

a frame body region; and a large number of package regions arranged in multiple rows and columns in the frame body region, the package regions each including a die pad on which a semiconductor element is to be mounted and a lead section adjacent to the die pad via a spatial gap, the lead section being formed from the same material as the die pad and being designed to be electrically-connected to the semiconductor element;

wherein the die pad in one package region and the lead section in another package region adjacent to the package region of interest are directly connected to each other by an inclined reinforcement piece.

15. The lead frame according to claim 14, wherein the inclined reinforcement piece is arranged so as to bridge across the package regions adjacent to each other.

16. The lead frame according to claim 14, wherein the lead section in one package region is connected to the lead section in another package region adjacent to the package region of interest, by a lead connecting portion.

17. The lead frame according to claim 14, wherein the die pad in one package region is connected to the die pad in another package region adjacent to the package region of interest, by a die pad connecting portion.

18. The lead frame according to claim 14, wherein:

the die pad in one package region and the lead section in a first package region adjacent to the package region of interest are connected to each other by a first inclined reinforcement piece; and the die pad in one package region and the lead section in a second package region adjacent to the package region of interest, the second package region being positioned at a side opposite to the first package region with regard to the package region of interest, are connected to each other by a second inclined reinforcement piece.

19. The lead frame according to claim 14, wherein the die pad in one package region and the lead section in another package region adjacent to the package region of interest are connected to each other by a first inclined reinforcement piece; and the lead section in one package region and the die pad in another package region adjacent to the package region of interest are connected to each other by a second inclined reinforcement piece.

20. The lead frame according to claim 14, wherein the die pad in one package region is connected to the lead sections in diagonally upward and diagonally downward package regions adjacent to the die pad in the package region of interest, by one pair of additional inclined reinforcement pieces.

21. The lead frame according to claim 14, wherein the lead section in one package region is connected to the lead sections in diagonally upward and diagonally downward package regions adjacent to the lead section in the package region of interest, by one pair of additional inclined reinforcement pieces.

22. A lead frame for mounting semiconductor elements, comprising:

a frame body region; and a large number of package regions arranged in multiple rows and columns in the frame body region, the package regions each including a die pad on which a semiconductor element is to be mounted and a lead section adjacent to the die pad via a spatial gap, the lead section being formed from the same material as the die pad and being designed to be electrically-connected to the semiconductor element;

wherein the lead section in at least one package region is connected to the lead section in another package region adjacent to the package region of interest, by a lead connecting portion; and wherein the lead section in one package region and the die pad in another package region adjacent to the package region of interest are directly connected to each other by an inclined reinforcement piece.

23. The lead frame according to claim 22, wherein the inclined reinforcement piece is arranged so as to bridge across the package regions adjacent to each other.

* * * * *